(12) United States Patent
Hamaguchi et al.

(10) Patent No.: US 11,411,372 B2
(45) Date of Patent: Aug. 9, 2022

(54) LIGHT EMITTING ELEMENT AND MANUFACTURING METHOD THEREFOR

(71) Applicant: Sony Corporation, Tokyo (JP)

(72) Inventors: Tatsushi Hamaguchi, Kanagawa (JP); Jugo Mitomo, Kanagawa (JP); Susumu Sato, Kanagawa (JP); Hiroshi Nakajima, Kanagawa (JP); Masamichi Ito, Miyagi (JP); Hidekazu Kawanishi, Tokyo (JP)

(73) Assignee: Sony Corporation, Tokyo (JP)

( * ) Notice: Subject to any disclaimer, the term of this patent is extended or adjusted under 35 U.S.C. 154(b) by 329 days.

(21) Appl. No.: 16/627,174

(22) PCT Filed: Apr. 27, 2018

(86) PCT No.: PCT/JP2018/017257
§ 371 (c)(1),
(2) Date: Dec. 27, 2019

(87) PCT Pub. No.: WO2019/003627
PCT Pub. Date: Jan. 3, 2019

(65) Prior Publication Data
US 2021/0151955 A1    May 20, 2021

(30) Foreign Application Priority Data
Jun. 28, 2017  (JP) .............................. JP2017-125739

(51) Int. Cl.
*H01S 5/183*    (2006.01)
*H01S 5/02*    (2006.01)
(Continued)

(52) U.S. Cl.
CPC ........ *H01S 5/18361* (2013.01); *H01S 5/0207* (2013.01); *H01S 5/18305* (2013.01);
(Continued)

(58) Field of Classification Search
CPC ............... H01S 5/18361; H01S 5/0207; H01S 5/18305; H01S 5/18308; H01S 5/34333
See application file for complete search history.

(56) References Cited

U.S. PATENT DOCUMENTS

| | | | |
|---|---|---|---|
| 6,611,003 B1 | 8/2003 | Hatakoshi et al. | |
| 2002/0105988 A1 | 8/2002 | Park et al. | |

(Continued)

FOREIGN PATENT DOCUMENTS

| | | |
|---|---|---|
| CN | 1369940 A | 9/2002 |
| DE | 10341321 A | 4/2005 |

(Continued)

OTHER PUBLICATIONS

Extended European Search Report dated May 15, 2020, in corresponding European Application No. 18823913.1.
(Continued)

*Primary Examiner* — Yuanda Zhang
(74) *Attorney, Agent, or Firm* — K&L Gates LLP

(57) ABSTRACT

A method of manufacturing a light emitting element includes, at least: (A) forming a stacked structure 20 which includes a GaN-based compound semiconductor and in which a first compound semiconductor layer 21, an active layer 23, and a second compound semiconductor layer 22 are stacked, and forming a concave mirror section 43 on a first surface side of the first compound semiconductor layer 21; then (B) forming a photosensitive material layer 35 over the second compound semiconductor layer 22; and thereafter (C) exposing the photosensitive material layer 35 to light from the concave mirror section side through the stacked structure 20, to obtain a treatment mask layer including the photosensitive material layer 35, and then processing the second compound semiconductor layer 22 by use of the treatment mask layer.

15 Claims, 32 Drawing Sheets

(51) Int. Cl.
*H01S 5/343* (2006.01)
*H01S 5/323* (2006.01)

(52) U.S. Cl.
CPC ...... *H01S 5/18308* (2013.01); *H01S 5/32341* (2013.01); *H01S 5/34333* (2013.01)

(56) References Cited

U.S. PATENT DOCUMENTS

| | | |
|---|---|---|
| 2002/0181536 A1 | 12/2002 | Jeon |
| 2004/0190581 A1 | 9/2004 | Park et al. |
| 2005/0100069 A1 | 5/2005 | Gwo |
| 2006/0083283 A1 | 4/2006 | Kondo |
| 2007/0280320 A1 | 12/2007 | Feezell |
| 2012/0237261 A1 | 9/2012 | Ikuta et al. |
| 2014/0133510 A1 | 5/2014 | Sato |
| 2015/0043606 A1 | 2/2015 | Hamaguchi et al. |
| 2015/0357795 A1* | 12/2015 | Futagawa ............. H01S 5/0217 438/29 |
| 2017/0069799 A1 | 3/2017 | Im |

FOREIGN PATENT DOCUMENTS

| | | |
|---|---|---|
| EP | 3 611 811 | 2/2020 |
| EP | 3 633 807 | 4/2020 |
| JP | H05-075207 A | 3/1993 |
| JP | H10-200200 A | 7/1998 |
| JP | 2000-022277 A | 1/2000 |
| JP | 2000076682 A | 3/2000 |
| JP | 2002-237653 A | 8/2002 |
| JP | 2002-368333 A | 12/2002 |
| JP | 2006066538 A | 3/2006 |
| JP | 2006-114753 A | 4/2006 |
| JP | 2012-195439 A | 10/2012 |
| JP | 2012209561 A | 10/2012 |
| JP | 2013-243329 A | 12/2013 |
| JP | 2015035541 A | 2/2015 |
| JP | 2015035543 A | 2/2015 |
| WO | WO-2017018017 A | 2/2017 |
| WO | 2018/083877 A | 5/2018 |
| WO | 2018/096850 A | 5/2018 |
| WO | 2018/116596 A | 6/2018 |

OTHER PUBLICATIONS

International Search Report and Written Opinion issued in connection with International Patent Application No. PCT/JP2018/017257, dated Jul. 31, 2018. (7 pages).

* cited by examiner

EXPOSURE

[FIRST LIGHT REFLECTION LAYER]

[FIRST LIGHT REFLECTION LAYER]

LIGHT EMITTING ELEMENT AND MANUFACTURING METHOD THEREFOR

TECHNICAL FIELD

The present disclosure relates to a light emitting element and a manufacturing method therefor.

BACKGROUND ART

In a light emitting element including a surface emitting laser element (VCSEL), in general, laser oscillation is generated by resonance of laser light between two light reflection layers (Distributed Bragg Reflector layers and DBR layers). In a surface emitting laser element having a stacked structure in which an n-type compound semiconductor layer, an active layer (light emitting layer) including a compound semiconductor, and a p-type compound semiconductor layer are stacked, in general, a second electrode including a transparent conductive material is formed over the p-type compound semiconductor layer, and a second light reflection layer including a stacked structure of insulating material is formed over the second electrode. Besides, a first light reflection layer including a stacked structure of a first electrode and an insulating material is formed over the n-type compound semiconductor layer (in the case where the n-type compound semiconductor layer is formed over a conductive substrate, over an exposed surface of the substrate). Note that for convenience'sake, an axis passing through the center of a resonator formed by two light reflection layers is referred to a Z axis, and a virtual plane orthogonal to the Z axis is referred to as an XY plane.

Incidentally, in the case where the stacked structure includes a GaAs-based compound semiconductor, a resonator length $L_{OR}$ is approximately 1 μm. On the other hand, in the case where the stacked structure includes a GaN-based compound semiconductor, generally, the resonator length $L_{OR}$ is as long as several times the wavelength of the laser light emitted from the surface emitting laser element. In other words, the resonator length $L_{OR}$ is considerably longer than 1 μm.

CITATION LIST

Patent Literature

[PTL 1]
  JP 2006-114753A
[PTL 2]
  JP 2000-022277A

SUMMARY

Technical Problem

When the resonator length $L_{OR}$ becomes thus long, diffraction loss increases and, hence, laser oscillation becomes difficult to achieve, unlike in the GaAs-based surface emitting laser element adopting an existing resonator length $L_{OR}$ of approximately 1 μm. In other words, the light emitting element does not function as a surface emitting laser element but may function as an LED. Here, "diffraction loss" refers to a phenomenon that, since light tends to spread due to a diffraction effect, the laser light reciprocating in a resonator would gradually be dissipated to the outside of the resonator. In addition, in the case where the stacked structure includes the GaN-based compound semiconductor, a problem of thermal saturation may arise. Here, "thermal saturation" refers to a phenomenon that at the time of driving of a surface emitting laser element, optical output is saturated due to self-heating. The material used for the light reflection layer (for example, such a material as $SiO_2$ or $Ta_2O_5$) is lower than the GaN-based compound semiconductor in thermal conductivity. Therefore, increasing the thickness of the GaN-based compound semiconductor layer leads to restraining of thermal saturation. When the thickness of the GaN-based compound semiconductor layer is increased, however, the length of the resonator length $L_{OR}$ is increased, generating the above-mentioned problem. A technology for imparting a function as a concave mirror to the light reflection layer is known, for example, from JP 2006-114753A and JP 2000-022277A. However, these patent laid-open documents do not describe in any way the problems to be solved by the light emitting element of the present disclosure, such as the problem of an increase in diffraction loss due to an increase in the resonator length $L_{OR}$ and the problem of thermal saturation.

Accordingly, it is an object of the present disclosure to provide a light emitting element having a configuration and structure such as to be able to solve the problem of an increase in diffraction loss due to an increase in resonator length $L_{OR}$ and the problem of thermal saturation, and a method of manufacturing such a light emitting element.

Solution to Problem

In order to achieve the above object, according to the present disclosure, there is provided a method of manufacturing a light emitting element, the method including at least:

forming a stacked structure which includes a GaN-based compound semiconductor and in which
  a first compound semiconductor layer having a first surface and a second surface opposed to the first surface,
  an active layer facing the second surface of the first compound semiconductor layer, and
  a second compound semiconductor layer having a first surface facing the active layer and a second surface opposed to the first surface, are stacked, and forming a concave mirror section on the first surface side of the first compound semiconductor layer;
then forming a photosensitive material layer over the second compound semiconductor layer;
thereafter exposing the photosensitive material layer to light from the concave mirror section side through the stacked structure, to obtain a treatment mask layer including the photosensitive material layer; and
thereafter processing the second compound semiconductor layer by use of the treatment mask layer.

In order to achieve the above object, according to a first mode, a second mode, or a third mode of the present disclosure, there is provided
  a light emitting element including:
  a stacked structure which includes a GaN-based compound semiconductor and in which
  a first compound semiconductor layer having a first surface and a second surface opposed to the first surface,
  an active layer facing the second surface of the first compound semiconductor layer, and
  a second compound semiconductor layer having a first surface facing the active layer and a second surface opposed to the first surface, are stacked;

a first light reflection layer disposed on the first surface side of the first compound semiconductor layer; and a second light reflection layer disposed on the second surface side of the second compound semiconductor layer, in which the first light reflection layer is formed over the concave mirror section.

In addition, in the light emitting element according to the first mode of the present disclosure, the second compound semiconductor layer is provided with a current injection region and a current non-injection region surrounding the current injection region, and a center point of a light field in the active layer and an area center-of-gravity point of the current injection region coincide with each other.

Besides, in the light emitting element according to the second mode of the present disclosure, the first light reflection layer is provided with a light-transmitting section and a light-shielding section surrounding the light-transmitting section.

Further, in the light emitting element according to the third mode of the present disclosure, the shape of the concave mirror section is a spherical shape or a parabolic shape with a coefficient of determination of equal to or more than 0.8, within a range of a beam waist radius $\omega_0$ from a central portion of the concave mirror section.

Advantageous Effects of Invention

In the light emitting elements of the present disclosure according to the first to third modes of the present disclosure and the method of manufacturing a light emitting element of the present disclosure, the first light reflection layer is formed over the concave mirror section; therefore, light spreads by being diffracted with the active layer as a starting point, and the light incident on the first light reflection layer is securely reflected toward the active layer and can be focused onto the active layer. Therefore, an increase in diffraction loss can be obviated, laser oscillation can be realized securely, and, since the resonator length is large, the problem of thermal saturation can be avoided. In addition, in the method of manufacturing the light emitting element of the present disclosure, the photosensitive material layer is exposed to light from the concave mirror section side through the stacked structure, thereby to obtain the treatment mask layer including the photosensitive material layer, after which the second compound semiconductor layer is processed by use of the treatment mask layer. Therefore, misregistration is hardly generated between the first light reflection layer and the region (for example, the current non-injection region or the current constriction region) of the second compound semiconductor layer which is processed, or between the centers of them, and an increase in the current value necessary for oscillation (light emission), or an increased in threshold current value, can be restrained. As a result, a light emitting element having high reliability can be provided. Note that the effects described herein are merely illustrative and are not limitative, and additional effects may exist.

DESCRIPTION OF EMBODIMENTS

Figure 1:
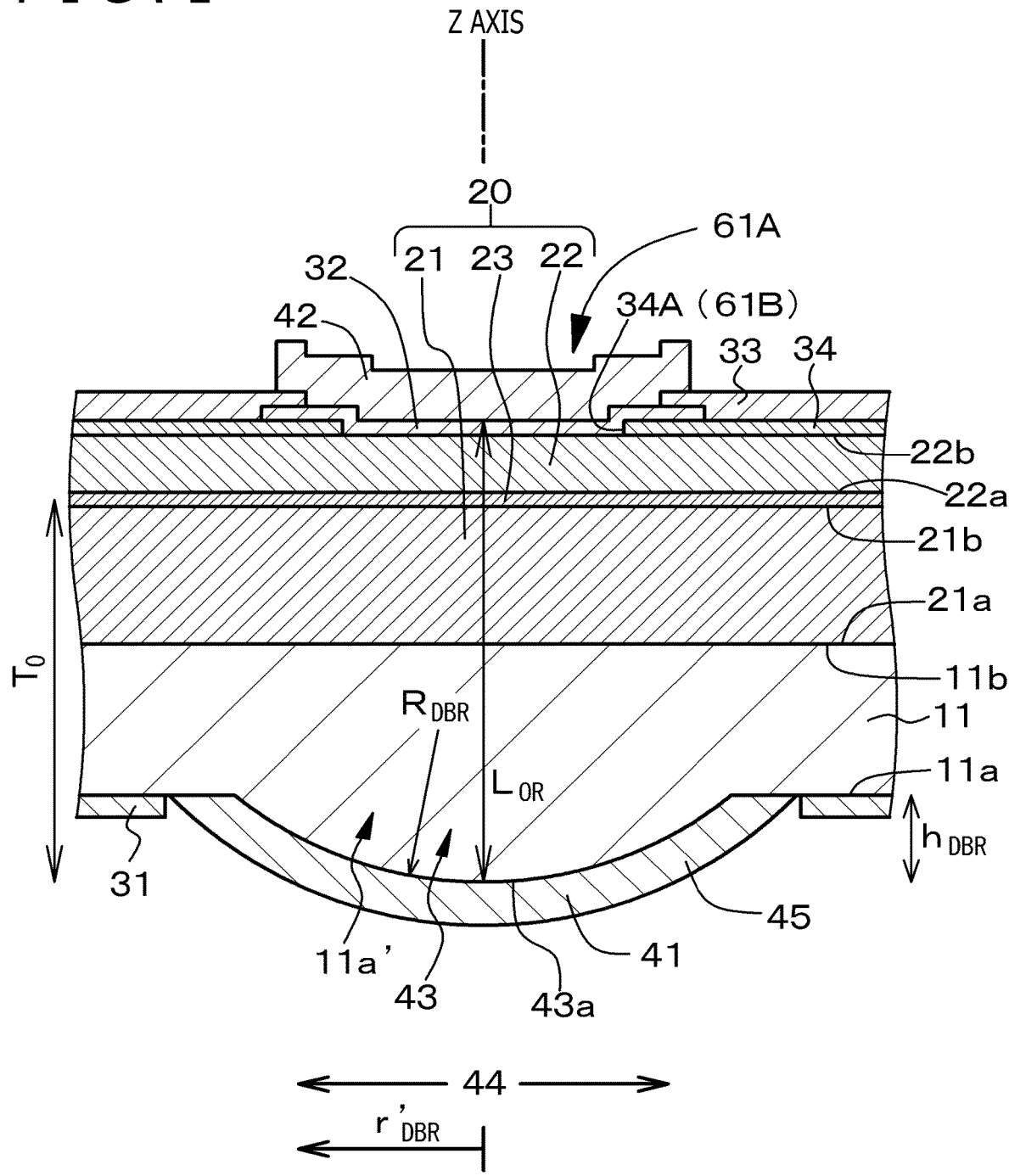
FIG. 1 is a schematic partial end view of a light emitting element of Example 1.

The present disclosure will be described below based on Examples, referring to the drawings. The present disclosure is not limited to Examples, and various numerical values and materials in Examples are illustrative. Note that the description will be made in the following order.

1. General description of a method of manufacturing a light emitting element of the present disclosure, and light emitting elements according to first to third modes of the present disclosure
2. Example 1 (Method of manufacturing a light emitting element of the present disclosure, light emitting elements according to first and third modes of the present disclosure, and light emitting element of 3-Ath configuration)
3. Example 2 (Modification of Example 1, and light emitting element of fourth configuration)
4. Example 3 (Modifications of Examples 1 and 2, and light emitting element of 3-Bth configuration)
5. Example 4 (Modification of Example 3)
6. Example 5 (Modifications of Examples 1 to 4, and light emitting elements according to second mode of the present disclosure)
7. Example 6 (Modifications of Examples 1 to 5, and light emitting element of first configuration)
8. Example 7 (Modifications of Examples 1 to 6, and light emitting element of second configuration)
9. Example 8 (Modification of Example 7)
10. Example 9 (Another modification of Example 7)
11. Example 10 (Modifications of Examples 7 to 9)
12. Others <General Description of a Method of Manufacturing a Light Emitting Element of the Present Disclosure, and Light Emitting Elements According to First to Third Modes of the Present Disclosure>

A light emitting element according to a first or third mode of the present disclosure may have a configuration in which a first light reflection layer is provided with a light-transmitting section and a light-shielding section surrounding the light-transmitting section. In the light emitting elements according to the first to third modes of the present disclosure, the shape of an outer edge of a current injection region and the shape of an outer edge of the light-transmitting section are preferably analogous to each other. In addition, in the light emitting elements according to the first to third modes of the present disclosure, the shape of an outer edge of a concave mirror section and the shape of an outer edge of the light-transmitting section are preferably analogous to each other.

In the light emitting elements according to the first to third modes of the present disclosure, a second light reflection layer may be configured to have a flat shape.

In the light emitting elements according to the first to third modes of the present invention or a light emitting element manufactured by the method of manufacturing a light emitting element of the present disclosure (these light emitting elements will hereinafter generically referred to "light emitting elements of the present disclosure"), it is preferable that $1 \times 10^{-5}$ m≤$L_{OR}$ is satisfied, where $L_{OR}$ is the length of a resonator.

In the light emitting element according to the first mode of the present disclosure, a center point of a light field in an active layer and an area center-of-gravity point of the current injection region coincide with each other, and, in the case where the center point of the light field in the active layer and the area center-of-gravity point of the current injection region is equal to or less than 0.5 μm, the center point and the area center-of-gravity point are judged to be "coincident."

In preferred configuration of the light emitting element according to the first mode or the third mode of the present disclosure and in the light emitting element according to the second mode of the present disclosure, the first light reflection layer is provided with the light-transmitting section, and, as a specific position of the light-shielding section, the first compound semiconductor layer side of the first light reflection layer may be mentioned, or the side opposite to the first compound semiconductor layer side of the first light reflection layer may be mentioned. More specifically, the position is as follows.

(A) In the case where the concave mirror section is formed over the substrate and where the light-shielding section is formed on the first compound semiconductor layer side of the first light reflection layer, the light-shielding section is:

(A-1) formed over part of the concave mirror section on the first compound semiconductor layer side;

(A-2) formed over part of the concave mirror section on the first compound semiconductor layer side and over part of the first surface of the substrate;

(A-3) formed over part of the first surface of the substrate.

(B) In the case where the concave mirror section is formed over the substrate and where the light-shielding section is formed at the first light reflection layer, the light-shielding section is:

(B-1) formed over part of the first light reflection layer;

(B-2) formed over part of the first light reflection layer and over part of the first surface of the substrate;

(B-3) formed over part of the first surface of the substrate.

(C) In the case where the concave mirror section is formed at the first compound semiconductor layer, the light-shielding section is:

(C-1) formed over part of that portion of the first compound semiconductor layer which constitutes the concave mirror section;

(C-2) formed over part of that portion of the first compound semiconductor layer which constitutes the concave mirror section and over part of the first compound semiconductor layer located on an outer side thereof;

(C-3) formed over part of the first surface of the first compound semiconductor layer located on an outer side of the concave mirror section.

(D) In the case where the concave mirror section is formed over the first compound semiconductor layer and where the light-shielding section is formed at the first light reflection layer, the light-shielding layer is:

(D-1) formed over part of the first light reflection layer;

(D-2) formed over part of the first light reflection layer and over part of the first surface of the substrate;

(D-3) formed over part of the first surface of the substrate.

The light-shielding section may be left in a final product (light emitting element), or may be removed from the final product (light emitting element).

The light-shielding section may include a metallic film or an alloy film of titanium (Ti), platinum (Pt), gold (Au), nickel (Ni), palladium (Pd) or the like, a laminate of such metallic film or alloy film, or, for example, a resin film including a resin material containing carbon nanotube.

A beam waist radius $\omega_0$ in the light emitting element according to the third mode of the present disclosure is defined by the following formula (A).

$$\omega_0 \equiv (\lambda_0/\pi)\{L_{OR}(R_{DBR}-L_{OR})\}^{1/2} \quad (A)$$

where $\lambda_0$ is the wavelength of desired light mainly emitted from the light emitting element (oscillation wavelength), $L_{OR}$ is resonator length, and $R_{DBR}$ is the radius of curvature of the concave mirror section.

In the light emitting elements of the present disclosure including the above-mentioned preferred modes, when the concave mirror section is cut along a virtual plane including the lamination direction of the stacked structure, the figure described by the interface of part of the concave mirror section that faces the stacked structure may be part of a circle or part of a parabola, as aforementioned. The figure may not strictly be part of a circle, or may not strictly be part of a parabola. In other words, a case where the figure is roughly part of a circle and a case where the figure is roughly part of a parabola are included in the expression "the figure is part of a circle or part of a parabola." The portion (region) of the concave mirror section which is such part of a circle or part of a parabola may be referred to as "the effective region in the concave mirror section." Note that the figure described by the interface of part of the concave mirror section that faces the stacked structure can be determined by measuring the shape of the interface by a measuring instrument, and analyzing the obtained data based on the least squares method.

<Light Emitting Element of First Configuration>

In the light emitting elements of the present disclosure including the above-mentioned preferred modes, the second compound semiconductor layer is provided with a current injection region and a current non-injection region (current constriction region) surrounding the current injection region, and a shortest distance $D_{CI}$ from the area center-of-gravity point of the current injection region to the boundary between the current injection region and the current non-injection region preferably satisfies the following expression (B). Here, the light emitting element of such a configuration is referred to as "light emitting element of first configuration" for convenience' sake. Note that for derivation of the following expression, see, for example, H. Kogelnik and T. Li, "Laser Beams and Resonators," Applied Optics/Vol. 5, No. 10/October 1966.

$$D_{CI} \geq \omega_0/2 \quad (B)$$

Figure 28:
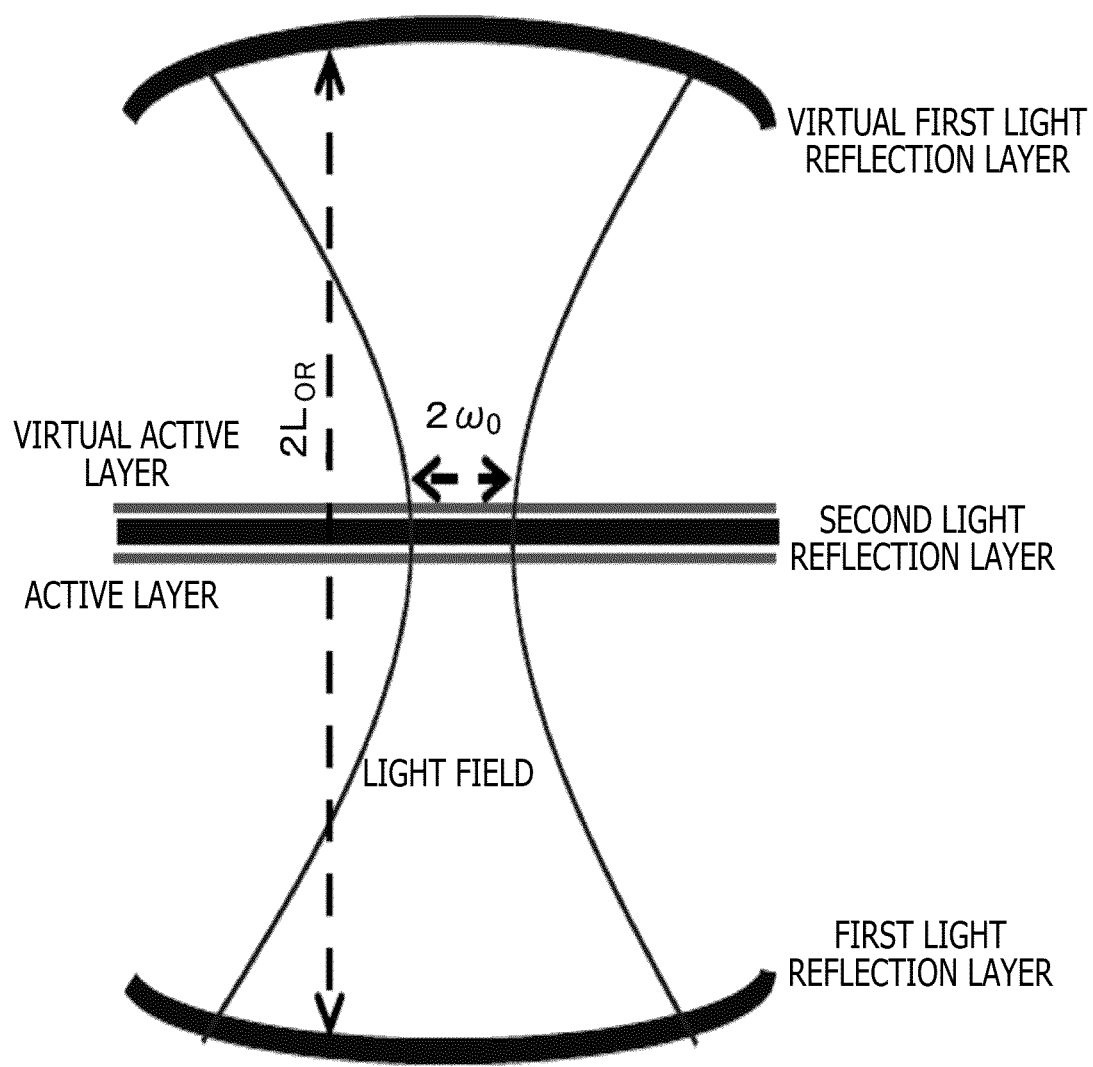
FIG. 28 is a conceptual diagram when there is assumed a Fabry-Perot resonator sandwiched between two concave mirror sections having the same radius of curvature, in the light emitting element of Example 1.
Figure 29:
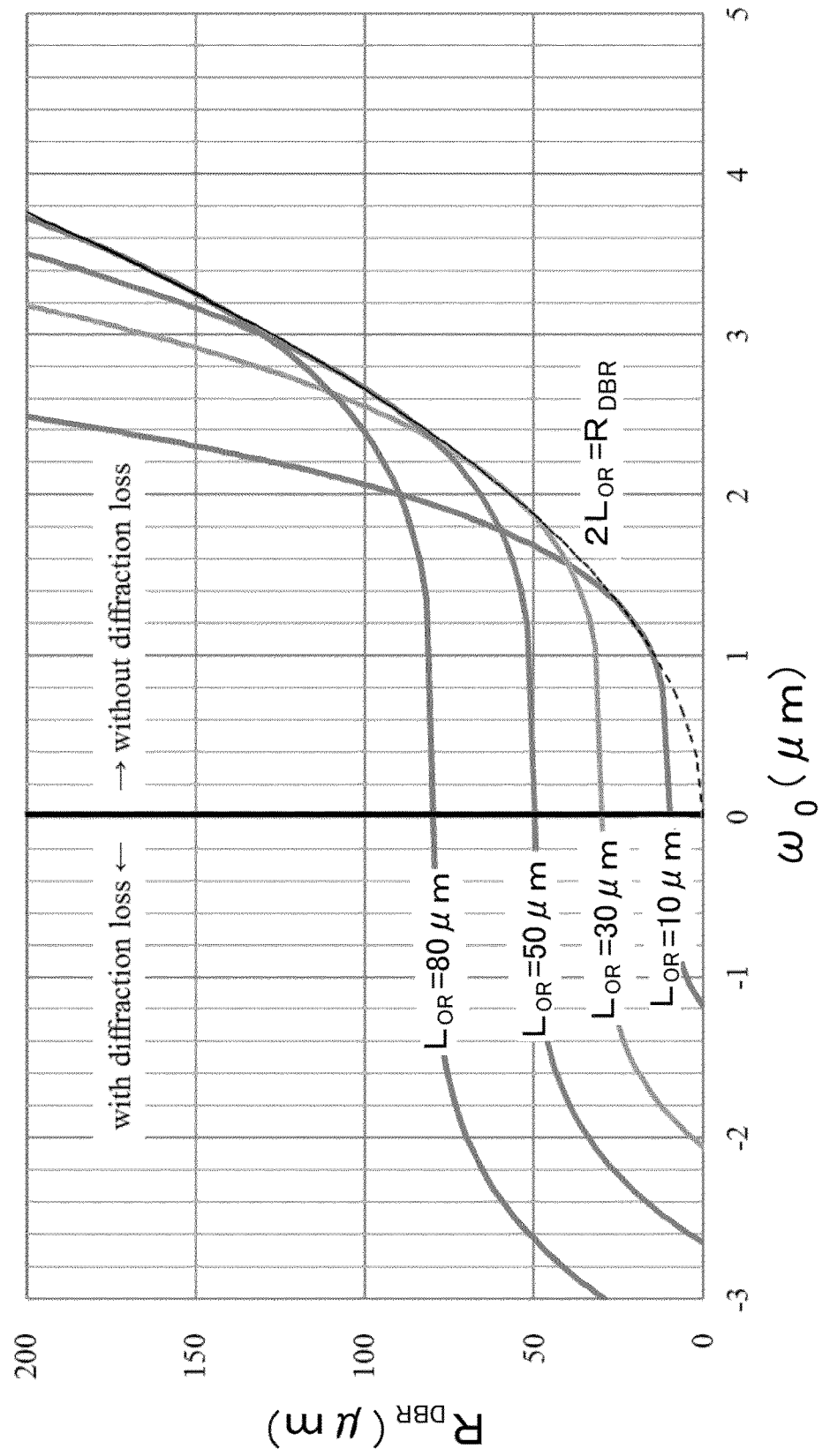
FIG. 29 is a graph representing the relations between a value of $\omega_0$ and a value of resonator length $L_{OR}$ and a value of radius of curvature $R_{DBR}$ of the concave mirror section.
Figure 30:
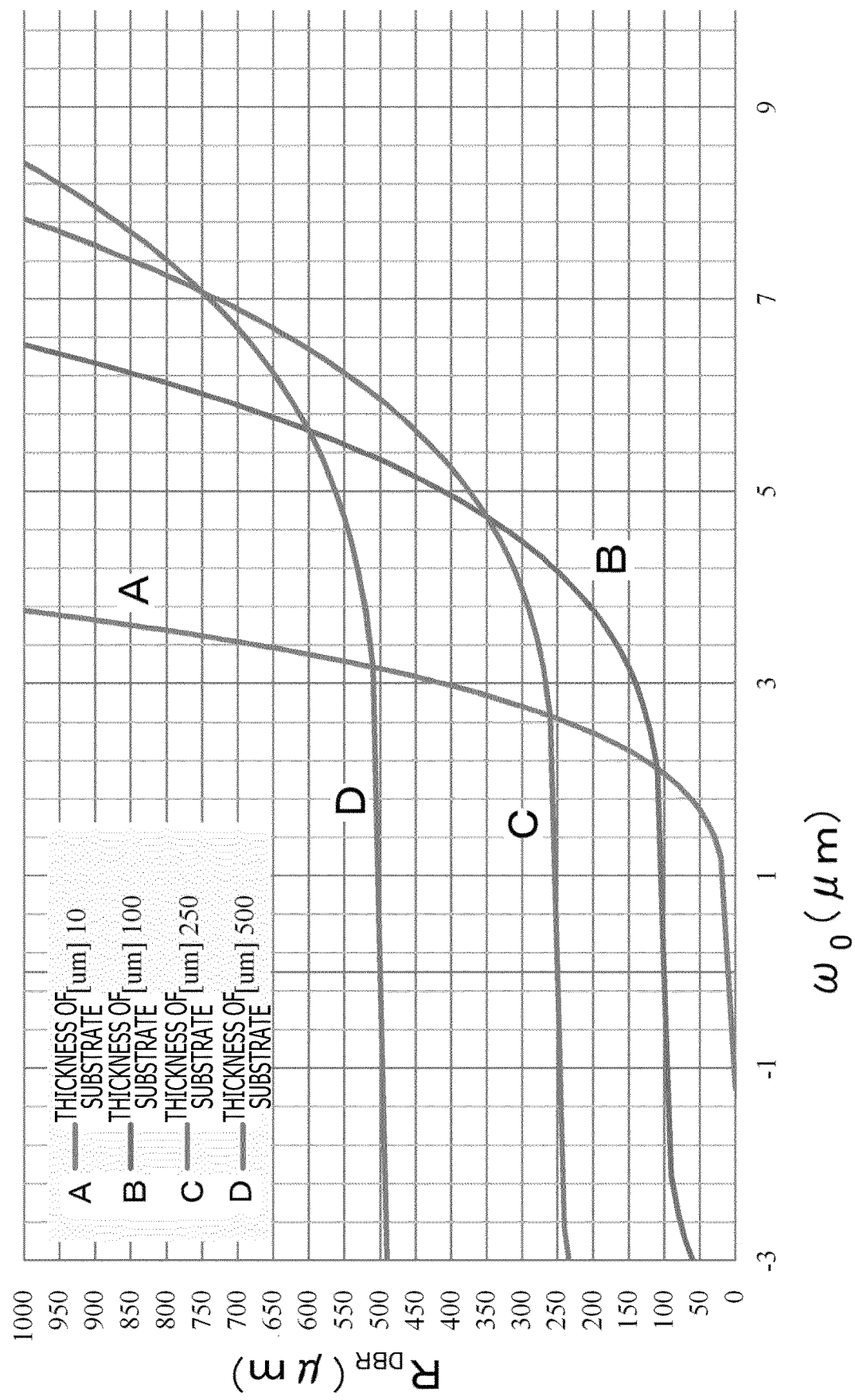
FIG. 30 is another graph representing the relations between the value of $\omega_0$ and the value of resonator length $L_{OR}$ and the value of radius of curvature $R_{DBR}$ of the concave mirror section.
Figure 31A:
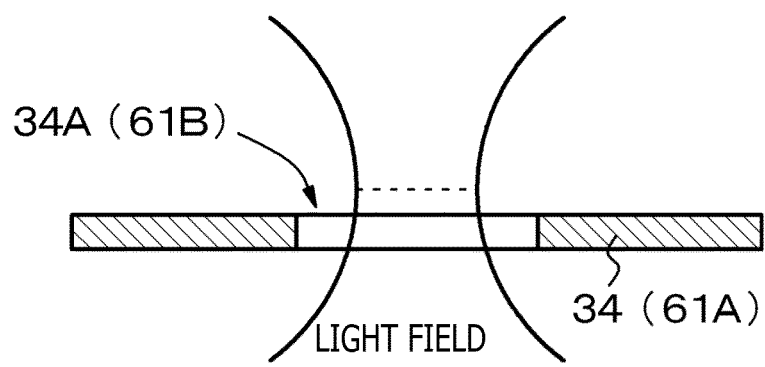
FIGS. 31A and 31B are a diagram schematically depicting a focused state of a laser beam when the value of $\omega_0$ is "positive," and a diagram schematically depicting a focused state of a laser beam when the value of $\omega_0$ is "negative," respectively.
Figure 31B:
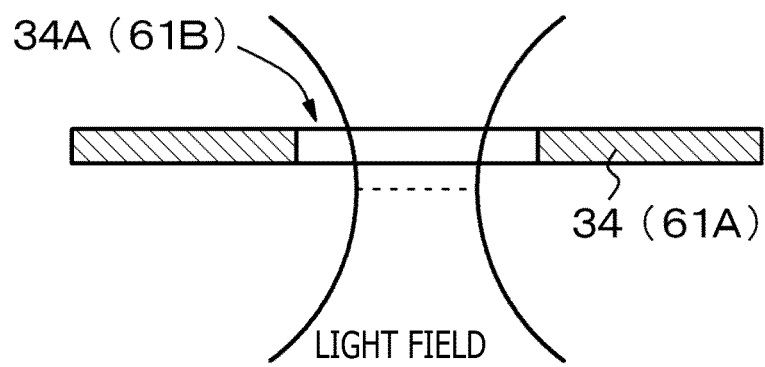

Here, in the light emitting elements of the present disclosure, the first light reflection layer is formed over the concave mirror section. Inconsideration of object property with respect to a flat mirror of the second light reflection layer, however, a resonator can be extended to a Fabry-Perot resonator sandwiched between two concave mirror sections having the same radius of curvature (see the schematic diagram of FIG. 28). In this instance, the resonator length of the virtual Fabry-Perot resonator is two times the resonator length $L_{OR}$. Graphs depicting the relations between the value of $\omega_0$ and the value of the resonator length $L_{OR}$ and the value of the radius of curvature $R_{DBR}$ of the interface with the concave mirror section are illustrated in FIGS. 29 and 30. Note that the expression that the value of $\omega_0$ is "positive" means that the laser light is schematically in the state of FIG. 31A, and the expression that the value of $\omega_0$ is "negative" means that the laser light is schematically in the state of FIG. 31B. The state of the laser light may be the state illustrated in FIG. 31A, or may be the state illustrated in FIG. 31B. It is to be noted, however, that the virtual Fabry-Perot resonator having two concave mirror sections is put into the state depicted in FIG. 31B when the radius of curvature $R_{DBR}$ becomes smaller than the resonator length $L_{OR}$, resulting in that confinement becomes excessive and a diffraction loss is generated. Therefore, the state depicted in FIG. 31A, where the radius of curvature $R_{DBR}$ is greater than the resonator length $L_{OR}$, is preferable. Note that when the active layer is disposed near the flat light reflection layer of the two light reflection layers, specifically, the second light reflection layer, the light field is focused more in the active layer. In other words, confinement of the light field in the active layer is strengthened, and laser oscillation is facilitated. The position of the active layer, or the distance from the surface of the second light reflection layer facing the second compound semiconductor layer to the active layer, may be, for example, $\lambda_0/2$ to $10\lambda_0$, which is non-limitative.

Incidentally, in the case where the region into which the light reflected by the first light reflection layer is focused is not included in the current injection region corresponding to the region in which the active layer has a gain by current injection, induced emission of light from carriers may be hampered, whereby laser oscillation may be hindered. Where the above-mentioned expressions (A) and (B) are satisfied, it can thereby be insured that the region into which the light reflected by the first light reflection layer is focused is included in the current injection region, and laser oscillation can be achieved securely.

In the light emitting element of the first configuration, a radius $r'_{DBR}$ of the effective region in the concave mirror section can be configured to satisfy $\omega_0 \leq r'_{DBR} \leq 20 \cdot \omega_0$, preferably $\omega_0 \leq r'_{DBR} \leq 10 \cdot \omega_0$. Alternatively, the value of $r'_{DBR}$ may be, for example, $r'_{DBR} \leq 1 \times 10^{-4}$ m, preferably $r'_{DBR} \leq 5 \times 10^{-5}$ m. In addition, a height $h_{DBR}$ of the concave mirror section may be, for example, $h_{DBR} \leq 5 \times 10^{-5}$ m. Further, in the light emitting element of the first configuration including such a preferred configuration, $D_{CI} \geq \omega_0$ may be satisfied. Furthermore, in the light emitting element of the first configuration including such a preferred configuration, $R_{DBR} \leq 1 \times 10^{-3}$ m, preferably $1 \times 10^{-5}$ m $\leq R_{DBR} \leq 1 \times 10^{-3}$ m, more preferably $1 \times 10^{-5}$ m $\leq R_{DBR} \leq 1 \times 10^{-4}$ m may be satisfied.

In the light emitting element according to the third mode of the present disclosure, the shape of the concave mirror section is prescribed to be a spherical shape or a parabolic shape with a coefficient of determination of equal to or more than 0.8, within the range (region) of the beam waist radius $\omega_0$ from the central portion of the concave mirror section. For example, a spherical shape or a parabolic shape with a coefficient of determination of equal to or more than 0.8, preferably equal to or more than 0.9, more preferably equal to or more than 0.99, within the range (region) of 1.2 times the beam waist radius $\omega_0$, or within the range (region) of two times the beam waist radius $\omega_0$, is desirable. A coefficient of determination CD is a value representing how much of a dependent variable (described variable) can be described by an independent variable (describing variable), and is defined by the following formula (C). Specifically, let an actually measured coordinates of the concave mirror section be $y_i$, and let ideal coordinates of the concave mirror section expected therefor be $f_i$, a value obtained by subtracting the quotient, obtained by dividing the sum of squares of residuals by the sum of squares of differences of an actually measured coordinates from the average ($y_{ave}$) thereof, from one is the coefficient of determination CD, and, as the CD is closer to one, it is represented that relative residuals are less. Note that the figure (actually measured coordinates) described by part of the concave mirror section can be obtained by measuring the shape of the concave mirror section (specifically, the shape of the interface between the concave mirror section and the first light reflection layer) by a measuring instrument.

$$CD^2=1-[\Sigma_i(y_i-f_i)^2]/[\Sigma_i(y_i-y_{ave})^2] \quad (C)$$

In the method of manufacturing the light emitting element of the present disclosure, in processing the second compound semiconductor layer by use of the treatment mask layer, the second compound semiconductor layer may be formed with a current constriction region (current non-injection region).

In such a preferred mode of the method of manufacturing the light emitting element of the present disclosure, in processing the second compound semiconductor layer by use of the treatment mask layer, ion injection may be conducted using the treatment mask layer. In this case, the kind of ions may be at least one kind of ions (one kind of ions or two or more kinds of ions) selected from the group consisting of boron, proton, phosphorus, arsenic, carbon, nitrogen, fluorine, oxygen, germanium, and silicon.

Alternatively, in a preferred mode of the method of manufacturing the light emitting element of the present disclosure, in processing the second compound semiconductor layer by use of the treatment mask layer, the second compound semiconductor layer may be subjected to an ashing treatment using the treatment mask layer, or the second compound semiconductor layer may be subjected to a reactive etching (RIE) treatment using the treatment mask layer, or the second compound semiconductor layer may be subjected to plasma irradiation using the treatment mask layer. In these treatments, the current constriction region (current non-injection region) is exposed to plasma particles, and, therefore, conductivity of the second compound semiconductor layer is deteriorated, and the current constriction region is put into a high resistance state. In other words, the current constriction region is formed by the exposure of the second surface of the second compound semiconductor layer to plasma particles. Specific examples of the plasma particles include argon, oxygen, and nitrogen.

Alternatively, in a preferred mode of the method of manufacturing the light emitting element of the present disclosure, in processing the second compound semiconductor layer by use of the treatment mask layer, an insulating film formed over the second compound semiconductor layer may be subjected to etching by using the treatment mask layer. Examples of the material constituting the insulating film include $SiO_X$, $SiN_X$, $AlO_X$, $ZrO_X$, and $HfO_X$.

Further, the above-mentioned various preferred modes or configurations of the method of manufacturing the light emitting element of the present disclosure may further include:

forming the second compound semiconductor layer with a current constriction region, then forming a second electrode over the second compound semiconductor layer, and forming a second light reflection layer over the second electrode; and forming a first light reflection layer over the concave mirror section, and forming a first electrode electrically connected to a first compound semiconductor layer.

Alternatively, the concave mirror section may be formed with a first light reflection layer, after the concave mirror section is formed at the first surface of the substrate and before the photosensitive material layer is formed over the second compound semiconductor layer.

Further, the method of manufacturing the light emitting element of the present disclosure including the above-mentioned various preferred modes or configurations may further include forming a light-shielding section, over part of the concave mirror section, or over an area ranging from part of the concave mirror section to an outside region thereof, or over part of the first light reflection layer, or over an area ranging from part of the first light reflection layer to an outside region thereof.

Further, in the method of manufacturing the light emitting element of the present disclosure including the above-mentioned various preferred modes or configurations, a configuration may be adopted in which the first surface of the first compound semiconductor layer is in contact with the second surface of the substrate, the concave mirror section is formed at the first surface of the substrate opposed to the second surface of the substrate, and formation of the concave mirror section includes subjecting the first surface of the substrate to etching, or a configuration may be adopted in which the first surface of the first compound semiconductor layer is in contact with the second surface of the substrate, the concave mirror section is formed at the first surface of the substrate opposed to the second surface of the substrate, and formation of the concave mirror section includes forming a concave mirror section forming layer at the first surface of the substrate and then forming the concave mirror section forming layer with the concave mirror section, or a configuration may be adopted in which the concave mirror section is formed at the first surface of the first compound semiconductor layer.

Further, in the method of manufacturing the light emitting element of the present disclosure including the above-mentioned various preferred modes or configurations, a configuration may be adopted in which a mask member (exposure mask) having an opening is disposed on an upper side of the first compound semiconductor layer side, and exposure of the photosensitive material layer is conducted from the concave mirror section side through the stacked structure.

Furthermore, in the method of manufacturing the light emitting element of the present disclosure including the above-mentioned various preferred modes or configurations, the photosensitive material layer may include a resist material or a photosensitive resin. As the resist material, known resist materials are only required to be used, which may be a positive-type resist material or may be a negative-type resist material. Examples of the photosensitive resin include polyvinyl cinnamate.

A known antireflection film may be formed over a part on which exposure light for exposure of the photosensitive material layer is incident (for example, the first surface of the substrate or the first surface of the first compound semiconductor layer).

Note that while the terms "over" and "on an upper side of" are often used in the description of various elements constituting the light emitting element herein, these terms may refer to a part (region) of each element which is located in the direction of spacing away from the active layer, and may be different from the actual upper-lower relation with respect to the light emitting element. Specifically, for example, over the concave mirror section refers to a part (region) of the concave mirror section that is located in the direction of spacing away from the active layer.

Incidentally, exposure light for exposure of the photosensitive material layer is liable to be focused on an optical axis of the concave mirror section. As a result, that part of the photosensitive material layer which is located on the optical axis of the concave mirror section is exposed more than the parts remote from the optical axis. As a result, the sectional shape of the part of the photosensitive material layer that is located on the optical axis of the concave mirror section and the sectional shape of the part remote from the optical axis can be made different. A resonance mode orbits on the optical axis of the concave mirror section, and the current injection region coincides with the position where the resonance mode passes. The size of the region where the photosensitive material layer is exposed can be controlled by setting of exposure conditions. Therefore, the current injection region can be formed in a minimum size with good reproducibility and within such a range as not to spoil oscillation, and a generation threshold can be suppressed.

In addition, the light field narrowed by the first light reflection layer formed over the concave mirror section is the most intense in the center of the current injection region and is weakened in going closer to the periphery of the current injection region. When the sectional shape of the treatment mask layer is tapered according to the light field, it is ensured that, for example, in the case of forming the current non-injection region by ion implantation, the concentration profile of ions implanted tends to be reverse to the sectional shape of the treatment mark layer. Specifically, in the second compound semiconductor layer located on a lower side of a central portion of the treatment mask layer, the concentration of ions implanted is low, and in the second compound semiconductor layer located on a lower side of a peripheral portion of the treatment mask layer, the concentration of ions implanted is high. As a result, the current injection amount can be made to be large in the region where the light field is intense and be small in the region where the light field is weak; accordingly, it is possible to concentrate gain in the region where the light field is intense and to weaken the gain in the region where the light field is weak. Therefore, hole burning can be restrained, a transverse mode becomes stable, and kinking is hardly generated. In addition, many carriers can be securely injected into the region where the light field is intense, so that it is possible to enhance injection efficiency and to reduce a threshold.

<Light Emitting Element of Second Configuration>

Further, in the light emitting elements of the present disclosure including the above-mentioned preferred modes or configurations (inclusive of the light emitting element of the first configuration), the stacked structure including the second electrode may be formed with at least two light-absorbing material layers in parallel to a virtual plane occupied by the active layer. Here, the light emitting element of such a configuration is referred to as "the light emitting element of the second configuration" for convenience' sake.

In the light emitting element of the second configuration, it is preferable that at least four light-absorbing material layers are formed.

In the light emitting element of the second configuration inclusive of the above-mentioned preferred configurations, let oscillation wavelength (wavelength of light mainly emitted from the light emitting element and a desired oscillation wavelength) be $\lambda_0$, let an overall equivalent refractive index of the two light-absorbing material layers and the part of the stacked structure located between the light-absorbing material layer and the light-absorbing material layer be $n_{eq}$, and let a distance between the light-absorbing material layer and the light-absorbing material layer be $L_{Abs}$, then it is preferable that the expression:

$$0.9 \times \{(m \cdot \lambda_0)/(2 \cdot n_{eq})\} \leq L_{Abs} \leq 1.1 \times \{(m \cdot \lambda_0)/(2 \cdot n_{eq})\}$$

is satisfied. Here, m is 1 or is two or more arbitrary integers inclusive of 1. The equivalent refractive index $n_{eq}$ is represented by:

$$n_{eq} = \Sigma(t_i \times n_i)/\Sigma(t_i)$$

where $t_i$ is a thickness of each of layers constituting the two light-absorbing material layers and the part of the stacked structure located between the light-absorbing material layer and the light-absorbing material layer, and $n_i$ is the refractive index of each of the layers. It is to be noted that i=1, 2, 3 . . . , 1, "1" is the total number of the layers constituting the two light-absorbing material layers and the part of the stacked structure located between the light-absorbing material layer and the light-absorbing material layer, and "$\Sigma$" means obtaining the sum total from i=1 to i=1. The equivalent refractive index $n_{eq}$ may be obtained by observing the constituent materials by electron microscope observation of a section or the light emitting element or the like, and applying known refractive index values and the thicknesses obtained by the observation to the constituent materials, to calculate the equivalent refractive index $n_{eq}$. In the case where m is 1, the distance between the adjacent light-absorbing material layers satisfies the expression:

$$0.9 \times \{\lambda_0/(2 \cdot n_{eq})\} \leq L_{Abs} \leq 1.1 \times \{\lambda_0/(2 \cdot n_{eq})\}$$

in all the plurality of light-absorbing material layers. In addition, where m is two arbitrary integers inclusive of 1, for example, where m=1, 2, the distance between the adjacent light-absorbing material layers satisfies the expression:

$$0.9 \times \{\lambda_0/(2 \cdot n_{eq})\} \leq L_{Abs} \leq 1.1 \times \{\lambda_0/(2 \cdot n_{eq})\}$$

in part of the light-absorbing material layers, and satisfies the expression:

$$0.9 \times \{(2 \cdot \lambda_0)/(2 \cdot n_{eq})\} \leq L_{Abs} \leq 1.1 \times \{(2 \cdot \lambda_0)/(2 \cdot n_{eq})\}$$

in the remaining light-absorbing material layers. More widely, the distance between the adjacent light-absorbing material layers satisfies the expression:

$$0.9 \times \{\lambda_0/(2 \cdot n_{eq})\} \leq L_{Abs} \leq 1.1 \times \{\lambda_0/(2 \cdot n_{eq})\}$$

in part of the light-absorbing material layers, and satisfies the expression:

$$0.9 \times \{(m' \cdot \lambda_0)/(2 \cdot n_{eq})\} \leq L_{Abs} \leq 1.1 \times \{(m' \cdot \lambda_0)/(2 \cdot n_{eq})\}$$

in the remaining various light-absorbing material layers. Here, m' is two or more arbitrary integers. In addition, the distance between the adjacent light-absorbing material layers is the distance between the centers of gravity of the adjacent light-absorbing material layers. In practice, it is the distance between the centers of the light-absorbing material layers, in a section at a virtual plane along the thickness direction of the active layer.

Further, in the light emitting element of the second configuration including the above-mentioned various preferred configurations, the thickness of the light-absorbing material layer is preferably equal to or less than $\lambda_0/(4 \cdot n_{eq})$. Examples of the lower limit for the thickness of the light-absorbing material layer include 1 nm.

Further, in the light emitting element of the second configuration including the above-mentioned various preferred configurations, the light-absorbing material layers may be located at a minimum amplitude part generated in a standing wave of light formed inside the stacked structure.

Furthermore, in the light emitting element of the second configuration including the above-mentioned various preferred configurations, the active layer may be located at a maximum amplitude part generated in a standing wave of light formed inside the stacked structure.

Further, in the light emitting element of the second configuration including the above-mentioned various preferred configurations, the light-absorbing material layer may have a light absorption coefficient of equal to or more than two times the light absorption coefficient of the compound semiconductor constituting the stacked structure. Here, the light absorption coefficient of the light-absorbing material layer and the light absorption coefficient of the compound semiconductor constituting the stacked structure can be obtained by observing the constituent materials by electron microscope observation of a section of the light emitting element or the like, and analogically inferring the light absorption coefficients from known evaluation results observed with respect to the respective constituent materials.

Furthermore, in the light emitting element of the second configuration including the above-mentioned various preferred configurations, the light-absorbing material layer may include at least one kind of material selected from the group consisting of a compound semiconductor material narrower in bandgap than the compound semiconductor constituting the stacked structure, a compound semiconductor material doped with an impurity, a transparent conductive material, and a light reflection layer constituting material having a light absorbing characteristic. Here, examples of the compound semiconductor material narrower in bandgap than the compound semiconductor constituting the laminate structure include InGaN, for example, in the case where the compound semiconductor constituting the stacked structure is GaN; example of the compound semiconductor material doped with an impurity include Si-doped n-GaN, and B-doped n-GaN; examples of the transparent conductive material include transparent conductive materials for constituting the electrode described later; and examples of the light reflection layer constituting material having a light absorbing characteristic include materials for constituting the light reflection layer described later (for example, $SiO_X$, $SiN_X$, $TaO_X$, etc.). All the light-absorbing material layers may each include one of these materials. Alternatively, the light-absorbing material layers may each include various materials selected from these materials; from the viewpoint of simplification of formation of the light-absorbing material layers, however, it is preferable that one light-absorbing material layer includes one kind of material. The light-absorbing material layer may be formed in the first compound semiconductor layer, or may be formed in the second compound semiconductor layer, or may be formed in the first light reflection layer, or may be formed in the second light reflection layer, or an arbitrary combination of these may be adopted. Alternatively, the light-absorbing material layer may be used also as the electrode including the transparent conductive material described later.

<Light Emitting Element of Third Configuration>

Further, in the light emitting elements of the present disclosure including the above-mentioned preferred configurations (inclusive of the light emitting element of the first configuration and the light emitting element of the second configuration), a compound semiconductor substrate may be disposed between the first surface of the first compound semiconductor layer and the first light reflection layer. Here, the light emitting element of such a configuration is referred to as "the light emitting element of the third configuration." In this case, the compound semiconductor substrate may include a GaN substrate. Note that the thickness of the compound semiconductor substrate may be, for example, $5 \times 10^{-5}$ m to $1 \times 10^{-4}$ m, such a value being non-limitative. In the light emitting element of the third configuration including such a configuration, the first light reflection layer may include a multilayer light reflection film formed at the surface of part of the concave mirror section including a projecting portion of the compound semiconductor substrate. Here, the light emitting element of such a configuration is referred to as "the light emitting element of the 3-Ath configuration" for convenience' sake. Alternatively, the first light reflection layer may include a multilayer light reflection film formed at the surface of part of the concave mirror section formed over the compound semiconductor substrate. Here, the light emitting element of such a configuration is referred to as "the light emitting element of the 3-Bth configuration" for convenience' sake. The material constituting the concave mirror section in the light emitting element of the third-A configuration is, for example, the GaN substrate. As the GaN substrate, there may be used any of a polar substrate, an opposite-polar substrate, and a nonpolar substrate. On the other hand, examples of the material constituting the concave mirror section in the light emitting element of the 3-Bth configuration include dielectric materials such as $TiO_2$, $Ta_2O_5$, and $SiO_2$, silicone resins, and epoxy resins.

<Light Emitting Element of Fourth Configuration>

Alternatively, in the light emitting elements of the present disclosure including the above-mentioned preferred modes or configurations (inclusive of the light emitting element of the first configuration and the light emitting element of the second configuration), the first light reflection layer may be formed at the first surface of the first compound semiconductor layer. Here, the light emitting element of such a configuration is referred to as "the light emitting element of the fourth configuration" for convenience' sake.

Further, in the light emitting elements of the present disclosure including the above-mentioned preferred modes or configurations (inclusive of the light emitting element of the first configuration to the light emitting element of the fourth configuration), the value of thermal conductivity of the stacked structure may be higher than the value of thermal conductivity of the first light reflection layer. In general, the value of the thermal conductivity of the dielectric material constituting the first light reflection layer is approximately 10 watt/(m·) or less. On the other hand, the value of the thermal conductivity of the GaN-based compound semiconductor constituting the stacked structure is approximately 50 to 100 watt/(m·).

Furthermore, in the light emitting elements of the present disclosure including the above-mentioned preferred modes or configurations (inclusive of the light emitting element of the first configuration to the light emitting element of the fourth configuration), a configuration satisfying $R_{DBR} \leq 1 \times 10^{-3}$ m, preferably $1 \times 10^{-5}$ m $\leq R_{DBR} \leq 1 \times 10^{-3}$ m, more preferably $1 \times 10^{-5}$ m $\leq R_{DBR} \leq 1 \times 10^{-4}$ m may be adopted, where $R_{DBR}$ is the radius of curvature of the concave mirror section (specifically, the effective region of radius $r'_{DBR}$ in the concave mirror section) of the light emitting element. In addition, while $1 \times 10^{-5}$ m $\leq L_{OR}$ is satisfied, it is desirable to satisfy $1 \times 10^{-5}$ m $\leq L_{OR} \leq 5 \times 10^{-4}$ m, more preferably $1 \times 10^{-5}$ m $\leq L_{OR} \leq 1 \times 10^{-4}$ m.

Further, in the light emitting elements of the present disclosure including the above-mentioned preferred modes or configurations (inclusive of the light emitting element of the first configuration to the light emitting element of the fourth configuration), a configuration may be adopted in which a projected section is formed in the periphery of the first light reflection layer, and the first light reflection layer does not project from the projected section, whereby the first light reflection layer can be protected. Specifically, since the first light reflection layer is provided in the state of being recessed as compared to the projected section, it is ensured that, for example, when some body makes contact with the projected section, the body does not contact the first light reflection layer, so that the first light reflection layer can be protected securely.

In addition, in the light emitting elements of the present disclosure including the above-mentioned preferred modes or configurations (inclusive of the light emitting element of the first configuration to the light emitting element of the fourth configuration), with respect to the materials constituting the various compound semiconductor layers (inclusive of the compound semiconductor substrate) located between the active layer and the first light reflection layer, the absence of abnormality in refractive index of 10% or more (the absence of a refractive index difference of 10% or more, with the average refractive index of the stacked structure as a reference) is preferable, and this ensures that generation of disturbance of the light field in the resonator can be restrained.

By the light emitting elements of the present disclosure including the above-described preferred modes or configurations, a surface emitting laser element (vertical resonator laser, VCSEL) that emits laser light through the first light reflection layer can be configured, or a surface emitting laser element that emits laser light through the second light reflection layer can be configured. Note that the light emitting element manufacturing substrate may be removed, in some cases.

In the light emitting elements of the present disclosure, the stacked structure may specifically include an AlInGaN-based compound semiconductor. Here, more specific examples of the AlInGaN-based compound semiconductor include GaN, AlGaN, InGaN, and AlInGaN. Further, boron (B) atoms, thallium (Tl) atoms, arsenic (As) atoms, phosphorus (P) atoms, or antimony (Sb) atoms may be contained in these compound semiconductors, as desired. The active layer desirably has a quantum well structure. Specifically, the active layer may have a single quantum well structure (SQW structure), or may have a multi-quantum well structure (MQW structure). While the active layer having the quantum well structure has a structure in which at least one layer of a well layer and at least one layer of a barrier layer are stacked, examples of the combination of (the compound semiconductor constituting the well layer and the compound semiconductor constituting the barrier layer) include $(In_yGa_{(1-y)}N, GaN)$, $(In_yGa_{(1-y)}N, In_zGa_{(1-z)}N)$ (where y>z), and $(In_yGa_{(1-y)}N, AlGaN)$. The first compound semiconductor layer may include a compound semiconductor of a first conductivity type (for example, n type), and the second compound semiconductor layer may include a compound semiconductor of a second conductivity type (for example, p type) different from the first conductivity type. The first compound semiconductor layer and the second compound semiconductor layer are referred to also as the first cladding layer and the second cladding layer. The first compound semiconductor layer and the second compound semiconductor layer may be a layer of a single structure, or may be a layer of a multilayer structure, or may be a layer of a superlattice structure. Further, they may be a layer including a composition gradient layer or a concentration gradient layer.

The stacked structure is formed over the second surface of the light emitting element manufacturing substrate, or may be formed over the second surface of the compound semiconductor substrate. Examples of the light emitting element manufacturing substrate include a GaN substrate, a sapphire substrate, a GaAs substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, a Si substrate, and substrates having a ground layer or a buffer layer formed at a surface (main surface) of these substrates.

However, a GaN substrate is preferably used since it has a low defect density. In addition, examples of the compound semiconductor substrate include the GaN substrate. While it is known that a characteristic of the GaN substrate differs like polar/nonpolar/semi-polar depending on the growth surface, it is possible to use any main surface (second surface) of the GaN substrate for formation of the compound semiconductor layer. In addition, regarding the main surface of the GaN substrate, depending on the crystal structure (for example, cubic type, hexagonal type or the like), also crystal orientation planes called by such names as A plane, B plane, C plane, R plane, M plane, N plane, and S plane or planes obtained by offsetting them in a specific direction can be used. Examples of a method of forming various compound semiconductor layers constituting the light emitting element include an organometallic chemical vapor deposition method (MOCVD method, Metal Organic-Chemical Vapor Deposition method, MOVPE method, Metal Organic-Chemical Vapor Phase Epitaxy method), a molecular beam epitaxy method (MBE method), a hydride vapor phase growth method (HVPE method) in which halogen contributes to transportation or reaction, an atomic layer deposition method (ALD method), a migration-enhanced epitaxy method (MEE method), and a plasma-assisted physical vapor growth method (PPD method), which are non-limitative.

Here, examples of an organic gallium source gas in the MOCVD method include trimethyl gallium (TMG) gas and triethyl gallium (TEG) gas, and examples of a nitrogen source gas include ammonia gas and hydrazine gas. In formation of a GaN-based compound semiconductor layer having the n-type conductivity, for example, silicon (Si) is only required to be added as an n-type impurity (n-type dopant), and in formation of a GaN-based compound semiconductor layer having the p-type conductivity, for example, magnesium (Mg) is only required to be added as a p-type impurity (p-type dopant). In the case where aluminum (Al) or indium (In) is contained as a constituent atom of a GaN-based compound semiconductor layer, it is sufficient to use trimethyl aluminum (TMA) gas as an Al source, and to use trimethyl indium (TMI) gas as an In source. Further, it is sufficient to use monosilane gas (SiH$_4$ gas) as a Si source, and to use bis-cyclopentadienyl magnesium gas, methylcyclopentadienyl magnesium, or bis-cyclopentadienyl magnesium (Cp$_2$Mg) as a Mg source. Note that examples of the n-type impurity (n-type dopant) include Ge, Se, Sn, C, Te, S, O, Pd, and Po, in addition to Si, and examples of the p-type impurity (p-type dopant) include Zn, Cd, Be, Ca, Ba, C, Hg, and Sr, in addition to Mg.

The support substrate is only required to include, for example, various substrates mentioned as examples of the light emitting element manufacturing substrate, or include an insulating substrate made of AlN or the like, a semiconductor substrate made of Si, SiC, Ge or the like, a metal substrate, or an alloy substrate. However, a substrate having conductivity is preferably used, or a metal substrate or an alloy substrate is preferably used from the viewpoint of mechanical characteristics, elastic deformation, plastic deformability, heat dissipation property and so on. The thickness of the support substrate may be, for example, 0.05 to 1 mm. As a fixation method of the second light reflection layer to the support substrate, there can be used known methods such as a solder bonding method, a normal temperature bonding method, a bonding method using an adhesive tape, a bonding method using wax junction, and a method using an adhesive; from the viewpoint of securing conductivity, however, it is desirable to adopt a solder bonding method or a normal temperature bonding method. For example, in the case a silicon semiconductor substrate that is a conductive substrate is used as the support substrate, in order to restrain warping due to a difference in coefficient of thermal expansion, it is desirable to adopt a method by which the support substrate can be bonded at a low temperature equal to or lower than 400° C. In the case where a GaN substrate is used as the support substrate, the bonding temperature may be equal to or higher than 400° C.

In manufacture of the light emitting elements of the present disclosure, the light emitting element manufacturing substrate may be kept remaining, or the light emitting element manufacturing substrate may be removed after sequentially forming the active layer, the second compound semiconductor layer, the second electrode, and the second light reflection layer over the first compound semiconductor layer. Specifically, the active layer, the second compound semiconductor layer, the second electrode, and the second light reflection layer are sequentially formed over the first compound semiconductor layer, then the second light reflection layer is fixed to the support substrate, after which the light emitting element manufacturing substrate is only required to be removed to expose the first compound semiconductor layer (the first surface of the first compound semiconductor layer). The removal of the light emitting element manufacturing substrate can be performed by a wet etching method using an alkaline aqueous solution such as an aqueous sodium hydroxide solution, an aqueous potassium hydroxide solution, etc., an ammonium solution+a hydrogen peroxide solution, a sulfuric acid solution+a hydrogen peroxide solution, a hydrochloric acid solution+a hydrogen peroxide solution, a phosphoric acid solution+a hydrogen peroxide solution, etc., a chemical mechanical polishing method (CMP method), a mechanical polishing method, a dry etching method, a lift-off method using laser, etc., or a combination of these methods.

In the case where the light emitting element manufacturing substrate is left, the first electrode is only required to be formed over the first surface opposed to the second surface of the light emitting element manufacturing substrate, or over the first surface opposed to the second surface of the compound semiconductor substrate. On the other hand, in the case where the light emitting element manufacturing substrate is not left, the first electrode is only required to be formed over the first surface of the first compound semiconductor layer constituting the stacked structure. Note that in this case, since the first light reflection layer is formed over the first surface of the first compound semiconductor layer, the first electrode is only required to, for example, be formed in such a manner as to surround the first light reflection layer. The first electrode desirably has a single layer configuration or a multilayer configuration including at least one kind of metal (including an alloy selected), for example, from the group consisting of gold (Au), silver (Ag), palladium (Pd), platinum (Pt), nickel (Ni), Ti (titanium), vanadium (V), tungsten (W), chromium (Cr), Al (aluminum), Cu (copper), Zn (zinc), tin (Sn), and indium (In), specific examples including Ti/Au, Ti/Al, Ti/Al/Au, Ti/Pt/Au, Ni/Au, Ni/Au/Pt, Ni/Pt, Pd/Pt, and Ag/Pd. Note that a layer preceding "/" in the multilayer configuration is located nearer to the active layer. This similarly applies also to the description given below. The first electrode can be formed as a film by a PVD method such as a vacuum deposition method or a sputtering method.

In the case where the first electrode is formed such as to surround the first light reflection layer, the first light reflection layer and the first electrode may be in contact with each other. Alternatively, a configuration may be adopted in which the first light reflection layer and the first electrode are spaced from each other, namely, have an offset therebetween, and the spaced distance is within 1 mm. If the current injection region located in the first light reflection layer and the first electrode are spaced from each other in a plane, the current flows over a long distance in the first compound semiconductor layer. Therefore, in order to suppress the electric resistance generated in the current path to a low value, the spaced distance is preferably within 1 mm. There may be a case where the first electrode is formed even across an edge portion of the first light reflection layer, or there may be a case where the first light reflection layer is formed even across an edge portion of the first electrode. Here, in the case where the state in which the first light reflection layer is formed even across an edge portion of the first electrode is to be applied, the first electrode should have an opening of some size such that the first electrode does not absorb basic mode light of laser oscillation as far as possible. Since the size of the opening varies depending on the wavelength of the basic mode or the light confinement structure in a lateral direction (in-plane direction of the first compound semiconductor layer), it preferably is roughly on the order of several times the oscillation wavelength $\lambda_0$ or more, which is not limitative.

The second electrode may include a transparent conductive material. Examples of the transparent conductive material constituting the second electrode include: indium-based transparent conductive materials (specific examples of which include indium tin composite oxides (including ITO, Indium Tin Oxide, Sn-doped $In_2O_3$, crystalline ITO, and amorphous ITO), indium zinc composite oxides (IZO, Indium Zinc Oxide), indium gallium composite oxide (IGO), indium-doped gallium zinc composite oxides (IGZO, In—GaZnO$_4$), FO (F-doped $In_2O_3$), ITiO (Ti-doped $In_2O_3$), InSn, InSnZnO); tin-based transparent conductive materials (specific examples of which include tin oxide ($SnO_2$), ATO (Sb-doped $SnO_2$), FTO (F-doped $SnO_2$)); zinc-based transparent conductive materials (specific examples of which include zinc oxides (including ZnO, Al-doped ZnO (AZO), and B-doped ZnO), gallium-doped zinc oxide (GZO), and AlMgZnO (aluminum oxide- and magnesium oxide-doped zinc oxide)); and NiO. Alternatively, the second electrode may include a transparent conductive film including a mother layer made of gallium oxide, titanium oxide, niobium oxide, antimony oxide, nickel oxide or the like, and may include a transparent conductive material such as a spinel type oxide, or an oxide having a $YbFe_2O_4$ structure. Note that though depending on the layout state of the second light reflection layer and the second electrode, the material constituting the second electrode is not limited to the transparent conductive material, and a metal such as palladium (Pd), platinum (Pt), nickel (Ni), gold (Au), cobalt (Co), and rhodium (Rh) can also be used. The second electrode is only required to include at least one of the above-mentioned materials. The second electrode can be formed as a film by a PVD method such as a vacuum deposition method or a sputtering method. Alternatively, a semiconductor layer low in resistance can be used as the transparent electrode layer. In this case, specifically, an n-type GaN-based compound semiconductor layer can also be used. Further, in the case where a layer adjacent to the n-type GaN-based compound semiconductor layer is of p-type, both of them can be joined together through a tunnel junction, thereby lowering the electric resistance at the interface. By configuring the second electrode from a transparent conductive material, current can be spread in the transverse direction (in-plane direction of the second compound semiconductor layer), and current can be supplied to the current injection region efficiently.

In order to establish electrical connection to an external electrode or circuit, a pad electrode may be provided over the first electrode or the second electrode. The pad electrode preferably has a single layer configuration or a multilayer configuration including at least one metal selected from the group consisting of Ti (titanium), aluminum (Al), Pt (platinum), Au (gold), Ni (nickel), and Pd (palladium). Alternatively, the pad electrode may have multilayer configuration such as, for example, a multilayer configuration of Ti/Pt/Au, a multilayer configuration of Ti/Au, a multilayer configuration of Ti/Pd/Au, a multilayer configuration of Ti/Pd/Au, a multilayer configuration of Ti/Ni/Au, or a multilayer configuration of Ti/Ni/Au/Cr/Au. In the case where the first electrode includes an Ag layer or an Ag/Pd layer, it is preferable to form a cover metal layer including, for example, Ni/TiW/Pd/TiW/Ni over the surface of the first electrode, and to form a pad electrode having, for example, a multilayer configuration of Ti/Ni/Au or a multilayer configuration of Ti/Ni/Au/Cr/Au over the cover metal layer.

A light reflection layer (Distributed Bragg Reflector layer, DBR layer) constituting the first light reflection layer and the second light reflection layer includes, for example, a semiconductor multilayer film or a dielectric multilayer film. Examples of the dielectric material include oxides of Si, Mg, Al, Hf, Nb, Zr, Sc, Ta, Ga, Zn, Y, B, Ti and so on, nitrides of these elements (for example, $SiN_X$, $AlN_X$, $AlGaN_X$, $GaN_X$, $BN_X$, etc.), fluorides of these elements and the like. Specific examples include $SiO_X$, $TiO_X$, $NbO_X$, $ZrO_X$, $TaO_X$, $ZnO_X$, $AlO_X$, $HfO_X$, $SiN_X$, and $AlN_X$. By alternately stacking two or more kinds of dielectric films including dielectric materials having different refractive indexes from among these dielectric materials, a light reflection layer can be obtained. For example, a multilayer film of $SiO_X/SiN_Y$, $SiO_X/TaO_X$, $SiO_X/NbO_Y$, $SiO_X/ZrO_Y$, $SiO_X/AlN_Y$ or the like is preferable. In order to obtain a desired light reflectance, the material, film thickness, number of stacked layers and the like constituting each dielectric film are only required to be suitably selected. The thickness of each dielectric film can be suitably adjusted depending on the material to be used or the like, and is determined by the oscillation wavelength (light emission wavelength) $\lambda_0$ and the refractive index n at the oscillation wavelength $\lambda_0$ of the material used. Specifically, the thickness of each dielectric layer is preferably set to an odd number times $\lambda_0/(4n)$. For example, in the case where a light reflection layer in a light emitting element whose oscillation wavelength $\lambda_0$ is 410 nm includes $SiO_X/NbO_Y$, the thickness may be, for example, approximately 40 to 70 nm. The number of stacked layers may be, for example, two or more, preferably approximately 5 to 20. The thickness of the light reflection layer as a whole may be, for example, approximately 0.6 to 1.7 μm. In addition, the light reflectance of the light reflection layer is desirably equal to or more than 95%.

The light reflection layer can be formed based on a known method. Specific examples of the method include: PVD methods such as vacuum deposition method, sputtering method, reactive sputtering method, ECR plasma sputtering method, magnetron sputtering method, ion beam assisted deposition method, ion plating method, and laser ablation method; various CVD methods; coating methods such as spraying method, spin coating method, and dipping method; a method of a combination of two or more of these method; a method of a combination of any of these methods and at least one of a whole or partial pretreatment, irradiation with an inert gas (Ar, He, Xe or the like) or plasma, irradiation with oxygen gas, ozone gas, or plasma, an oxidation process (heat treatment), and a light exposure process, and so on.

The light reflection layer is not particularly limited in size or shape so long as it covers the current injection region or an element region. Examples of the shape of the boundary between the current injection region and the current non-injection region or the plan-view shape of an opening provided in the element region and the current constriction region include a circular shape, an elliptical shape, a rectangular shape, and a polygonal shape (triangular shape, tetragonal shape, hexagonal shape, etc.). In the case where the shape of the boundary between the current injection region and the current non-injection region is a circular shape, the diameter preferably is approximately 5 to 100 μm. Here, "the element region" refers to a region into which a constricted current is injected, or a region in which light is confined due to a refractive index difference or the like, or that region sandwiched between the first light reflection layer and the second light reflection layer in which laser oscillation is generated, or that region sandwiched between the first light reflection layer and the second light reflection layer which actually contributes to laser oscillation.

Side surfaces and the exposed surface of the stacked structure may be coated with a coating layer. Formation of the coating layer can be performed by a known method. The refractive index of the material constituting the coating layer is preferably lower than the refractive index of the material constituting the stacked structure. Examples of the material constituting the coating layer include $SiO_X$-based materials including $SiO_2$, $SiN_X$-based materials, $SiO_YN_Z$-based materials, $TaO_X$, $ZrO_X$, $AlN_X$, $AlO_X$, and $GaO_X$, and organic materials such as polyimide resin. Examples of a method of forming the coating layer include PVD methods such as vacuum deposition method and sputtering method, and CVD methods, and the coating layer can also be formed based on a coating method.

Example 1

Example 1 relates to the light emitting elements according to the first mode and the third mode of the present disclosure, particularly to the light emitting element of the 3-Ath configuration. The light emitting element of Example 1 or any of Examples 2 to 9 includes a surface emitting laser element (vertical resonator laser, VCSEL) that emits laser light from a top surface of a first compound semiconductor layer through a first light reflection layer, or a surface emitting laser element that emits laser light from a top surface of a second compound semiconductor layer through a second light reflection layer. In addition, the light emitting element of Example 10 described later, more specifically, includes a surface emitting laser element (vertical resonator laser, VCSEL) that emits laser light from a top surface of a first compound semiconductor layer through a first light reflection layer. A schematic partial end view of the light emitting element of Example 1 is depicted in FIG. 1.

The light emitting element of Example 1 or the light emitting element of any of Examples 2 to 10 includes:

(A) a stacked structure 20 which includes a GaN-based compound semiconductor and in which a first compound semiconductor layer 21 having a first surface 21a and a second surface 21b opposed to the first surface 21a and having a first conductivity type (specifically, n-type), an active layer (light emitting layer) 23 facing the second surface 21b of the first compound semiconductor layer 21, and a second compound semiconductor layer 22 having a first surface 22a facing the active layer 23 and a second surface 22b opposed to the first surface 22a and having a second conductivity type (specifically, p-type)

are stacked;

(B) a first light reflection layer 41 disposed on the first surface 21a side of the first compound semiconductor layer 21; and (C) a second light reflection layer 42 disposed on the second surface 22b side of the second compound semiconductor layer 22. The first light reflection layer 41 is formed over a concave mirror section 43. The second light reflection layer 42 has a flat shape.

The second compound semiconductor layer 22 is provided with a current injection region 61A, and a current non-injection region (current constriction region) 61B surrounding the current injection region 61A.

A center point of a light field in the active layer 23 and an area center-of-gravity point of the current injection region 61A coincide with each other. Specifically, the distance between the center point of the light field in the active layer 23 and the area center-of-gravity point of the current injection region 61A is 0.5 μm or less. Alternatively, the shape of the concave mirror section 43 is a spherical shape or a parabolic shape with a coefficient of determination of 0.8 or more, preferably 0.9 or more, more preferably 0.99 or more, within a desired region, such as within the range (region) of a beam waist radius $\omega_0$ from a central portion of the concave mirror section 43, or within the range (region) of 1.2 times the beam waist radius $\omega_0$, or within the range (region) of two times the beam waist radius $\omega_0$.

In addition, a region of the first light reflection layer 41 to a certain depth from the first surface 21a of the first compound semiconductor layer 21, the stacked structure 20 (the first compound semiconductor layer 21, the active layer 23, and the second compound semiconductor layer 22), and a region of the second light reflection layer 42 to a certain depth from the second surface 22b of the second compound semiconductor layer 22 constitute a resonator. Here, let the resonator length be $L_{OR}$, then $1\times10^{-5}$ m≤$L_{OR}$ is satisfied.

In the light emitting element of Example 1, the figure described by an interface 43a of part of the concave mirror section 43 in section of the concave mirror section 43 along a virtual plane including the stacking direction of the stacked structure 20 (the part is an effective region 44 of the concave mirror section 43, and is the above-mentioned desired region) which faces the stacked structure 20 is part of a circle or part of a parabola. The shape (the figure of a sectional shape) of that part of the concave mirror section 43 which is located on the outside of the effective region 44 may not be part of a circle or part of a parabola.

In addition, a compound semiconductor substrate 11 including a GaN substrate is disposed between the first surface 21a of the first compound semiconductor layer 21 and the first light reflection layer 41. The surface of the compound semiconductor substrate (light emitting element manufacturing substrate) 11 that faces the first compound semiconductor layer 21 is referred to as "the second surface 11b" and the surface opposed to the second surface 11b is referred to as "the first surface 11a." In other words, the stacked structure 20 is formed over the second surface 11b of the compound semiconductor substrate 11 which is conductive. Besides, the first light reflection layer 41 includes a multilayer light reflection film 45 formed over the surface of part of the concave mirror section 43 (specifically, the surface of the concave mirror section 43) that includes a projecting portion 11a' of the first surface 11a of the compound semiconductor substrate 11. Further, let the radius of curvature of the concave mirror section 43 (specifically, the effective region 44 of a radius $r'_{DBR}$ in the concave mirror section 43) be $R_{DBR}$, then $$R_{DBR} \le 1\times10^{-3} \text{ m}$$

is satisfied. Exemplary values are $$L_{OR}=50 \text{ μm}$$

$$R_{DBR}=70 \text{ μm}$$

$$r'_{DBR}=20 \text{ μm},$$

which are non-limitative. Besides, an exemplary value of wavelength (oscillation wavelength) $\lambda_0$ of desired light mainly emitted from the light emitting element is $$\lambda_0=450 \text{ nm}.$$

Here, let a distance from the active layer 23 to the interface between the concave mirror section 43 and the multilayer light reflection film 45 be $T_0$, then a function x=f(z) of an ideal parabola can be represented as $$x=z^2/T_0$$

$$h_{DBR}=r'_{DBR}{}^2/2T_0.$$

However, where the figure described by the interface 43a is part of a parabola, the parabola may naturally be one deviated from such an ideal parabola. It is to be noted, however, that as aforementioned the figure is a spherical shape or a parabolic shape with a coefficient of determination of 0.8 or more, within a desired region.

In addition, the value of thermal conductivity of the stacked structure 20 is higher than the value of thermal conductivity of the first light reflection layer 41. The value of thermal conductivity of the dielectric material constituting the first light reflection layer 41 is approximately 10 watt/(m·) or less. On the other hand, the value of thermal conductivity of the GaN-based compound semiconductor constituting the stacked structure 20 is approximately 50 to 100 watt/(m·).

The first compound semiconductor layer 21 includes an n-GaN layer, while the active layer 23 has a quintuple multi-quantum well structure in which $In_{0.04}Ga_{0.96}N$ layers (barrier layers) and $In_{0.16}Ga_{0.84}N$ layers (well layers) are stacked, and the second compound semiconductor layer 22 includes a p-GaN layer. The first electrode 31 is formed over the first surface 11a of the compound semiconductor substrate 11. On the other hand, the second electrode 32 is formed over the second compound semiconductor layer 22, and the second light reflection layer 42 is formed over the second electrode 32. The second light reflection layer 42 over the second electrode 32 has a flat shape. The first electrode 31 includes Ti/Pt/Au, whereas the second electrode 32 includes a transparent conductive material, specifically, ITO. For establishing electrical connection to an external electrode or circuit, a pad electrode (not illustrated) including, for example, Ti/Pt/Au or V/Pt/Au is formed or connected over an edge portion of the first electrode 31. For establishing electrical connection to an external electrode or circuit, a pad electrode 33 including, for example, Pd/Ti/Pt/Au, Ti/Pd/Au, or Ti/Ni/Au is formed or connected over an edge portion of the second electrode 32. The first light reflection layer 41 and the second light reflection layer 42 have a stacked structure (the total number of stacked layers in the dielectric film: 20 layers) of $Ta_2O_5$ layers and $SiO_2$ layers. While the first light reflection layer 41 and the second light reflection layer 42 have such a multilayer structure, they are denoted as single layer, for simplification of the drawing. Respective plan-view shapes of openings 34A provided in the first electrode 31, the first light reflection layer 41, the second light reflection layer 42, and the insulating film (current constriction region) 34 are circular.

A method of manufacturing the light emitting element of Example 1 will be described below referring to FIGS. 2A, 2B, 3, 4A, 4B, 5, and 6 which are schematic partial end views of the stacked structure and the like.

First, a stacked structure 20 which includes a GaN-based compound semiconductor and in which a first compound semiconductor layer 21 having a first surface 21a and a second surface 21b opposed to the first surface 21a and having a first conductivity type (specifically n-type), an active layer (light emitting layer) 23 facing the second surface 21b of the first compound semiconductor layer 21, and a second compound semiconductor layer 22 having a first surface 22a facing the active layer 23 and a second surface 22b opposed to the first surface 22a and having a second conductivity type (specifically, p-type), are stacked is formed, and a concave mirror section 43 is formed on the first surface 21a side of the first compound semiconductor layer 21.

In addition, the first surface 21a of the first compound semiconductor layer 21 is in contact with a second surface 11b of a substrate 11, the concave mirror section 43 is formed over the first surface 11a of the substrate 11 opposed to the second surface 11b of the substrate 11, and formation of the concave mirror section 43 includes subjecting the first surface 11a of the substrate 11 to etching.
(Step-100)

Specifically, the first surface 11a of the compound semiconductor substrate 11 is formed with the concave mirror section 43 that includes a projecting portion 11a'. Specifically, a resist layer patterned is formed over the first surface 11a of the compound semiconductor substrate 11 to be formed with the concave mirror section 43, and the resist layer is heated to cause reflow of the resist layer, to obtain a resist pattern. A shape which is the same as (or similar to) the shape of the projecting portion 11a' is imparted to the resist pattern. Then, the resist pattern and the first surface 11a of the compound semiconductor substrate 11 are etched back using a RIE method, to form the first surface 11a of the compound semiconductor substrate 11 with the concave mirror section 43 including the projecting portion 11a'.
(Step-110)

Next, a stacked structure 20 which includes a GaN-based compound semiconductor and in which a first compound semiconductor layer 21 having a first surface 21a and a second surface 21b opposed to the first surface 21a, an active layer (light emitting layer) 23 facing the second surface 21b of the first compound semiconductor layer 21, and a second compound semiconductor layer 22 having a first surface 22a facing the active layer 23 and a second surface 22b opposed to the first surface 22a, are stacked is formed, over a second surface 11b of the compound semiconductor substrate 11. Specifically, based on an epitaxial growth method by a known MOCVD method, the first compound semiconductor layer 21, the active layer 23, and the second compound semiconductor layer 22 are sequentially formed over the second surface 11b of the compound semiconductor substrate 11, whereby the stacked structure can be obtained (see FIG. 2A).

Note that the order of (step-100) and (step-110) may be reversed. In addition, a method which will be described later as a modification of Example 2 may be adopted.

Next, a photosensitive material layer 35 is formed over the second compound semiconductor layer 22, after which a mask member (exposure mask) 37 having an opening 37A is disposed on an upper side of the first compound semiconductor layer side, and the photosensitive material layer 35 is exposed to light from the concave mirror section side through the stacked structure 20, thereby to obtain a treatment mask layer 36 including the photosensitive material layer 35. Then, using the treatment mask layer 36, the second compound semiconductor layer 22 is subjected to processing.
(Step-120)

Figure 2A:
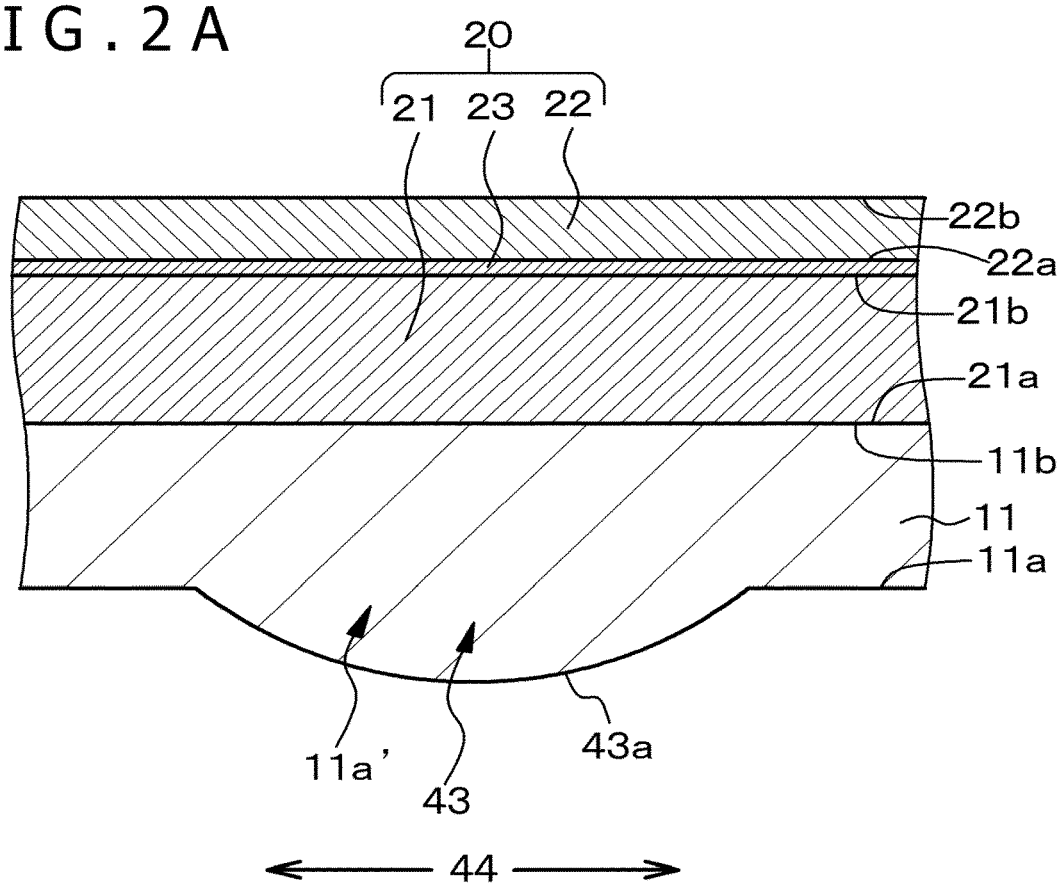
FIGS. 2A and 2B are schematic partial end views of a stacked structure and the like for illustrating a method of manufacturing a light emitting element of Example 1.
Figure 2B:
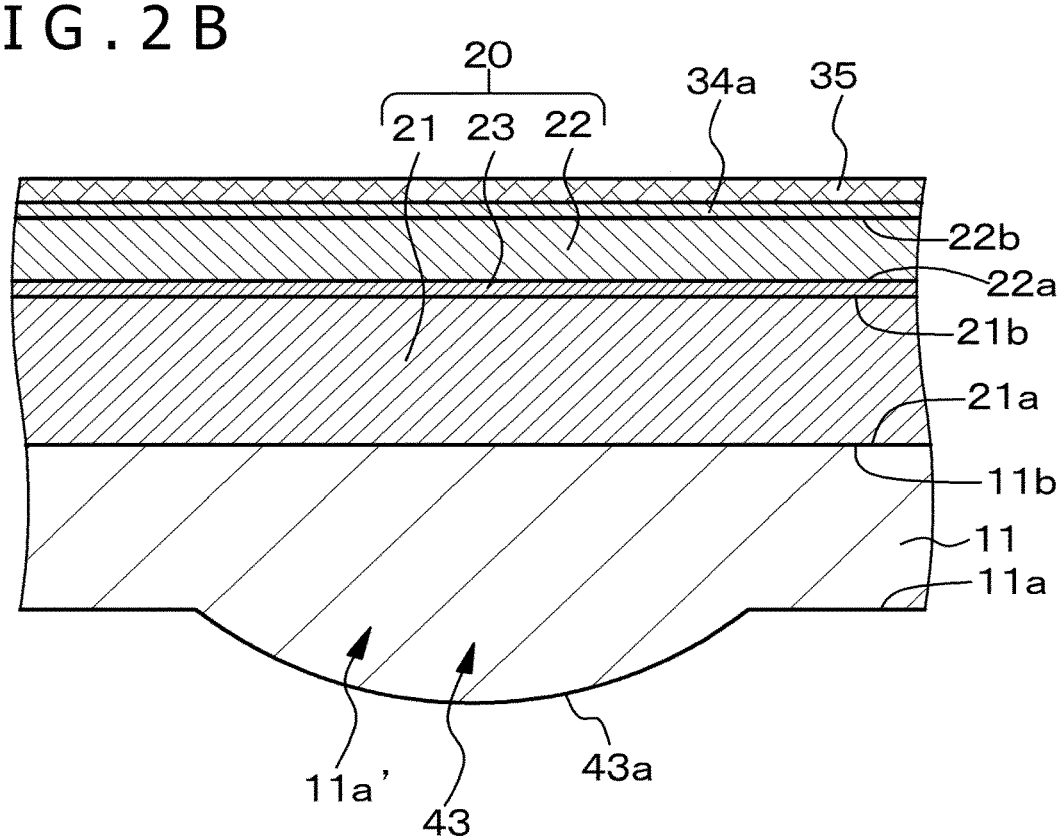

Specifically, an insulating film 34a including $SiO_X$ is formed over the second surface 22b of the second compound semiconductor layer 22, based on a film forming method such as a CVD method, a sputtering method, and a vacuum deposition method, to form the photosensitive material layer 35 including the resist material over the insulating film 34a (see FIG. 2B).
(Step-130)

Figure 3:
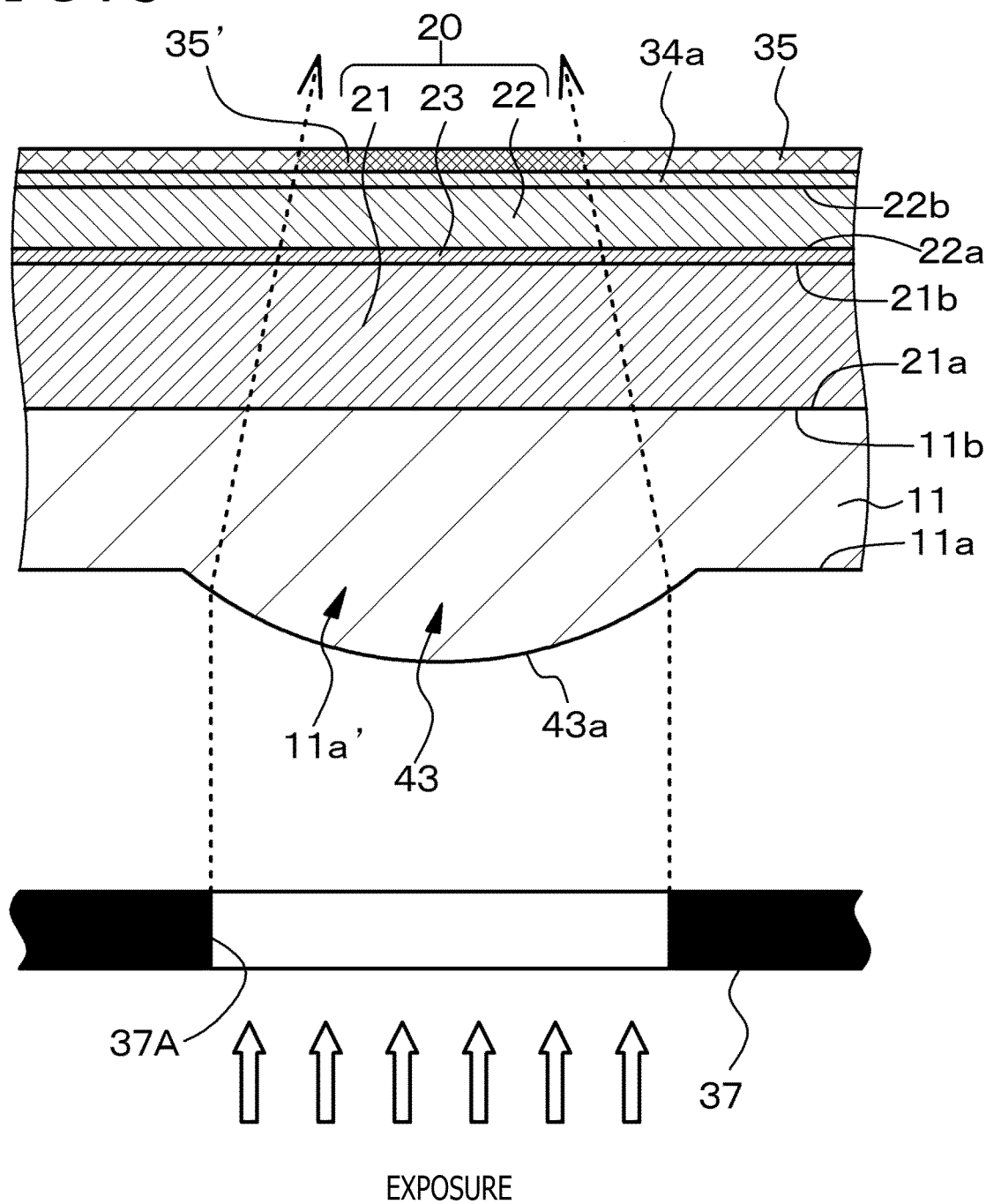
FIG. 3 is a schematic partial end view of the stacked structure and the like for illustrating the method of manufacturing the light emitting element of Example 1, subsequent to FIG. 2B.
Figure 4A:
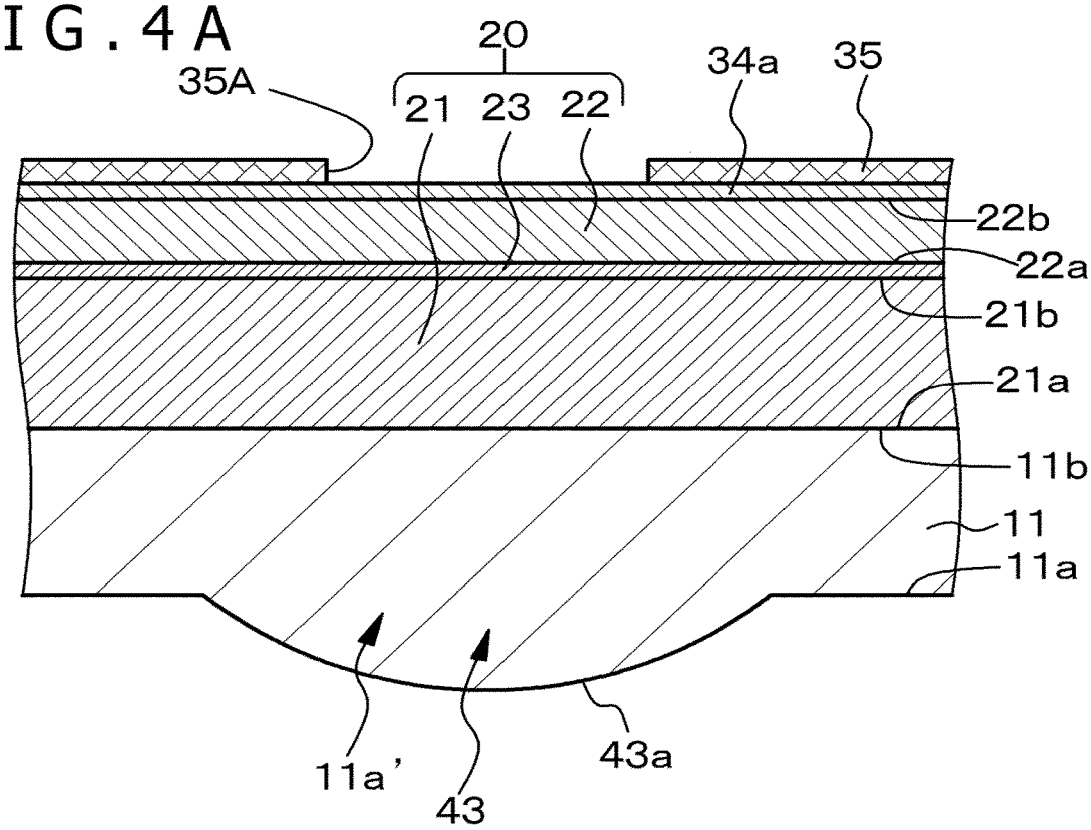
FIGS. 4A and 4B are schematic partial end views of the stacked structure and the like for illustrating the method of manufacturing the light emitting element of Example 1, subsequent to FIG. 3.
Figure 4B:
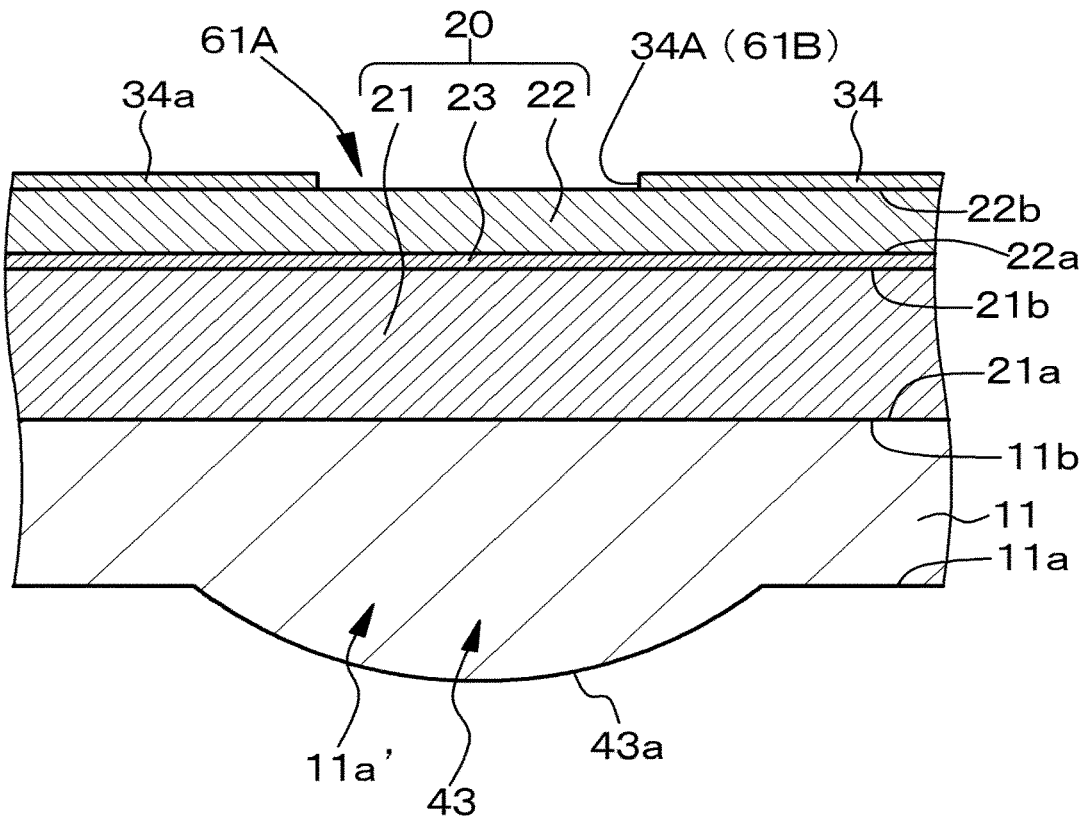
Figure 5:
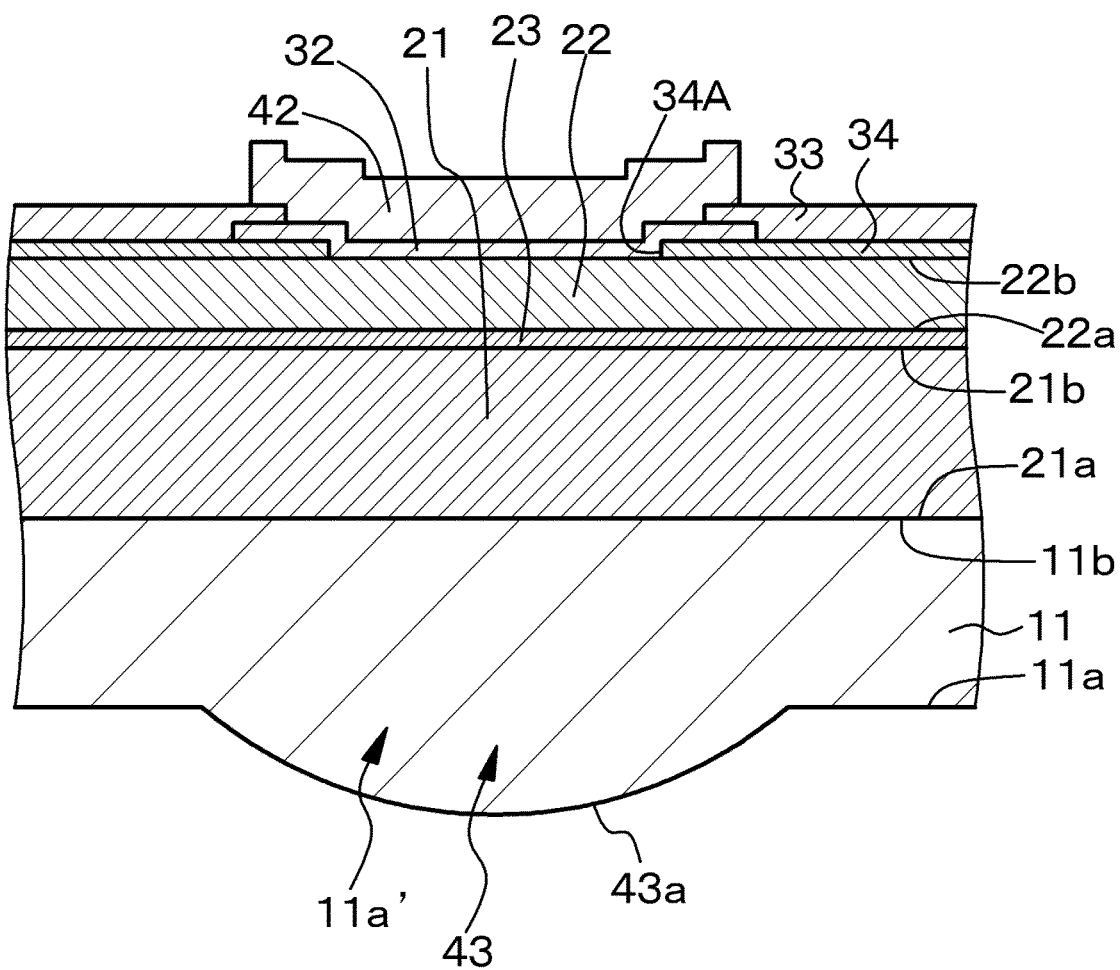
FIG. 5 is a schematic partial end view of the stacked structure and the like for illustrating the method of manufacturing the light emitting element of Example 1, subsequent to FIG. 4B.
Figure 6:
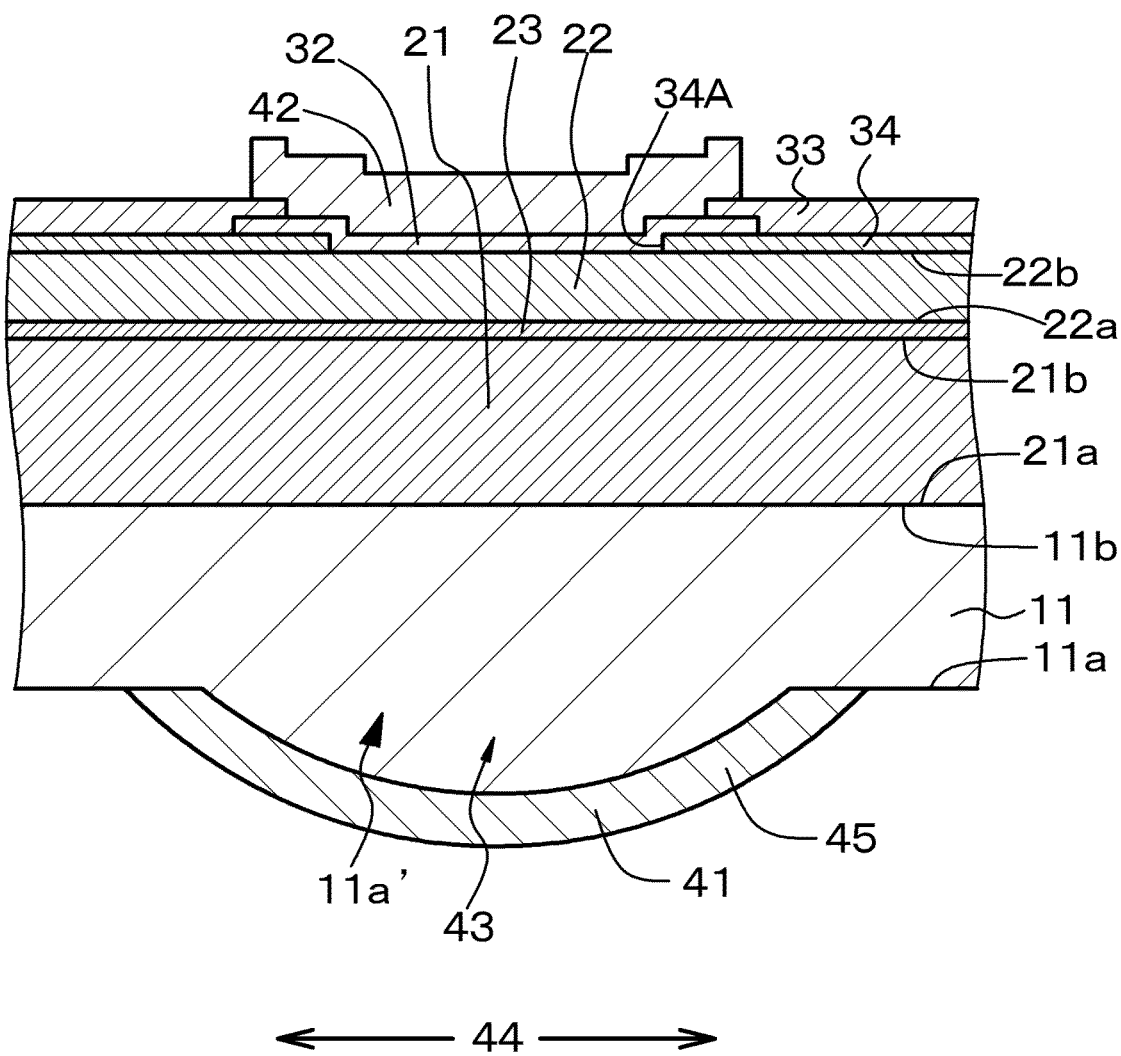
FIG. 6 is a schematic partial end view of the stacked structure and the like for illustrating the method of manufacturing the light emitting element of Example 1, subsequent to FIG. 5.

Then, the photosensitive material layer 35 is exposed to light from the side of the compound semiconductor substrate 11 (specifically, from the concave mirror section side) through the concave mirror section 43 and the stacked structure 20 (see FIG. 3). That part of the photosensitive material layer 35 which is exposed is indicated by reference sign 35'. Next, the photosensitive material layer 35 is developed, whereby the photosensitive material layer 35 is left in a region where a current non-injection region 61B (current constriction region) is to be formed, and the photosensitive material layer 35 is removed from a region where a current injection region 61A is to be formed, to form an opening 35A (see FIG. 4A). Then, using the thus patterned photosensitive material layer 35 as a treatment mask layer, specifically, as a treatment mask layer for etching, the insulating film 34a formed over the second compound semiconductor layer 22 is etched, after which the photosensitive material layer 35 is removed (see FIG. 4B). In this way, an insulating film 34 (current constriction region) including $SiO_X$ and having the opening 34A can be formed. By the insulating film 34 having the opening 34A, the current injection region 61 and the current non-injection region 61B (current constriction region) are defined. Besides, the current injection region 61A is defined by the opening 34A.

In order to obtain the current constriction region, an insulating film (current constriction region) including an insulating material (for example, $SiN_X$, $AlO_X$, $ZrO_X$, or $HfO_X$, in addition to $SiO_X$) may be formed between the second electrode 32 and the second compound semiconductor layer 22. Alternatively, ion implantation using a treatment mask layer may be conducted, or the second compound semiconductor layer may be subjected to an ashing treatment using a treatment mask layer, or irradiation with plasma using a treatment mask layer may be conducted, whereby a region lowered in conductivity (current constriction region) can be formed. In these cases, formation of the insulating film 34 is not needed. Alternatively, the second compound semiconductor layer may be subjected to a reactive etching (RIE) treatment using a treatment mask layer, whereby the second compound semiconductor layer 22 or the like may be formed with a mesa structure. In this case, formation of the insulating film 34 is not needed. It is to be noted, however, that the second electrode 32 should be electrically connected to that part of the second compound semiconductor layer 22 in which current flows due to current constriction.

After the second compound semiconductor layer 22 is formed with the current injection region 61A and the current non-injection region 61B (current constriction region), the second electrode 32 is formed over the second compound semiconductor layer 22, and a second light reflection layer 42 is formed over the second electrode 32. In addition, a first light reflection layer 41 is formed over the concave mirror section 43, and a first electrode 31 electrically connected to the first compound semiconductor layer 21 is formed.
(Step-140)

Specifically, thereafter, the second electrode 32 and the second light reflection layer 42 are formed over the second compound semiconductor layer 22. Specifically, the second electrode 32 is formed, for example, based on a lift-off method, over an area ranging from the second surface 22b of the second compound semiconductor layer 22 exposed at a bottom surface of the opening 34A (current injection region 61A) to the upper side of the insulating film 34, and, further, the pad electrode 33 is formed based on a combination of a film forming method such as a sputtering method or a vacuum deposition method with a patterning method such as a wet etching method or a dry etching method. Next, over an area ranging from the upper side of the second electrode 32 to the upper side of the pad electrode 33, the second light reflection layer 42 is formed based on a combination of a film forming method such as a sputtering method or a vacuum deposition method with a patterning method such as a wet etching method or a dry etching method. The second light reflection layer 42 over the second electrode 32 has a flat shape. In this way, a structure depicted in FIG. 5 can be obtained.
(Step-150)

Thereafter, a multilayer light reflection film 45 is formed over at least part of the concave mirror section 43. Specifically, over an area from the exposed surface (first surface 11a) of the compound semiconductor substrate 11 to the upper side of the concave mirror section 43, the multilayer light reflection film 45 is formed based on a known method such as a sputtering method or a vacuum deposition method. Then, unrequired parts of the multilayer light reflection film 45 are removed based on a pattering method such as a wet etching method or a dry etching method, to obtain a first light reflection layer 41 (see FIG. 6), after which a first electrode 31 is formed over the first surface 11a of the compound semiconductor substrate 11 based on a combination of a film forming method such as a sputtering method or a vacuum deposition method with a patterning method such as a wet etching method or a dry etching method, whereby the first electrode 31 electrically connected to the first compound semiconductor layer 21 can be obtained. In this manner, the light emitting element of Example 1 having the structure depicted in FIG. 1 can be obtained.
(Step-160)

Thereafter, so-called element separation is conducted to separate the light emitting element, and side surfaces and the exposed surface of the stacked structure are coated with an insulating layer including $SiO_2$, for example. Next, packaging or sealing is conducted, to complete the light emitting element of Example 1.

In the method of manufacturing the light emitting element of Example 1, the photosensitive material layer is exposed to light from the first surface side of the substrate through the concave mirror section to obtain a treatment mask layer including the photosensitive material layer, after which the second compound semiconductor layer is subjected to processing by use of the treatment mask layer. Therefore, misregistration is hardly generated between the concave mirror section and the processed region of the second compound semiconductor layer, it is possible to suppress an increase in the current value required for oscillation (light emission), namely, an increase in the threshold current value, and it is possible to provide a light emitting element having high reliability.

In the light emitting element of Example 1, the first light reflection layer is formed over the concave mirror section. Therefore, even if the resonator length $L_{OR}$ is equal to or more than $1 \times 10^{-5}$ m, an increase in diffraction loss can be avoided, and, as a result, laser oscillation can be performed securely. In addition, since the resonator length $L_{OR}$ can be made to be equal to or more than $1 \times 10^{-5}$ m, the problem of thermal saturation can be mitigated. Besides, since the resonator length $L_{OR}$ can be made to be equal to or more than $1 \times 10^{-5}$ m, tolerance of the manufacturing process for the light emitting element is enhanced, and, as a result, an enhanced yield can be realized.

In addition, in the manufacturing process of the light emitting element, exclusive of Example 4 which will be described later, a GaN substrate is used, but a GaN-based compound semiconductor is not formed based on a method for transverse epitaxial growth such as an ELO method. Therefore, as the GaN substrate, there can be used not only a polar GaN substrate but also an opposite-polar GaN substrate and a nonpolar GaN substrate. When a polar GaN substrate is used, luminescent efficiency tends to be lowered due to an effect of a piezo electric field in the active layer, but, when a nonpolar GaN substrate or an opposite-polar GaN substrate is used, such a problem can be solved or mitigated.

Figure 7:
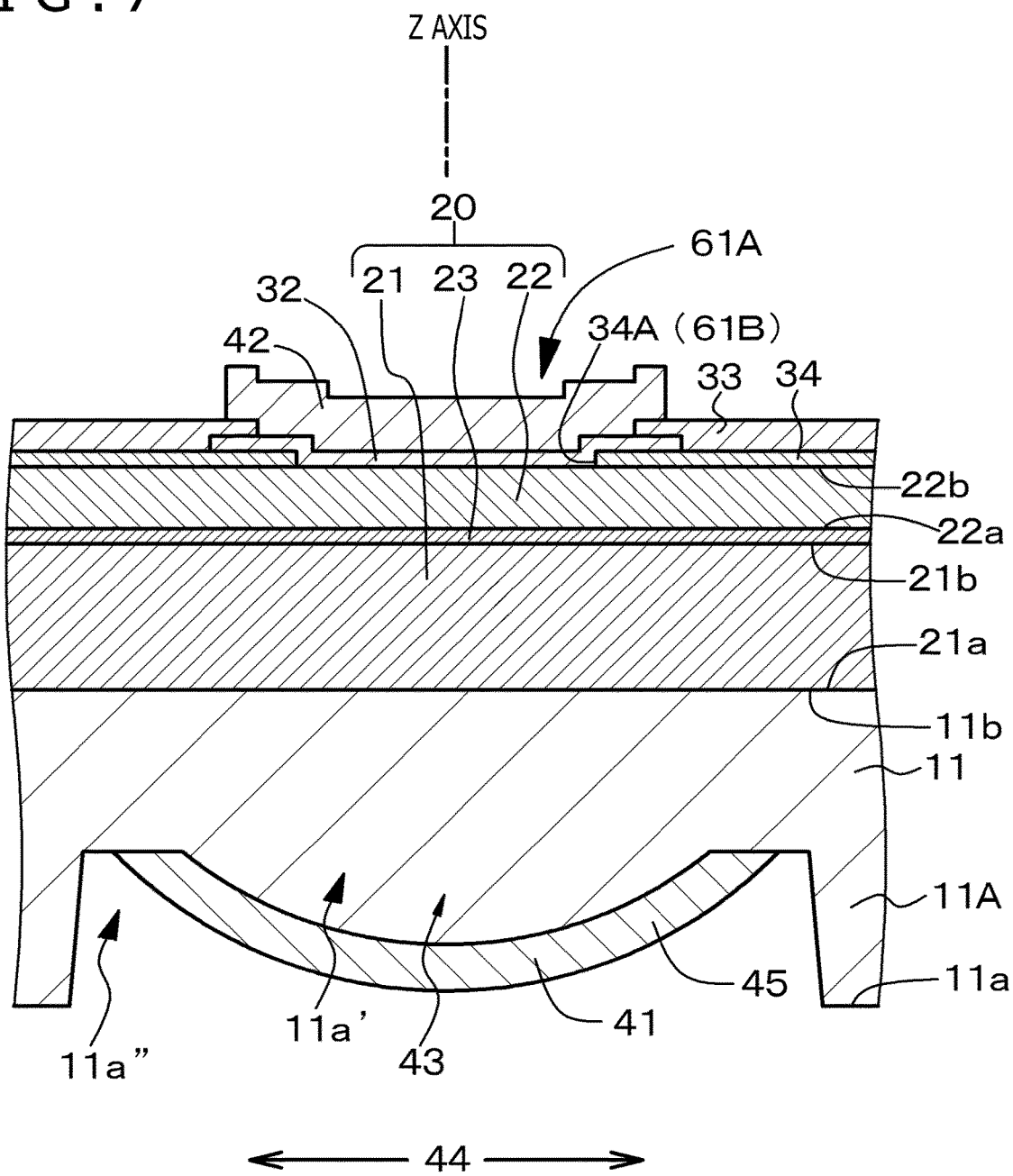
FIG. 7 is a schematic partial end view of a modification of the light emitting element of Example 1.

As a modification of the light emitting element of Example 1, before the first surface 11a of the compound semiconductor substrate 11 is formed with the concave mirror section 43 including the projecting portion 11a', in (step-100), a recess 11a" is formed in that region of the first surface 11a of the compound semiconductor substrate 11 in which to form the concave mirror section 43, a patterned resist layer is formed in the recess 11a", and the resist layer is heated to cause reflow of the resist layer, thereby to obtain a resist pattern. A shape which is the same as (or similar to) the shape of the projecting portion 11a' is imparted to the resist pattern. Then, the parts of the resist pattern and the recess 11a" are etched back by use of a RIE method or the like, whereby the concave mirror section 43 including the projecting portion 11a' may be formed in the recess 11a" in the first surface 11a of the compound semiconductor substrate 11. In the modification (see FIG. 7) of the light emitting element of Example 1 obtained in this way, a projection-shaped portion IA is formed in the periphery of the first light reflection layer 41, and the first light reflection layer 41 is not projecting from the projection-shaped portion 11A (including the first surface 11a of the compound semiconductor substrate 11), whereby the first light reflection layer 41 can be protected.

Alternatively, simultaneously when the first surface 11a of the compound semiconductor substrate 11 is formed with the concave mirror section 43 including the projecting portion 11a', in (step-100), the first surface 11a of the compound semiconductor substrate 11 may be formed with a projecting portion such as to be spaced from the concave mirror section 43 and to surround the concave mirror section 43. Specifically, a patterned resist layer is formed over the first surface 11a of the compound semiconductor substrate 11 where to form the concave mirror section 43, and the resist layer is heated to cause reflow of the resist layer, thereby obtaining a resist pattern. A shape which is the same as (or similar to) the shape of the projecting portion 11a' is imparted to the resist pattern. In addition, a resist layer is formed over that part of the first surface 11a of the compound semiconductor substrate 11 at which to form a projecting portion, in such a manner as to be spaced from the resist pattern and to surround the resist pattern. Then, the resist pattern, the resist layer, and the first surface 11a of the compound semiconductor substrate 11 are etched back by use of a RIE method or the like, whereby the first surface 11a of the compound semiconductor substrate 11 can be formed with the concave mirror section 43 including the projecting portion 11a', and, concurrently, the projecting portion can be formed. In the modification of the light emitting element of Example 1 obtained in this way, also, the projecting portion is not formed in the periphery of the first light reflection layer 41, and the first light reflection layer 41 is not projecting from the projecting portion (including the first surface 11a of the compound semiconductor substrate 11), whereby the first light reflection layer 41 can be protected.

Figure 8:
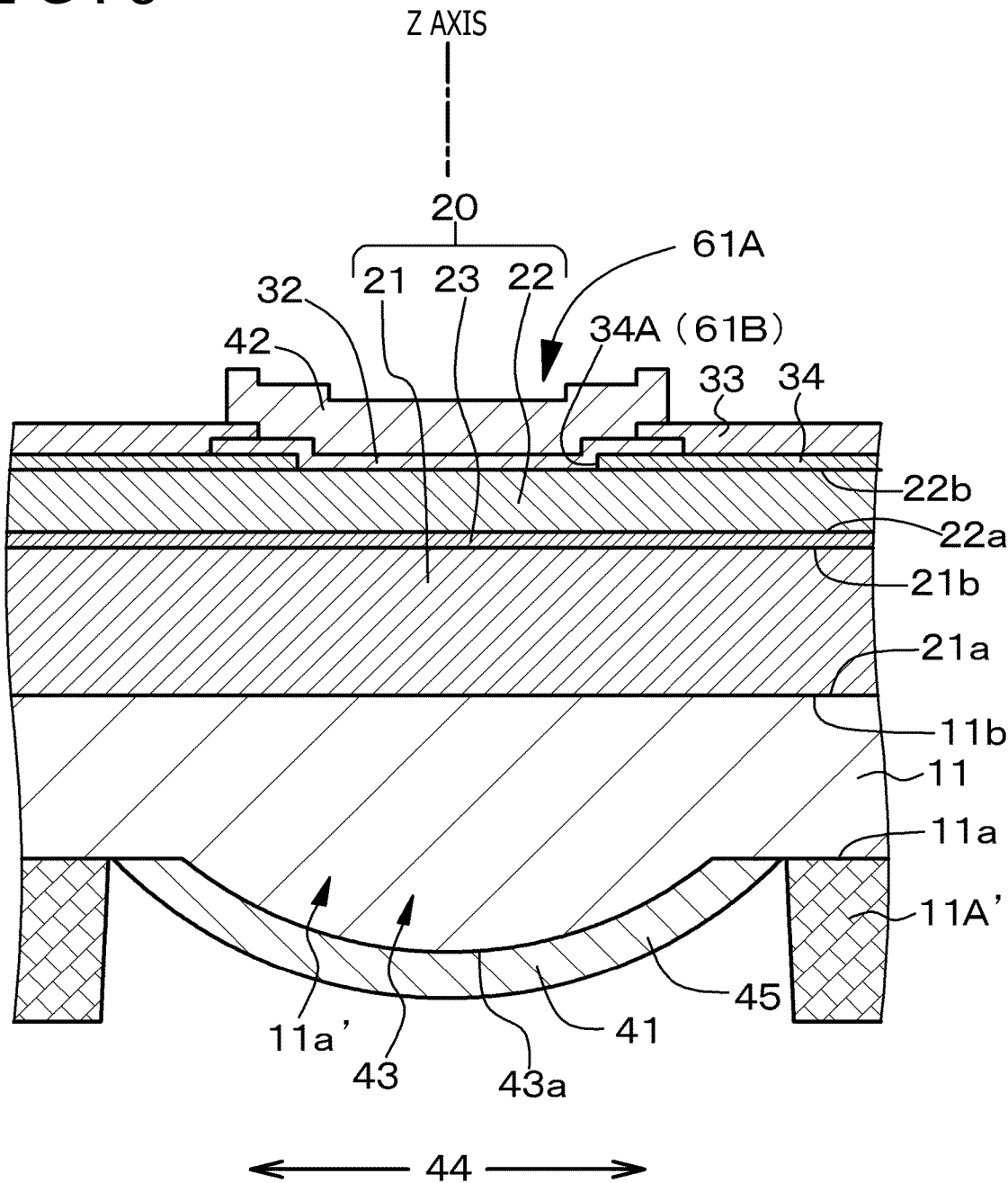
FIG. 8 is a schematic partial end view of another modification of the light emitting element of Example 1.

Alternatively, after the multilayer light reflection film 45 is formed over at least part of the concave mirror section 43, to obtain the first light reflection layer 41, in the above-mentioned (Step-150), a projection-shaped portion 11A' surrounding the first light reflection layer 41 may be formed over the first surface 11a of the compound semiconductor substrate 11 (see FIG. 8). The projection-shaped portion 11A' is only required to include, for example, an insulating material or a metallic material. Thus, the projection-shaped portion 11A' is formed in the periphery of the first light reflection layer 41, and the first light reflection layer 41 is not projecting from the projection-shaped portion 11A', whereby the first light reflection layer 41 can be protected.

Figure 9:
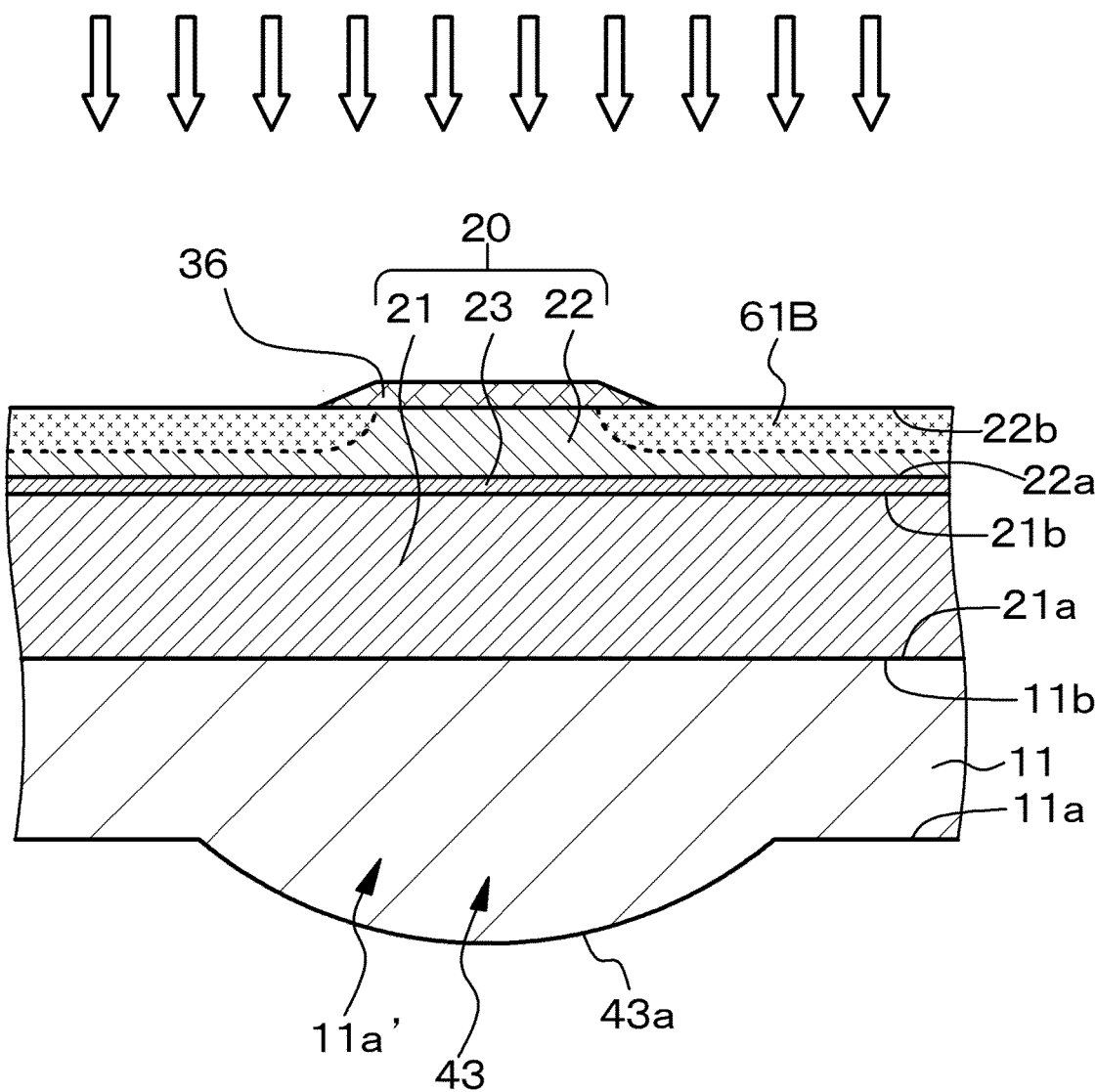
FIG. 9 is a schematic partial end view of a further modification of the light emitting element of Example 1, in the manufacturing process.

The light field narrowed by the first light reflection layer 41 formed over the concave mirror section 43 is the most intense in the center of the current injection region 61A, and is weakened in going closer to the periphery. As depicted in FIG. 9, when the sectional shape of the treatment mask layer 36 is tapered according to the light field by controlling exposure conditions, for example, in the case of forming the current non-injection region 61B by ion implantation, the concentration profile of the ions implanted tends to be reverse to the sectional shape of the treatment mask layer 36.

Specifically, the concentration of the ions implanted is low in the second compound semiconductor layer 22 located on the lower side of a central portion of the treatment mask layer 36, and the concentration of the ions implanted is high in the second compound semiconductor layer 22 located on the lower side of a peripheral portion of the treatment mask layer 36. As a result, the current injection amount can be made to be large in the region where the light field is intense and to be small in the region where the light field is weak, and, accordingly, gain can be collected in the region where the light field is intense and the gain can be weakened in the region where the light field is weak. Therefore, hole burning can be restrained, lateral mode is stabilized, and kinking is hardly generated. In addition, since many carriers can be securely injected into the region where the light field is intense, injection efficiency is enhanced, and threshold can be lowered.

Example 2

Figure 12:
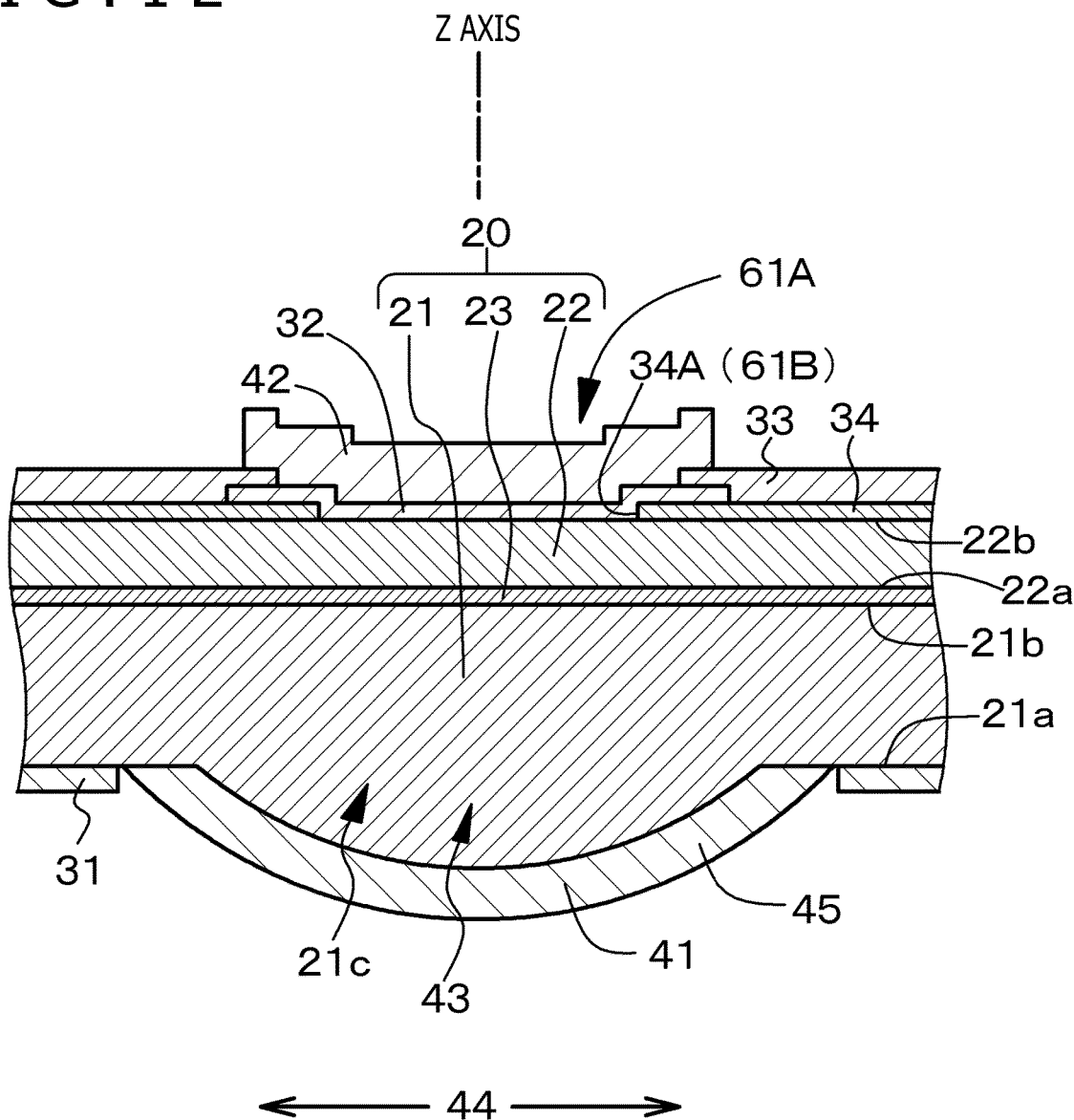
FIG. 12 is a schematic partial end view of the light emitting element of Example 2.

Example 2 is a modification of Example 1, and relates to a light emitting element of the fourth configuration. In the light emitting element of Example 2 of which a schematic partial end view is depicted in FIG. 12, a first surface 21a of a first compound semiconductor layer 21 is formed with a first light reflection layer 41.

In manufacture of such a light emitting element of Example 2, the first surface 21a of the first compound semiconductor layer 21 is formed with the concave mirror section 43. Specifically, (step-100) of Example 1 is omitted, steps similar to (step-110) and (Step-120) are conducted, after which the second light reflection layer 42 is fixed to a support substrate 49 through a bonding layer 48 (see FIG. 10). Specifically, the second light reflection layer 42 is fixed to the support substrate 49, which includes a sapphire substrate, by use of the bonding layer 48 including an adhesive. Next, the compound semiconductor substrate 11 is removed based on a mechanical polishing method or a CMP method, to expose the first surface 21a of the first compound semiconductor layer 21 (see FIG. 11). A value of surface roughness Ra of the first surface 21a of the first compound semiconductor layer 21 is preferably equal to or less than 10 nm. The surface roughness Ra is defined by JIS B-610:2001, and, specifically, it can be measured based on observation based on AFM or sectional TEM. Then, the first surface 21a of the first compound semiconductor layer 21 is formed with the concave mirror section 43 including a projecting portion 21c. Specifically, a patterned resist layer is formed over the first surface 21a of the first compound semiconductor layer 21 where to form the concave mirror section 43, and the resist layer is heated to cause reflow of the resist layer, thereby obtaining a resist pattern. A shape which is the same as (or similar to) the shape of the projecting portion 21c is imparted to the resist pattern. Then, the resist pattern and the first surface 21a of the first compound semiconductor layer 21 are etched back by use of a RIE method or the like, whereby the first surface 21a of the first compound semiconductor layer 21 can be formed with the concave mirror section 43 including the projecting portion 21c. Thereafter, the bonding layer 48 and the support substrate 49 are removed, and steps similar to (Step-130) and succeeding steps of Example 1 are only required to be carried out. In this way, the light emitting element of Example 2 of a sixth configuration depicted in FIG. 12 can be obtained.

Alternatively, the method of manufacturing the light emitting element of Example 2 can be applied to manufacture of the light emitting element described in Example 1. Specifically, in a modification of the method of manufacturing the light emitting element of Example 1, the first surface 11a of the compound semiconductor substrate 11 is formed with the concave mirror section 43. Specifically, (step-100) of Example 1 is omitted, steps similar to (step-110) and (Step-120) are carried out, and thereafter the second light reflection layer 42 is fixed to the support substrate 49 through the bonding layer 48 (see FIG. 10). Specifically, the second light reflection layer 42 is fixed to the support substrate 49, which includes a sapphire substrate, by use of the bonding layer 48 including an adhesive. Next, the compound semiconductor substrate 11 is thinned based on a mechanical polishing method or a CMP method. Then, the first surface 11a of the compound semiconductor substrate 11 is formed with the concave mirror section 43 based on a method similar to (step-100) of Example 1. Thereafter, the bonding layer 48 and the support substrate 49 are removed, and steps similar to (Step-130) and succeeding steps of Example 1 are only required to be carried out. In this manner, the light emitting element of Example 1 depicted in FIG. 1 can be obtained.

Example 3

Figure 13:
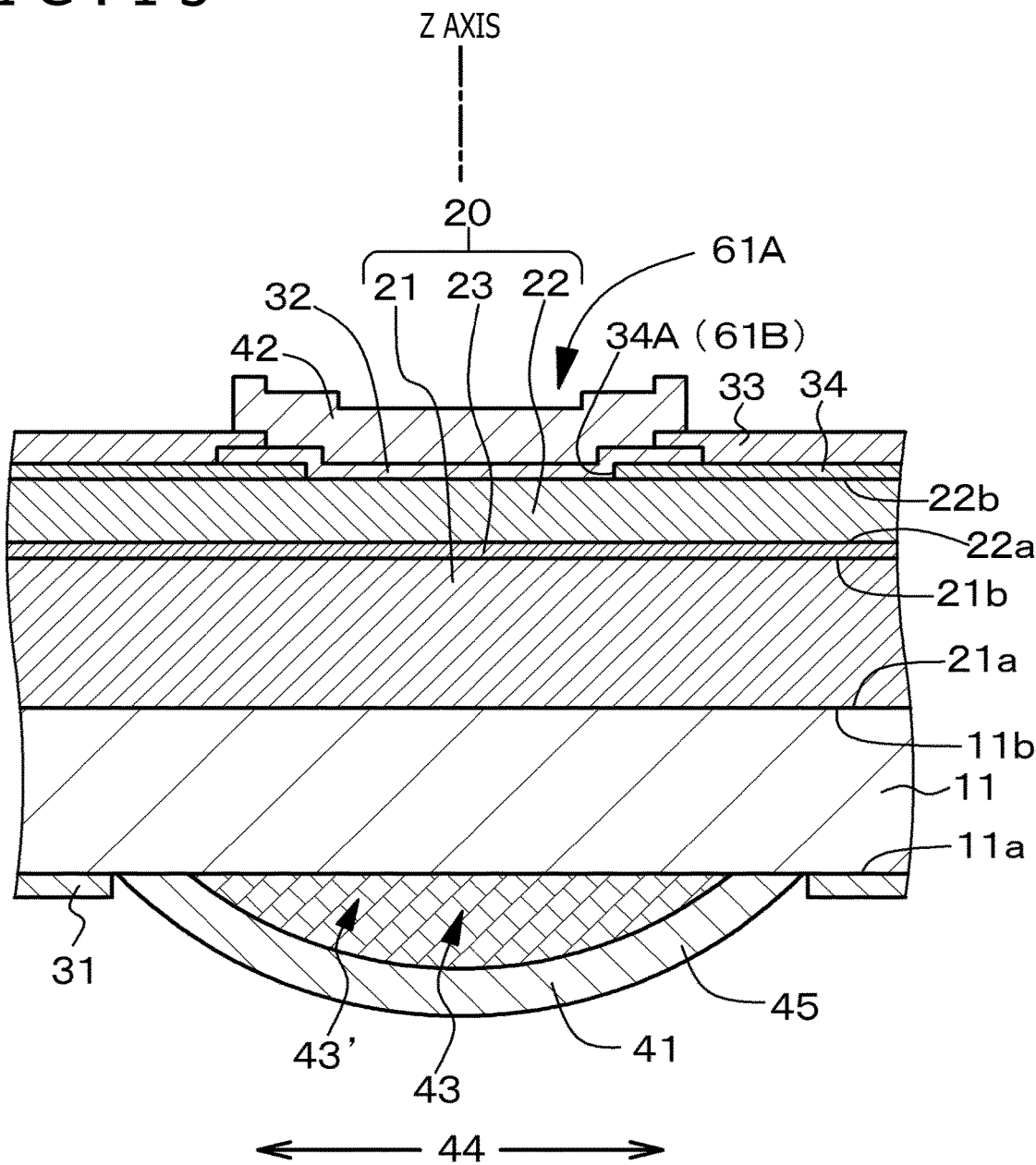
FIG. 13 is a schematic partial end view of a light emitting element of Example 3.

Example 3 is a modification of Example 1, and relates to a light emitting element of a 3-Bth configuration. In the light emitting element of Example 3 of which a schematic partial end view is depicted in FIG. 13, the concave mirror section 43 includes a projecting portion 43' formed over the compound semiconductor substrate 11 (specifically, over the first surface 11a of the compound semiconductor substrate 11), and the first light reflection layer 41 includes a multilayer light reflection film 45 formed over at least part of the concave mirror section 43 (specifically, the surface of the concave mirror section 43). Examples of the material constituting the concave mirror section 43 (the projecting portion 43') include transparent dielectric materials such as $TiO_2$, $Ta_2O_5$, and $SiO_2$, silicone resins, and epoxy resins.

In manufacture of the light emitting element of Example 3, the first surface 21a of the first compound semiconductor layer 21 is in contact with the second surface 11b of the substrate 11, the concave mirror section 43 is formed at the first surface 11a of the substrate 11 opposed to the second surface 11b of the substrate 11, and formation of the concave mirror section 43 includes forming the first surface 11a of the substrate 11 with a concave mirror section forming layer and thereafter forming the concave mirror section forming layer with the concave mirror section 43.

Specifically, in a step similar to (step-100) of Example 1, the concave mirror section 43 including the projecting portion 43' is formed over the first surface 11a of the compound semiconductor substrate 11. More specifically, a concave mirror section forming layer including, for example, $TiO_2$ or $Ta_2O_5$ is formed over the first surface 11a of the compound semiconductor substrate 11, next a patterned resist layer is formed over the concave mirror section forming layer where to form the concave mirror section 43, and the resist layer is heated to cause reflow of the resist layer, thereby obtaining a resist pattern. A shape which is the same as (or similar to) the shape of the projecting portion 43' is imparted to the resist pattern. Then, the resist pattern and the concave mirror section forming layer are etched back, whereby the concave mirror section 43 including the projecting portion 43' can be formed over the first surface 11a of the compound semiconductor substrate 11. Then, steps similar to (step-100) and succeeding steps of Example 1 are only required to be carried out. In this way, the light emitting element of Example 3 of the 3-Bth configuration depicted in FIG. 13 can be obtained.

Except for the above-mentioned points, the configuration and structure of the light emitting element of Example 3 can be similar to the configuration and structure of the light emitting element of Example 1, and, therefore, detailed description of them is omitted. Note that the modification of the light emitting element of Example 1 may be applied to Example 3.

Figure 10:
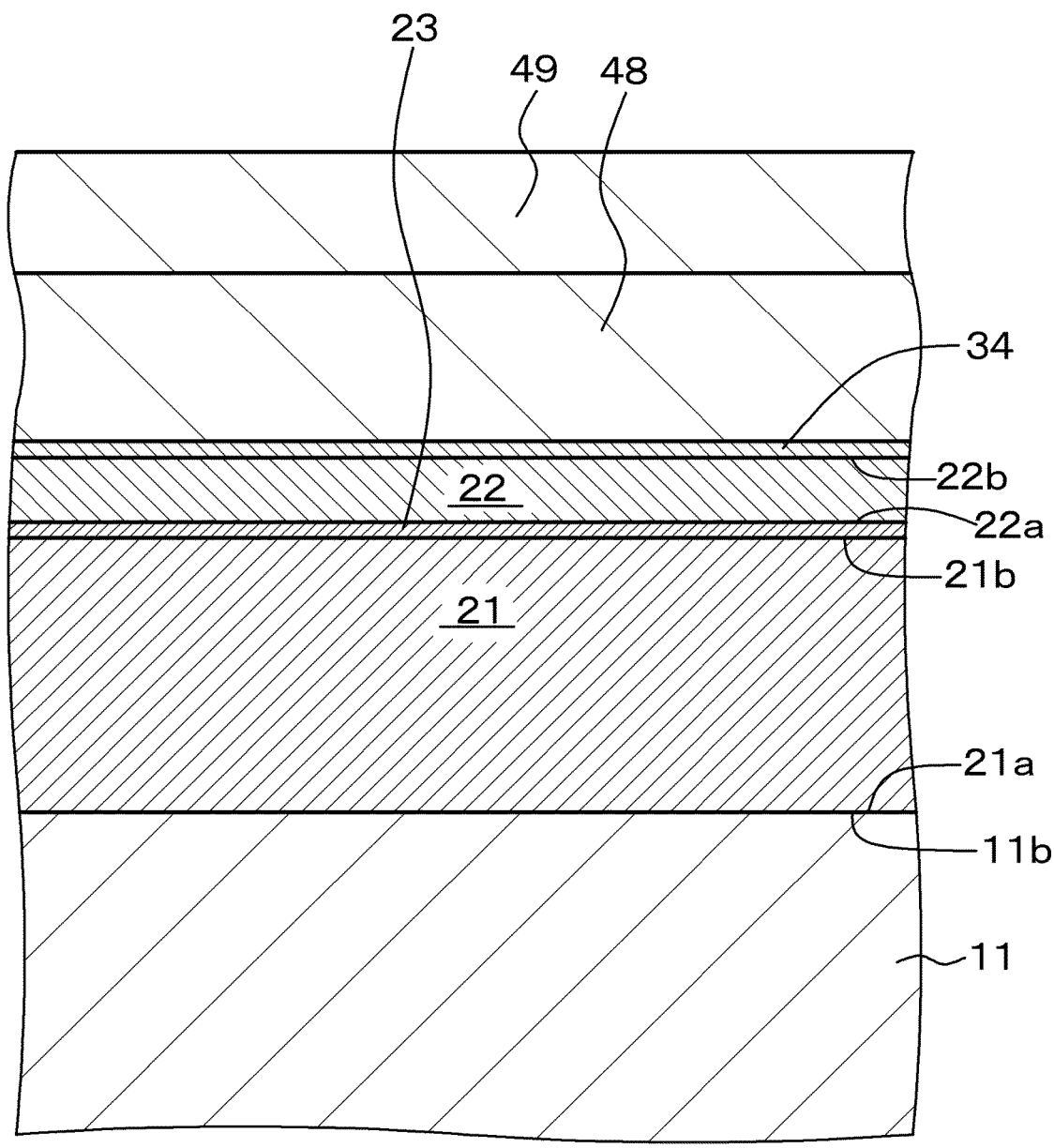
FIG. 10 is a schematic partial end view of a stacked structure and the like for illustrating a method of manufacturing a light emitting element of Example 2.
Figure 11:
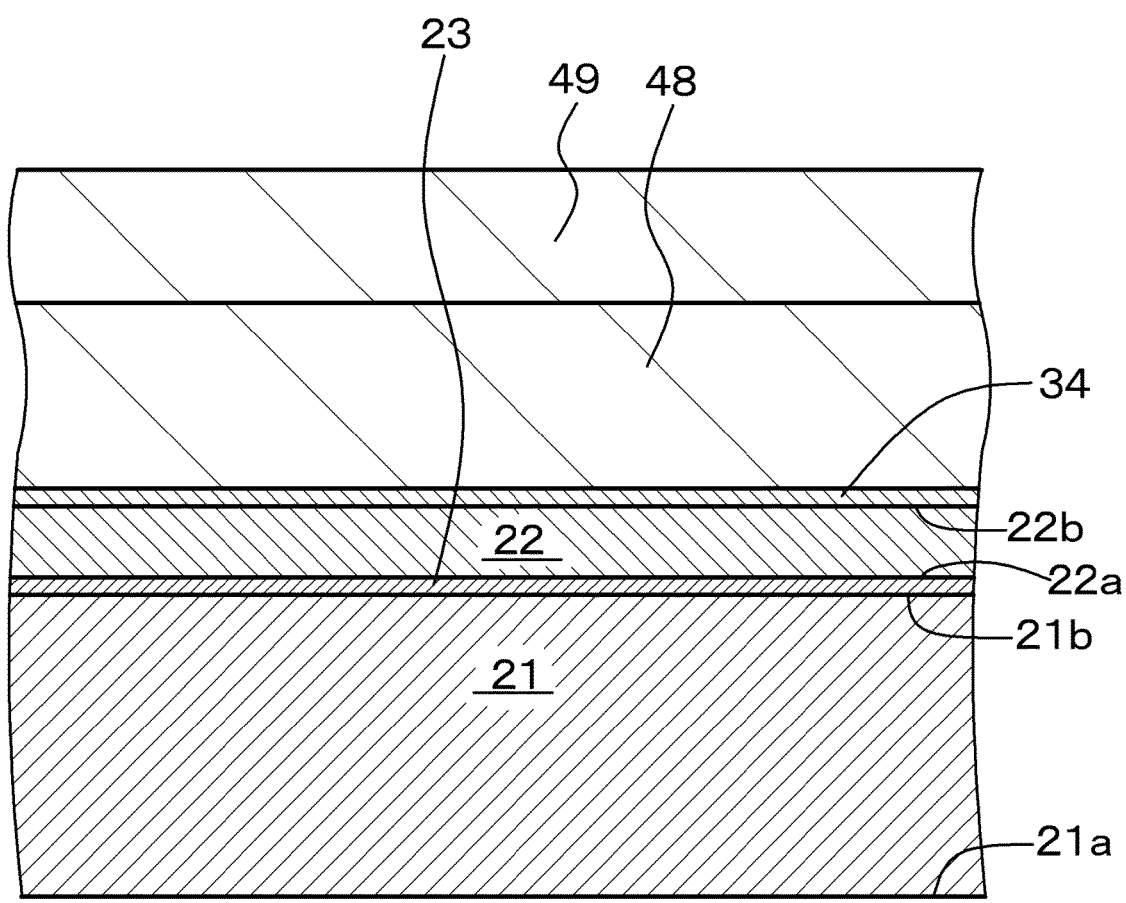
FIG. 11 is a schematic partial end view of the stacked structure and the like for illustrating the method of manufacturing the light emitting element of Example 2, subsequent to FIG. 10.

Alternatively, (step-100) is omitted, steps similar to (step-110) and (Step-120) are carried out, and thereafter the second light reflection layer 42 is fixed to the support substrate 49 through the bonding layer 48 (see FIG. 10). Specifically, the second light reflection layer 42 is fixed to the support substrate 49, which includes a sapphire substrate, by use of the bonding layer 48 including an adhesive. Next, the compound semiconductor substrate 11 is removed based on a mechanical polishing method or a CMP method, to expose the first surface 21a of the first compound semiconductor layer 21 (see FIG. 11). The value of surface roughness Ra of the first surface 21a of the first compound semiconductor layer 21 is preferably equal to or less than 10 nm. The surface roughness Ra is defined by JIS B-610:2001, and can specifically be measured based on observation based on AFM or sectional TEM. Then, the first surface 21a of the first compound semiconductor layer 21 is formed with the concave mirror section 43 including the projecting portion 43'. Specifically, for example, a $TiO_2$ layer or a $Ta_2O_5$ layer is formed over the first surface 21a of the first compound semiconductor layer 21, next a patterned resist layer is formed over the $TiO_2$ layer or $Ta_2O_5$ layer where to form the concave mirror section 43, and the resist layer is heated to cause reflow of the resist layer, thereby obtaining a resist pattern. A shape which is the same as (or similar to) the shape of the projecting portion 43' is imparted to the resist pattern. Then, the resist pattern and the $TiO_2$ layer or $Ta_2O_5$ layer are etched back, whereby the concave mirror section 43 including the projecting portion 43' can be formed over the first surface 21a of the first compound semiconductor layer 21. Then, steps similar to (Step-130) and succeeding steps of Example 1 are only required to be carried out. In this way, the modification of the light emitting element of Example 3 of the sixth configuration depicted in FIG. 14 can be obtained.

Example 4

Example 4 is a modification of Example 3. A schematic partial end view of a light emitting element of Example 4 is substantially similar to FIG. 14, and the configuration and structure of the light emitting element of Example 4 can be similar to the configuration and structure of the light emitting element of Example 3, and, therefore, detailed description thereof is omitted.

Figure 15A:
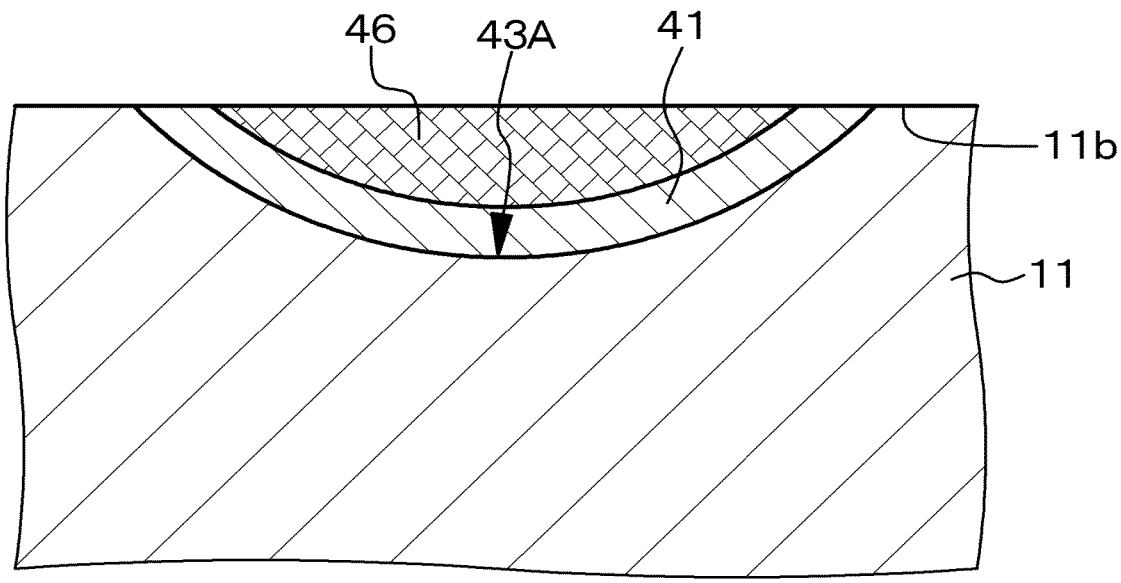
FIGS. 15A and 15B are schematic partial end views of a stacked structure and the like for illustrating a method of manufacturing a light emitting element of Example 4.

In Example 4, first, a second surface 11b of a light emitting element manufacturing substrate 11 is formed with a concave portion 43A for forming the concave mirror section 43. Then, a first light reflection layer 41 including a multilayer film is formed over the second surface 11b of the light emitting element manufacturing substrate 11, after which a planarization film 46 is formed over the first light reflection layer 41, the planarization film 46 and the first light reflection layer 41 are subjected to a planarizing treatment, and part of the second surface 11b of the light emitting element manufacturing substrate 11 is exposed while leaving the planarization film 46 and the first light reflection layer 41 (see FIG. 15A). The plan-view shape of the first light reflection layer 41 is circular. It is to be noted, however, that the shape of the first light reflection layer 41 is not limited to this.

Figure 15B:
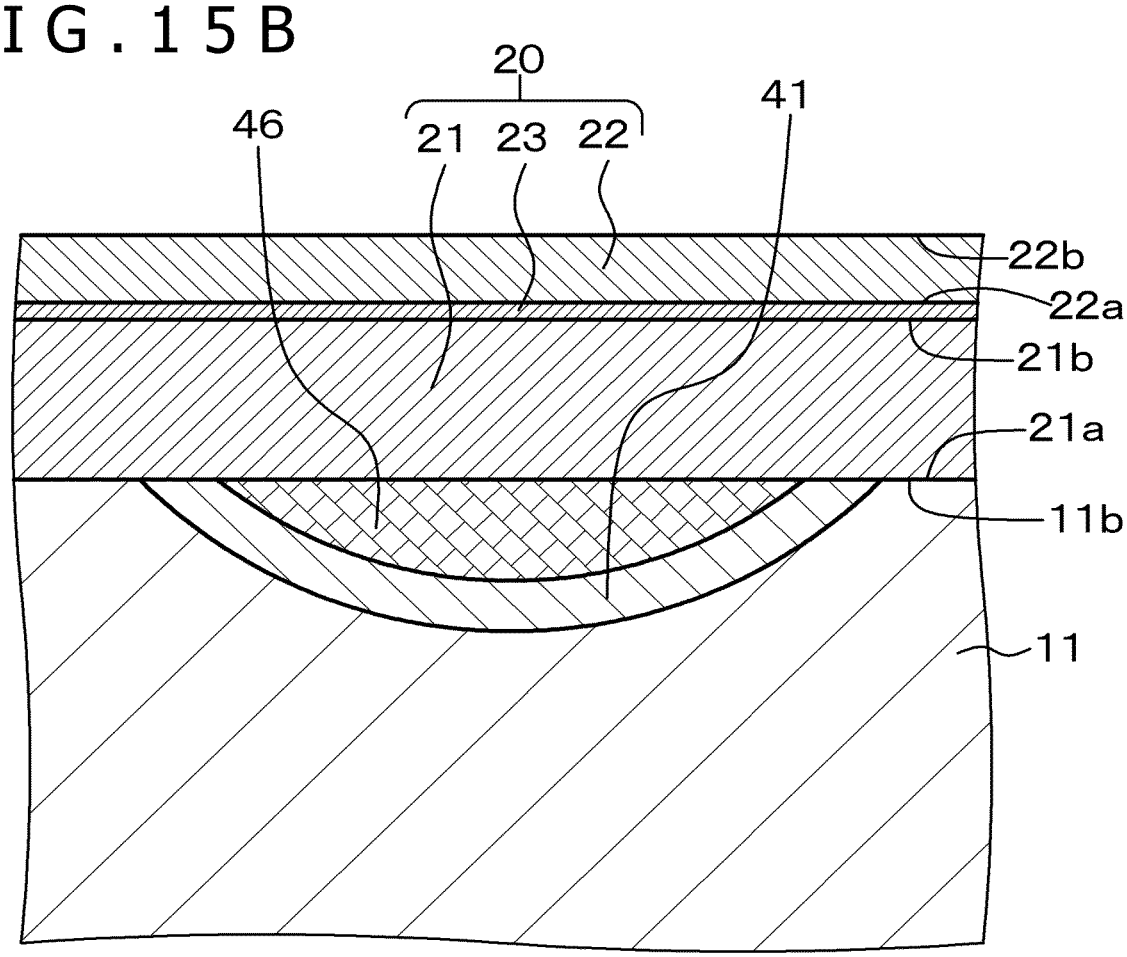

Next, over the light emitting element manufacturing substrate 11 including the first light reflection layer 41, a stacked structure 20 is formed based on transverse growth by use of a method for transverse epitaxial growth such as an ELO method (see FIG. 15B). Thereafter, (Step-120) to (Step-140) of Example 1 are carried out. Then, the light emitting element manufacturing substrate 11 is removed, and the first surface 21a of the first compound semiconductor layer 21 exposed is formed with a first electrode 31. Alternatively, without removing the light emitting element manufacturing substrate 11, the first surface 11a of the light emitting element manufacturing substrate 11 is formed with the first electrode 31. Thereafter, so-called element separation is conducted to separate the light emitting element, and side surfaces and the exposed surface of the stacked structure are coated with an insulating layer including $SiO_2$, for example. Then, packaging or sealing is conducted, whereby the light emitting element of Example 4 can be completed.

Example 5

Example 5 relates to the light emitting element according to the second mode of the present disclosure, and is a modification of Examples 1 to 4. Specifically, in the light emitting element of Example 5, the first light reflection layer 41 is provided with a light-transmitting section 41A and a light-shielding section 41B surrounding the light-transmitting section 41A. In the light emitting element of Example 5, the shape of an outer edge of a current injection region 61A and the shape of an outer edge of the light-transmitting section 41A are preferably analogous to each other, and the shape of an outer edge of the concave mirror section 43 and the shape of an outer edge of the light-transmitting section 41A are preferably analogous to each other. The light-shielding section 41B includes a stacked body of Ti/Pt/Au, for example.

In the light emitting element of Example 5, the first light reflection layer is provided with the light-transmitting section, and examples of the specific position of the light-shielding section include the aforementioned various positions. In addition, a method of manufacturing the light emitting element of Example 5 further includes a step of forming the light-shielding section over part of the concave mirror section or over an area ranging from the upper side of part of the concave mirror section to an outside region thereof.

Figure 14:
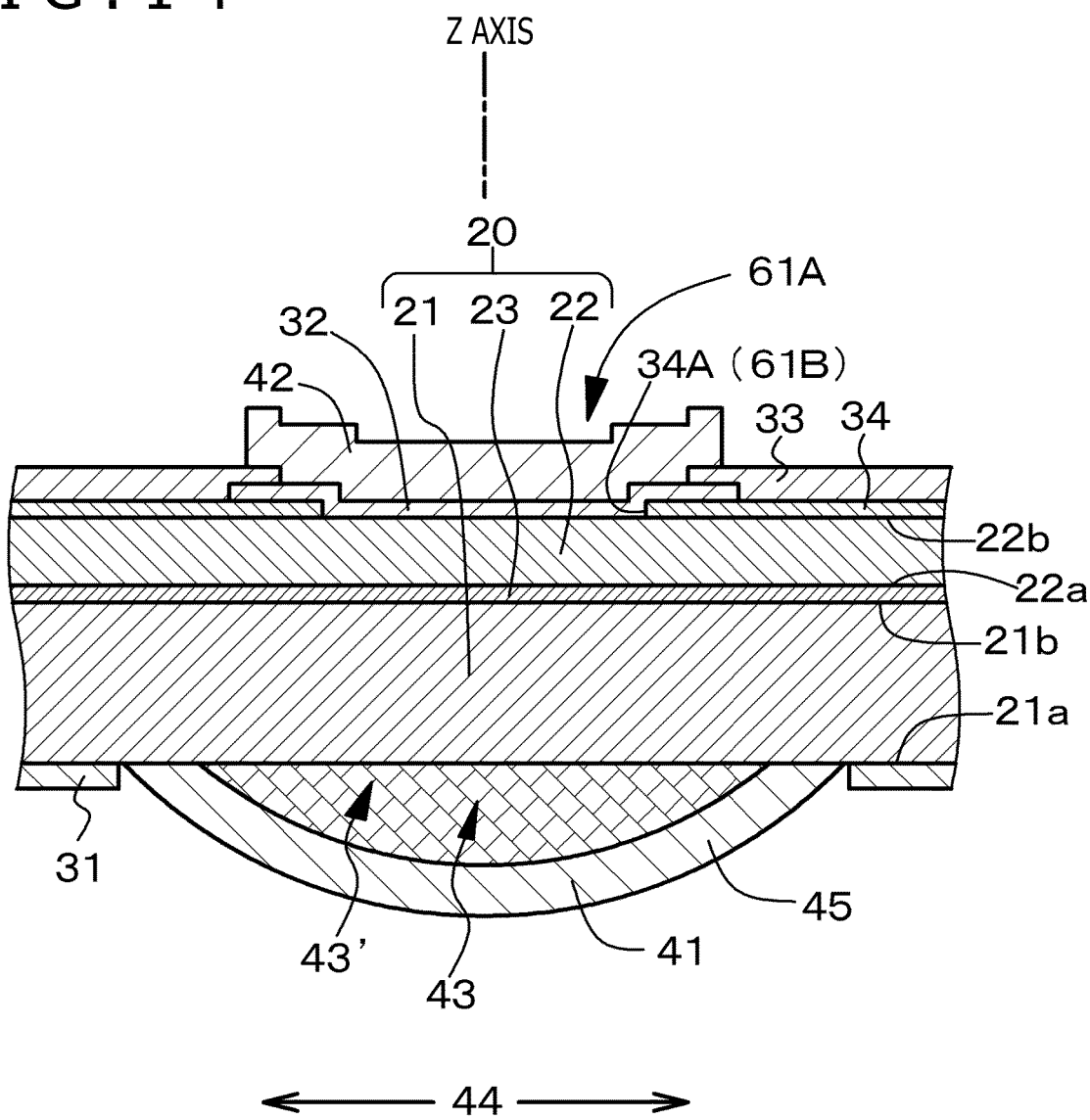
FIG. 14 is a schematic partial end view of a modification of the light emitting element of Example 3.
Figure 22:
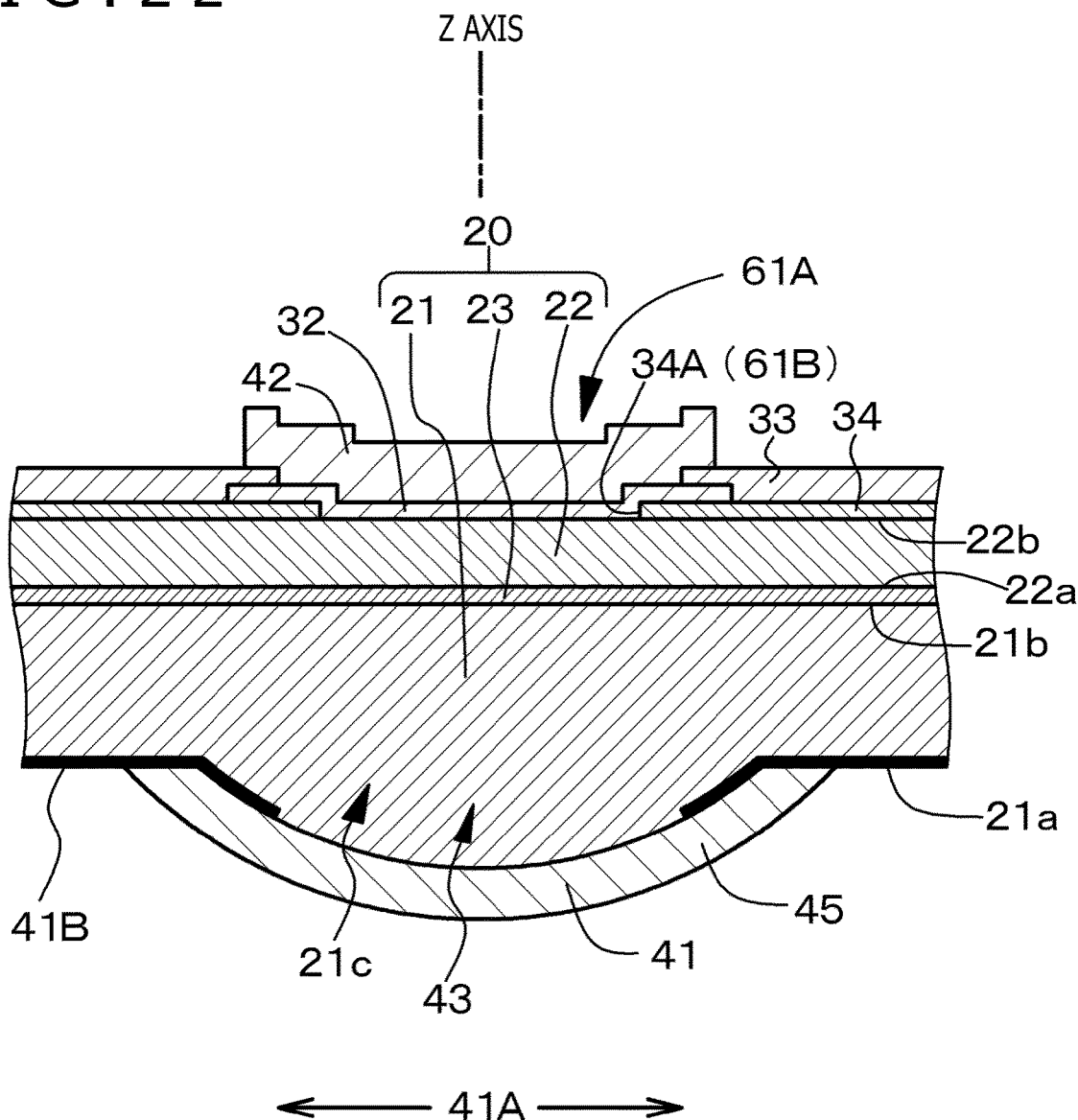
FIG. 22 is a schematic partial end view of a modification of the light emitting element of Example 5.
Figure 23:
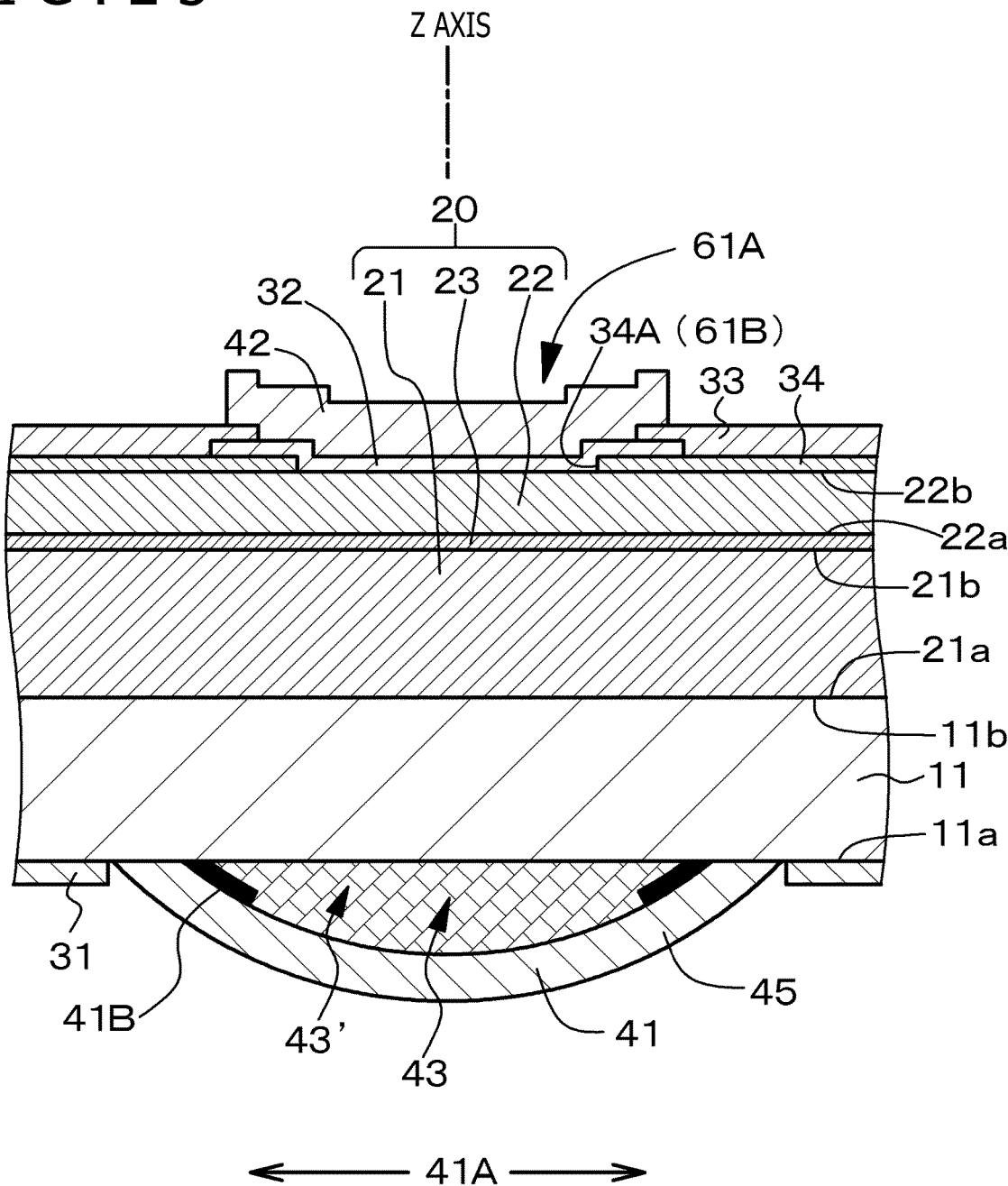
FIG. 23 is a schematic partial end view of a modification of the light emitting element of Example 5.
Figure 24:
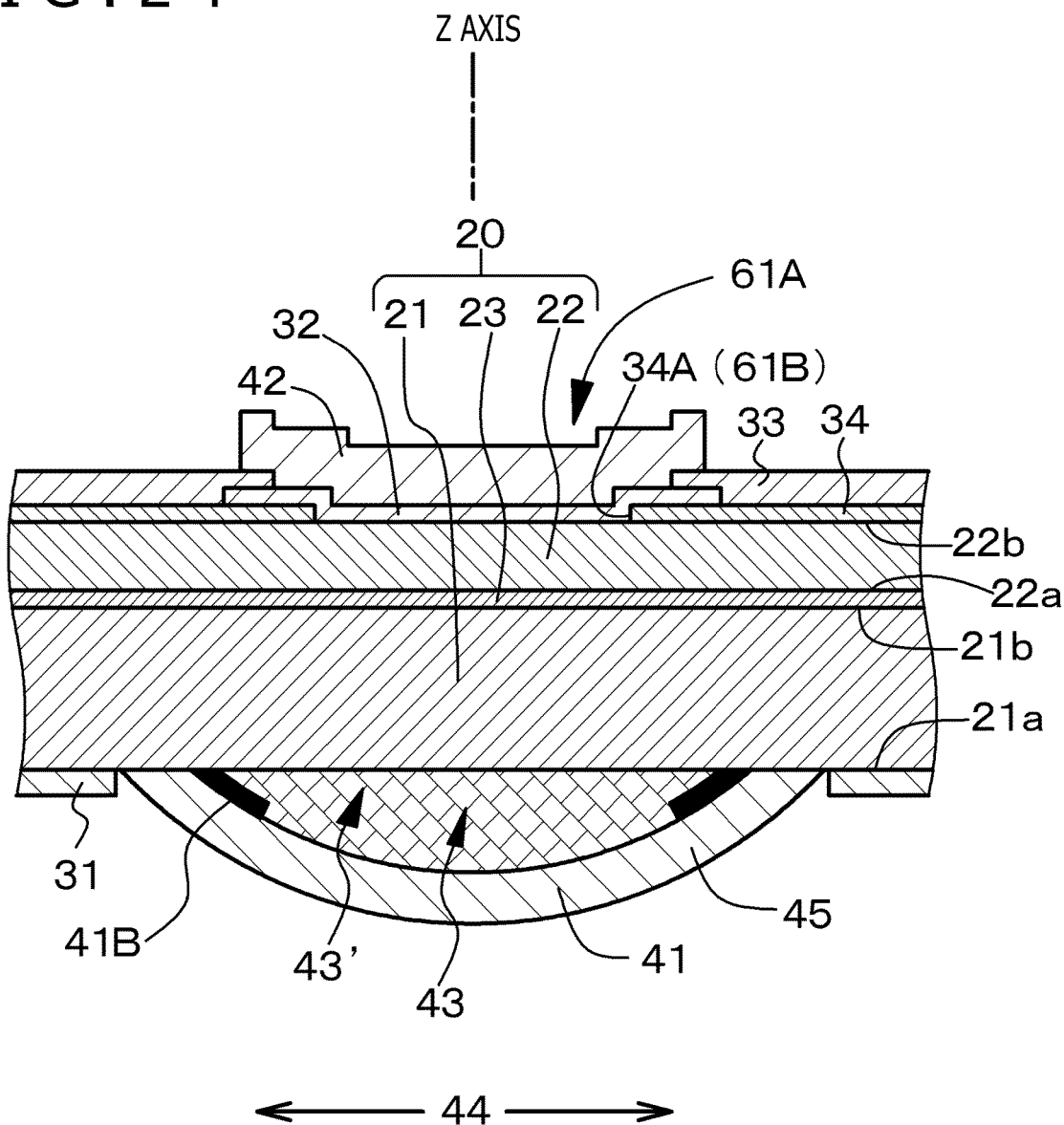
FIG. 24 is a schematic partial end view of a modification of the light emitting element of Example 5.

Examples of applying the light-shielding section in Example 5 to the light emitting element of Example 1 depicted in FIG. 1 are illustrated in FIGS. 16, 17, 18, 19, 20, and 21. In addition, an example of applying the light-shielding section in Example 5 to the light emitting element of Example 2 depicted in FIG. 12 is illustrated in FIG. 22, an example of applying the light-shielding section in Example 5 to the light emitting element of Example 3 depicted in FIG. 13 is illustrated in FIG. 23, and an example of applying the light-shielding section in Example 5 to the modification of the light emitting element of Example 3 depicted in FIG. 14 is illustrated in FIG. 24.

Figure 16:
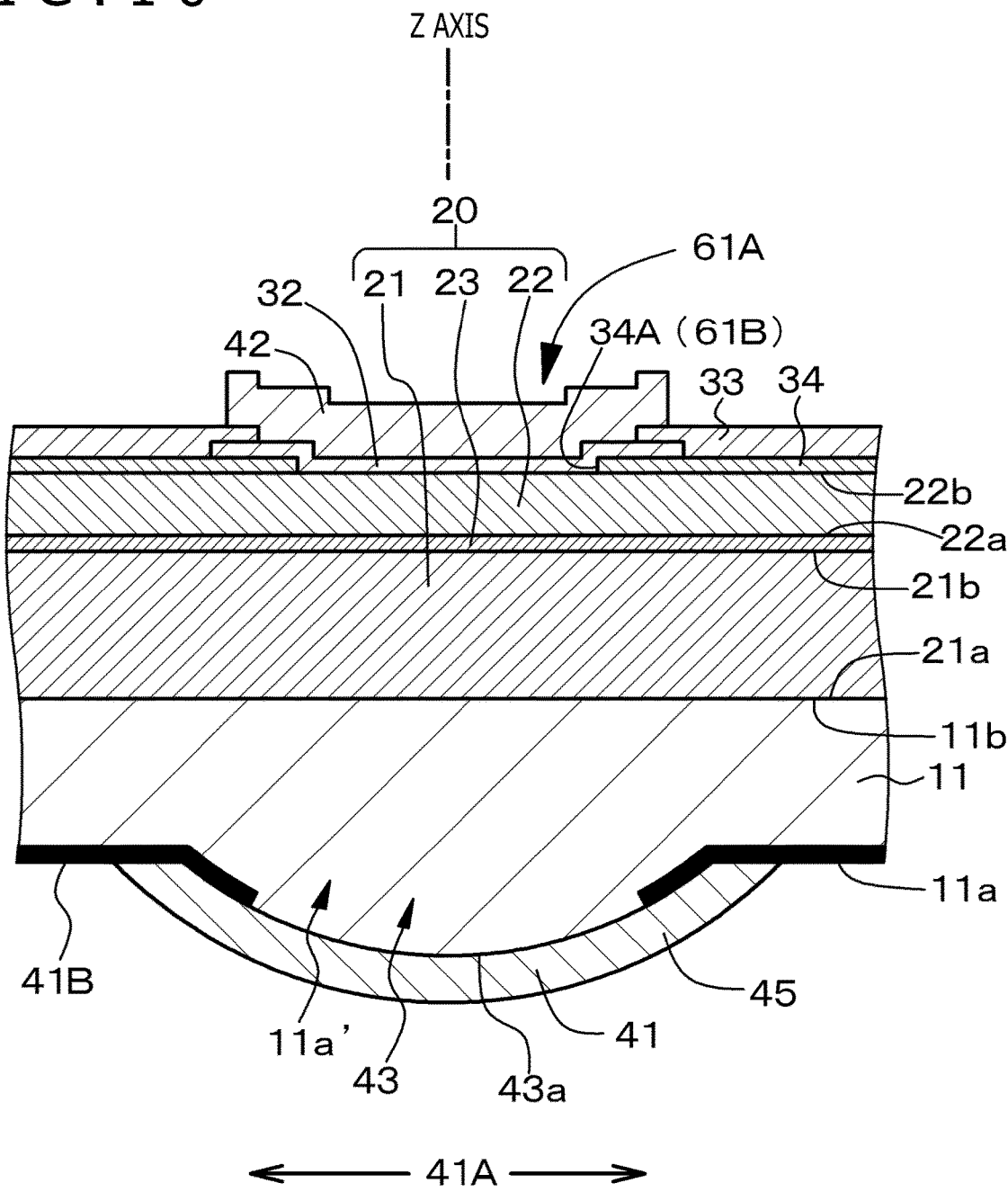
FIG. 16 is a schematic partial end view of a light emitting element of Example 5.
Figure 17:
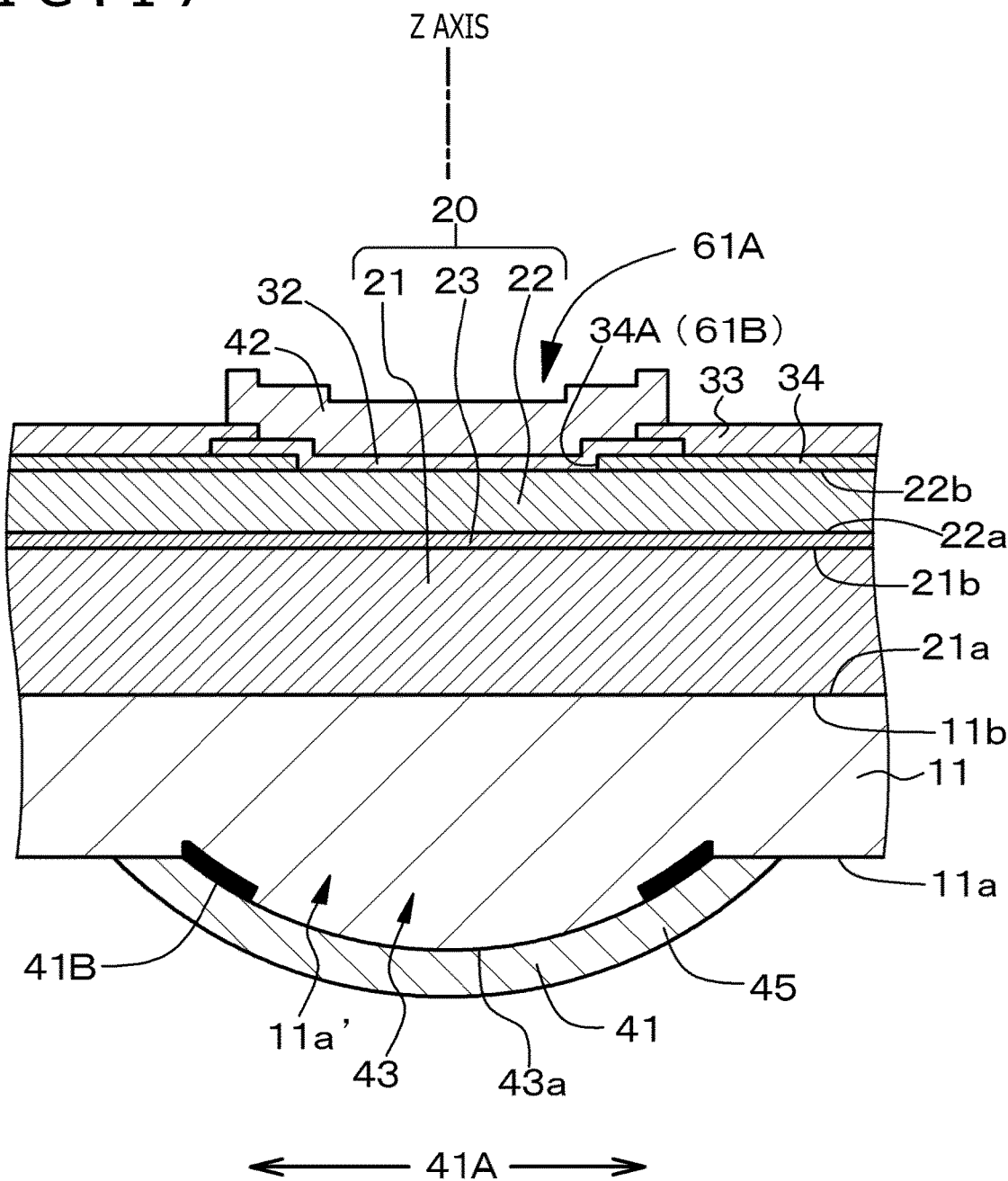
FIG. 17 is a schematic partial end view of a modification of the light emitting element of Example 5.
Figure 18:
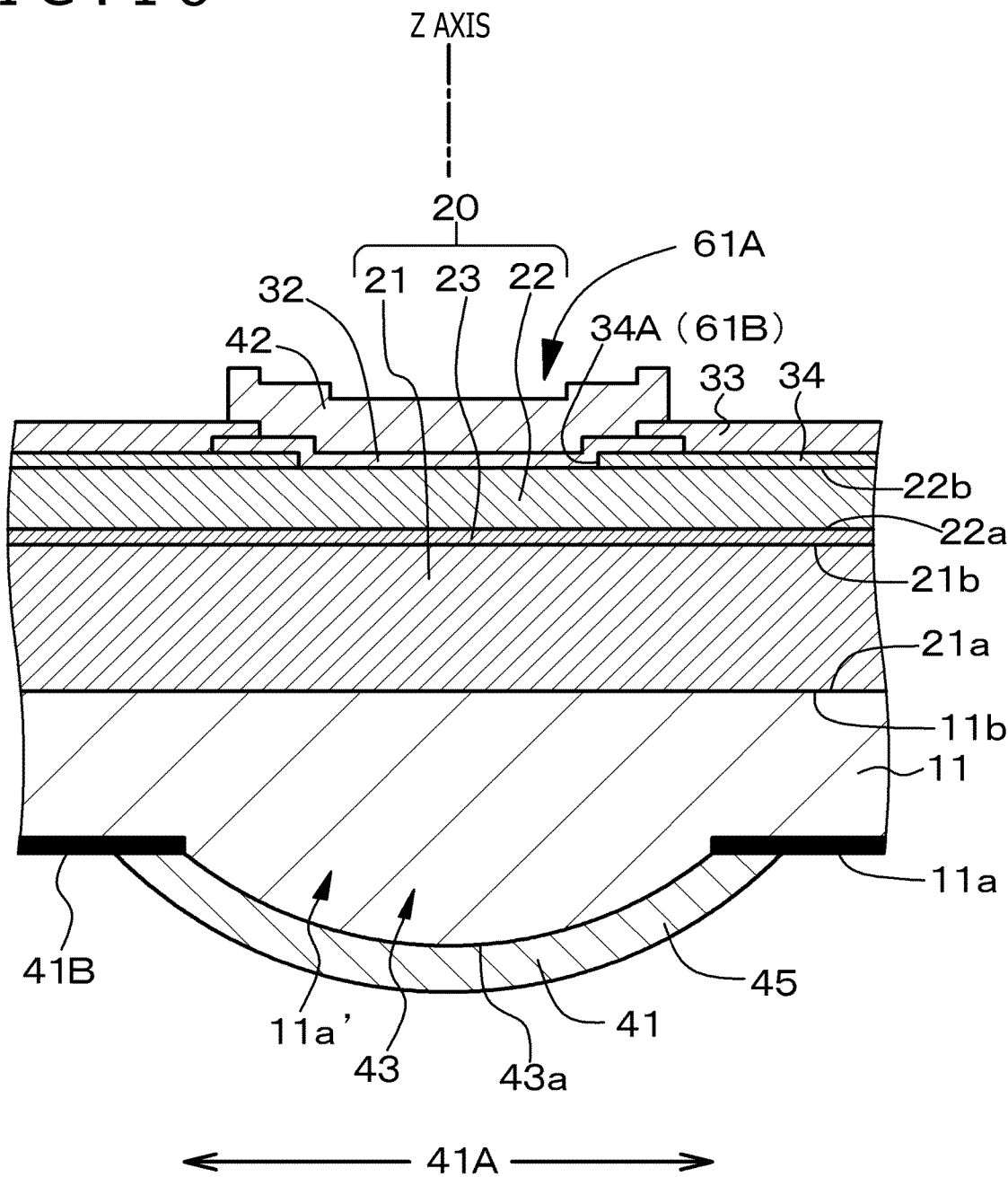
FIG. 18 is a schematic partial end view of a modification of the light emitting element of Example 5.
Figure 19:
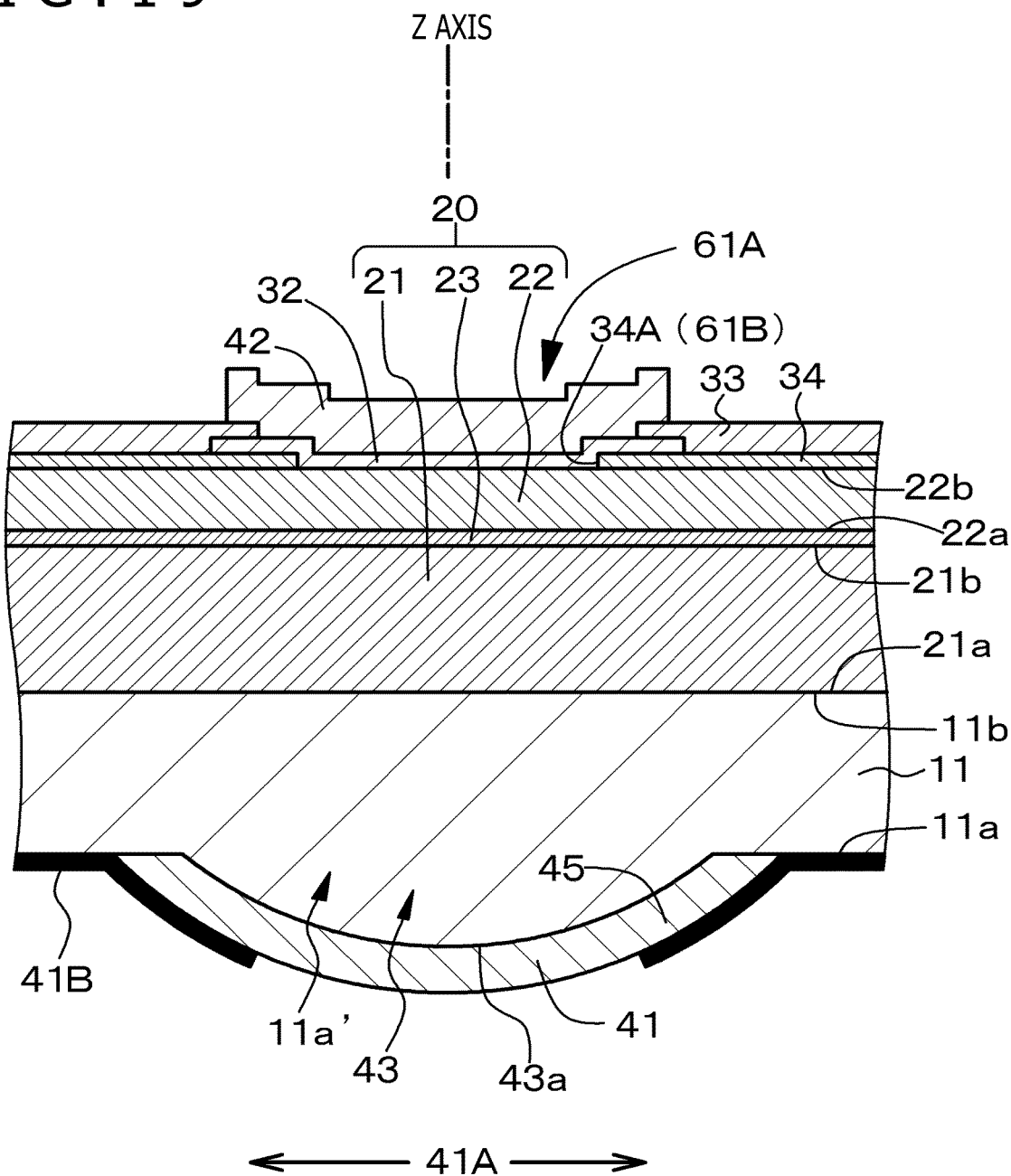
FIG. 19 is a schematic partial end view of a modification of the light emitting element of Example 5.
Figure 20:
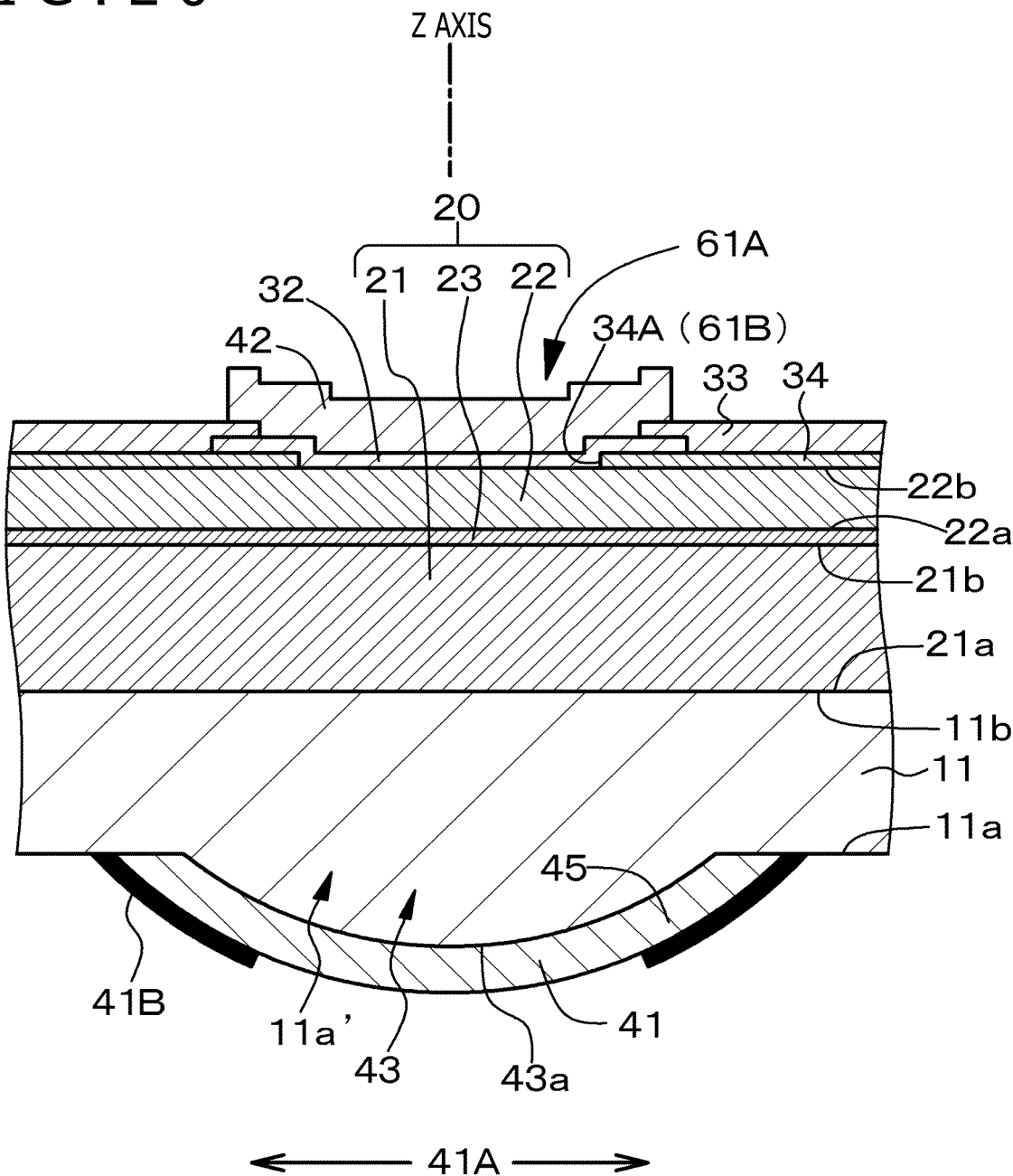
FIG. 20 is a schematic partial end view of a modification of the light emitting element of Example 5.
Figure 21:
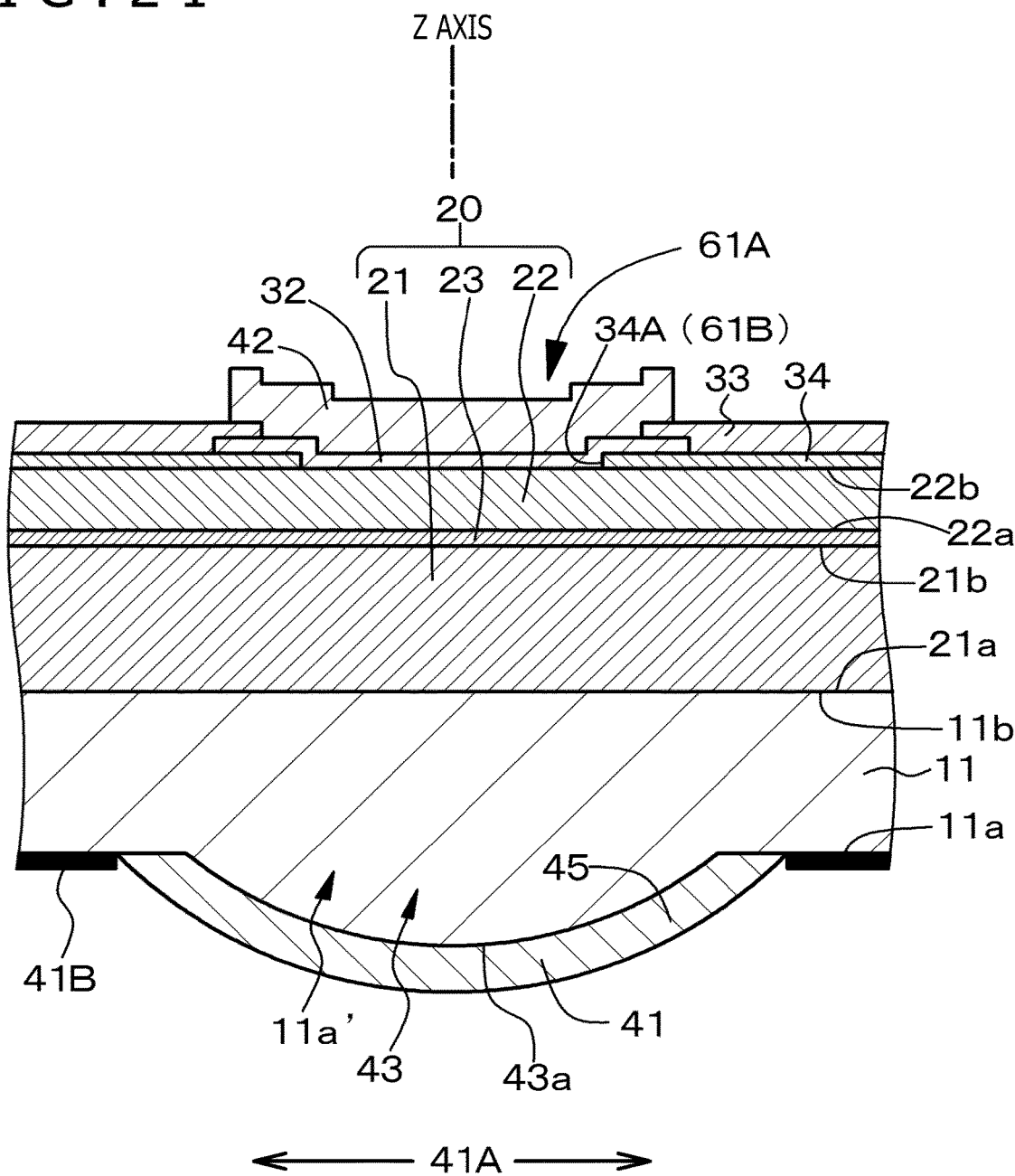
FIG. 21 is a schematic partial end view of a modification of the light emitting element of Example 5.

In the example depicted in FIG. 16, the light-shielding section 41B is formed over the first surface 11a of the substrate 11 and part of the concave mirror section 43. In the example illustrated in FIG. 17, the light-shielding section 41B is formed over part of the concave mirror section 43. In the example depicted in FIG. 18, the light-shielding section 41B is formed over part of the first surface 11a of the substrate 11. In the example illustrated in FIG. 19, the light-shielding section is formed over the first surface 11a of the substrate 11 and part of the first light reflection layer 41. In the example depicted in FIG. 20, the light-shielding section is formed over part of the first light reflection layer 41. In the example illustrated in FIG. 21, the light-shielding section 41B is formed over part of the first surface 11a of the substrate 11. Note that the light-shielding sections depicted in FIGS. 17 to 21 can be applied, as required, to other Examples. In the example illustrated in FIG. 22, the light-shielding section 41B is formed over the first surface 21a of the first compound semiconductor layer 21 and part of the concave mirror section 43. In the examples depicted in FIGS. 23 and 24, the light-shielding section 41B is formed over part of the concave mirror section 43.

Example 6

Example 6 is a modification of Examples 1 to 5, and relates to the light emitting element of the first configuration. As aforementioned, the current injection region 61A and the current non-injection region 61B (current constriction region) are defined by the insulating film 34 having the opening 34A. In other words, the current injection region 61A is defined by the opening 34A. Specifically, in the light emitting element of Example 6, the second compound semiconductor layer 22 is provided with the current injection region 61A and the current non-injection region 61B surrounding the current injection region 61A, and the shortest distance $D_{CI}$ from the area center-of-gravity point of the current injection region 61A to a boundary 61C between the current injection region 61A and the current non-injection region 61B satisfies the aforementioned expressions (A) and (B).

In the light emitting element of Example 6, the radius $r'_{DBR}$ of the effective region in the concave mirror section 43 of the first light reflection layer 41 satisfies $$\omega_0 \leq r'_{DBR} \leq 20 \cdot \omega_0.$$

In addition, $D_{CI} \geq \omega_0$ is satisfied. Further, $R_{DBR} \leq 1 \times 10^{-3}$ m is satisfied. As specific exemplary values, $$D_{CI} = 4 \text{ μm}$$

$$\omega_0 = 1.5 \text{ μm}$$

$$L_{OR} = 50 \text{ μm}$$

$$R_{DBR} = 60 \text{ μm}$$

$$\lambda_0 = 525 \text{ nm}$$

may be mentioned. In addition, as a diameter of the opening 34A, 8 μm may be mentioned. As a GaN substrate, a substrate in which a plane obtained by inclining a c-plane by approximately 75 degrees to an m-axis direction is a principal surface is used. In other words, the GaN substrate has a {20-21} plane which is a semipolar plane as a principal surface. Note that such a GaN substrate may be used in other Examples.

Misregistration between a center axis (Z axis) of the concave mirror section 43 and the current injection region 61A in an XY plane causes worsening of characteristics of the light emitting element. Both patterning for formation of the concave mirror section 43 and patterning for formation of the opening 34A are often conducted using a lithography technique, and, in this case, the positional relation between both of them often suffers misregistration in the XY plane according to the performance of an exposure machine. In Examples 1 to 5, generation of such misregistration is prevented. Even if such misregistration (misregistration between the center axis (Z axis) of the concave mirror section 43 and the current injection region 61A in the XY plane direction) is generated, in the light emitting element of Example 6, the opening 34A (current injection region 61A) is formed to be larger than the region where light is narrowed by the concave mirror section 43, whereby it is possible to realize a structure in which influence of the misregistration on oscillation characteristics is restrained more securely.

Specifically, in the case where the region where the light reflected by the first light reflection layer is focused is not included in the current injection region corresponding to the region in which the active layer has a gain by current injection, induced emission of light from carriers is hampered, which may lead to hindrance of laser oscillation. However, with the above expressions (A) and (B) satisfied, it is possible to ensure that the region where the light reflected by the first light reflection layer is focused is included in the current injection region, so that laser oscillation can be achieve securely.

Example 7

Example 7 is a modification of Examples 1 to 6, and relates to the light emitting element of the second configuration.

Incidentally, the resonator length $L_{OR}$ in the stacked structure including the two DBR layers and the stacked structure formed therebetween is represented by:

$$L = (m \cdot \lambda_0)/(2 \cdot n_{eq})$$

where $n_{eq}$ is the equivalent refractive index of the stacked structure as a whole, and $\lambda_0$ is the wavelength of laser light to be emitted from a surface emitting laser element (light emitting element). Here, m is a positive integer. In the surface emitting laser element (light emitting element), the wavelength at which oscillation is possible is determined by the resonator length $L_{OR}$. Individual oscillation modes in which oscillation is possible are called longitudinal modes. Of the longitudinal modes, that one which coincides with a gain spectrum determined by the active layer is the mode in which laser oscillation is possible. An interval $\Delta\lambda$ of the longitudinal modes is represented by $$\lambda_0^2/(2 n_{\text{eff}} \cdot L)$$

where $n_{\text{eff}}$ is the effective refractive index. In other words, as the resonator length $L_{OR}$ is longer, the interval $\Delta\lambda$ of the longitudinal modes is narrower. Therefore, in the case where the resonator length $L_{OR}$ is long, a plurality of longitudinal modes can exist in the gain spectrum, so that oscillation can be achieved in a plurality of longitudinal modes. Note that let the oscillation wavelength be $\lambda_0$, then there is the following relation between the equivalent refractive index $n_{eq}$ and the effective refractive index $n_{\text{eff}}$.

$$n_{\text{eff}} = n_{eq} - \lambda_0 \cdot (dn_{eq}/d\lambda_0)$$

Figure 32A:
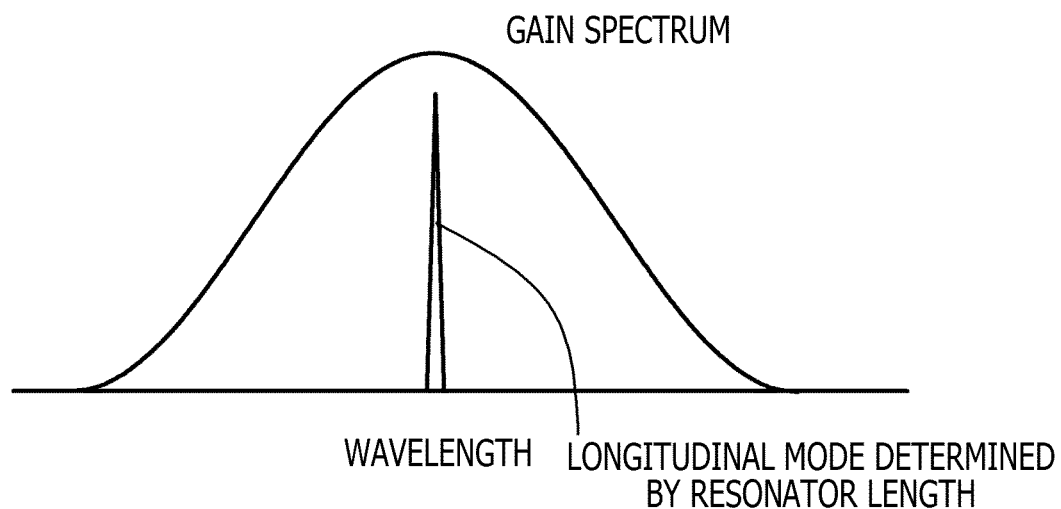
FIGS. 32A and 32B are conceptual diagrams schematically depicting a longitudinal mode or modes present in a gain spectrum determined by an active layer.
Figure 32B:
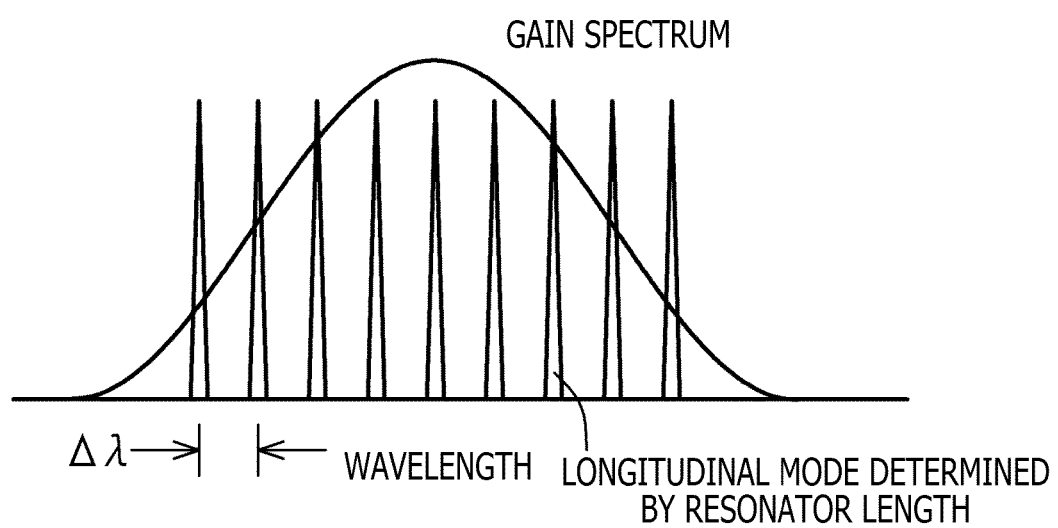

Here, in the case where the stacked structure includes a GaAs-based compound semiconductor layer, the resonator length $L_{OR}$ is normally as short as 1 μm or less, and the laser light in the longitudinal mode emitted from the surface emitting laser element is one kind (one wavelength) (see a conceptual diagram of FIG. 32A). Therefore, it is possible to accurately control the oscillation wavelength of the laser light in longitudinal mode emitted from the surface emitting laser element. On the other hand, in the case where the stacked structure includes a GaN-based compound semiconductor layer, the resonator length $L_{OR}$ is normally as long as several times the wavelength of the laser light emitted from the surface emitting laser element. Therefore, the laser light in longitudinal mode which can be emitted from the surface emitting laser element would be a plurality of kinds (see a conceptual diagram of FIG. 32B), and it is difficult to accurately control the oscillation wavelength of the laser light which can be emitted from the surface emitting laser element.

Figure 25:
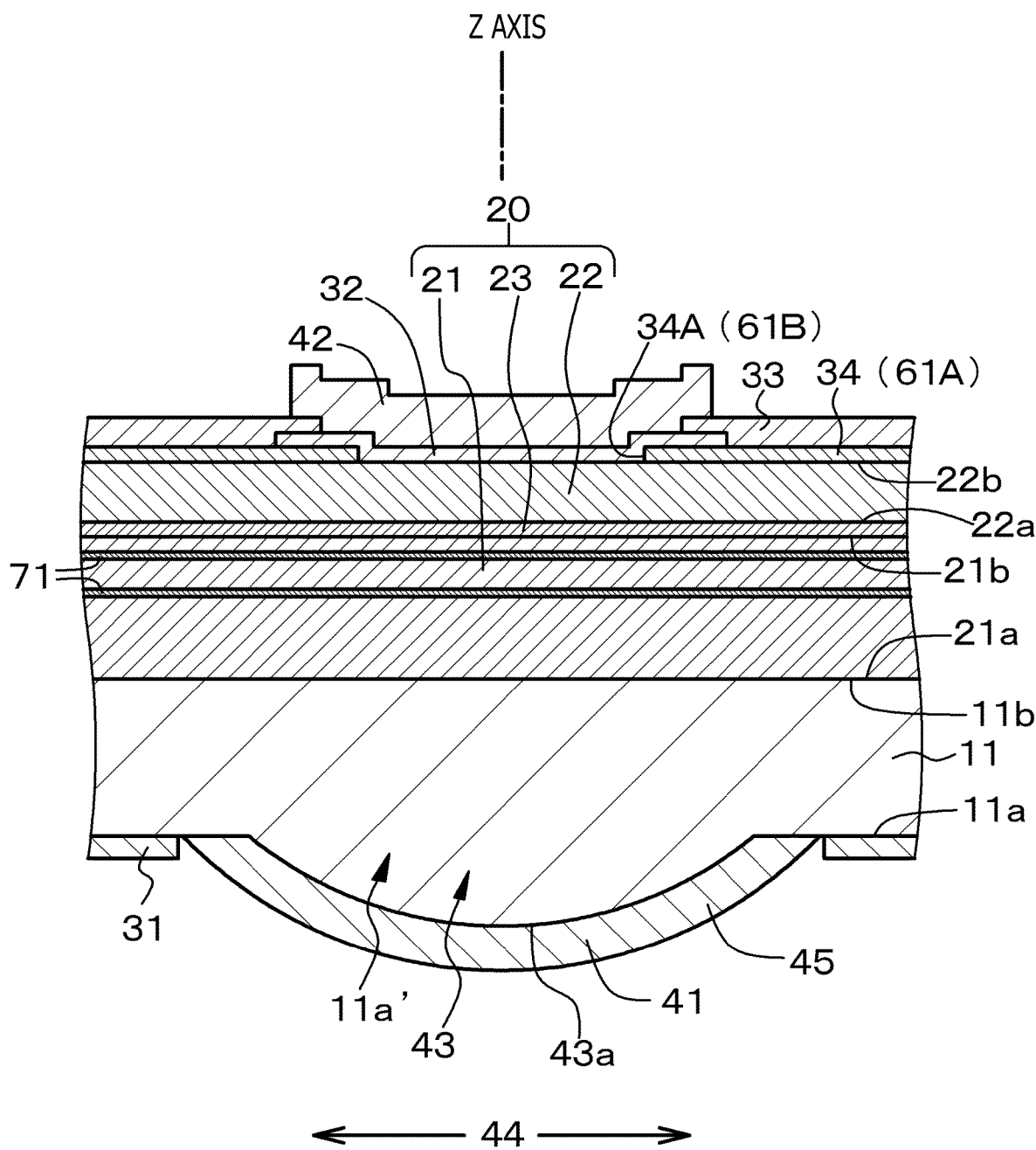
FIG. 25 is a schematic partial sectional view of a light emitting element of Example 7.

As a schematic partial end view is depicted in FIG. 25, in the light emitting element of Example 7 or in the light emitting elements of Examples 8 to 10 described later, in the stacked structure 20 including the second electrode 32, at least two light-absorbing material layers 71, preferably at least four light-absorbing material layers 71, specifically in Example 7, twenty light-absorbing material layers 71 are formed in parallel to a virtual plane occupied by the active layer 23. Note that only two light-absorbing material layers 71 are depicted in the drawing, for simplification of drawing.

In Example 7, the oscillation wavelength (desired oscillation wavelength emitted from the light emitting element) $\lambda_0$ is 450 nm. The twenty light-absorbing material layers 71 include a compound semiconductor material narrower in bandgap than the compound semiconductor constituting the stacked structure 20, specifically, n-$In_{0.2}Ga_{0.8}N$, and is formed in the inside of the first compound semiconductor layer 21. The thickness of the light-absorbing material layer 71 is equal to or less than $\lambda_0/(4 \cdot n_{eq})$, and is specifically 3 nm. The light absorption coefficient of the light-absorbing material layer 71 is equal to or more than twice, and is specifically $1 \times 10^3$ times, the light absorption coefficient of the first compound semiconductor layer 21 including n-GaN layer.

In addition, the light-absorbing material layers 71 are located at a minimum amplitude portion generated in a standing wave of light formed in the inside of the stacked structure, and the active layer 23 is located at a maximum amplitude portion generated in the standing wave of light formed in the inside of the stacked structure. The distance between the thickness-directional center of the active layer 23 and the thickness-directional center of the light-absorbing material layer 71 adjacent to the active layer 23 is 46.5 nm. Further, let the equivalent refractive index of the whole body of the two light-absorbing material layers 71 and the portion of the stacked structure located between the light-absorbing material layer 71 and the light-absorbing material layer 71 (specifically, in Example 7, the first compound semiconductor layer 21) be $n_{eq}$, and let the distance between the light-absorbing material layer 71 and the light-absorbing material layer 71 be $L_{Abs}$, then $$0.9 \times \{(m \cdot \lambda_0)/(2 \cdot n_{eq})\} \leq L_{Abs} \leq 1.1 \times \{(m \cdot \lambda_0)/(2 \cdot n_{eq})\}$$

is satisfied. Here, m is 1, or two or more arbitrary integers inclusive of 1. It is to be noted that in Example 7, m=1. Therefore, the distance between the adjacent light-absorbing material layers 71 satisfies $$0.9 \times \{\lambda_0/(2 \cdot n_{eq})\} \leq L_{Abs} \leq 1.1 \times \{\lambda_0/(2 \cdot n_{eq})\}$$

in all the plurality of light-absorbing material layers 71 (the twenty light-absorbing material layers 71). The value of the equivalent refractive index $n_{eq}$ is specifically 2.42, and, when m=1, specifically, $$L_{Abs} = 1 \times 450/(2 \times 2.42) = 93.0 \text{ nm.}$$

Note that in some light-absorbing material layers 71 of the twenty light-absorbing material layers 71, m may be two or more arbitrary integers.

In manufacture of the light emitting element of Example 7, in a step similar to (step-100) of Example 1, the stacked structure 20 is formed; in this instance, the twenty light-absorbing material layers 71 are also formed in the inside of the first compound semiconductor layer 21. Except for this point, the light emitting element of Example 7 can be manufactured based on a method similar to that for the light emitting element of Example 1.

Figure 26:
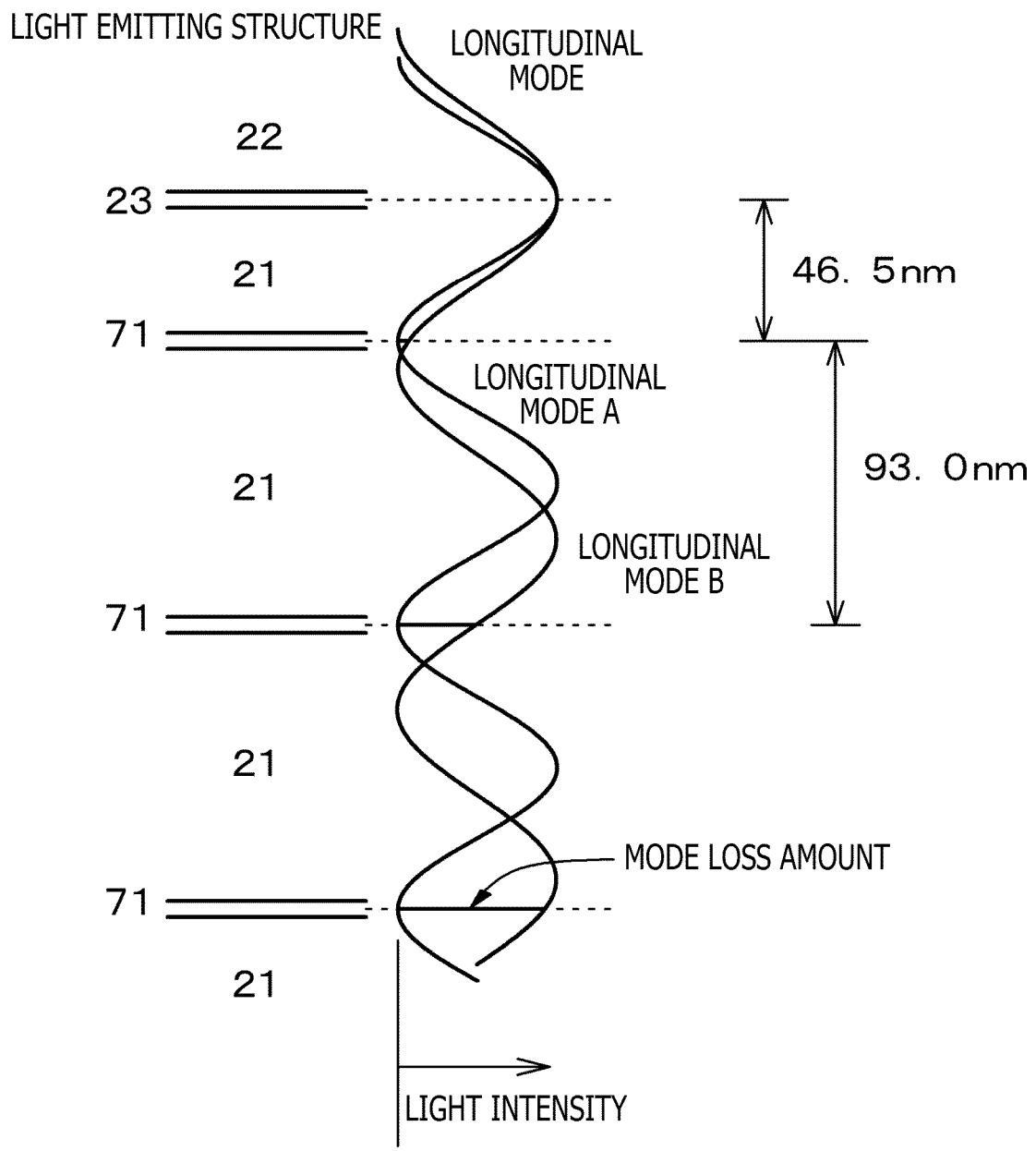
FIG. 26 is a figure obtained by superposing a schematic partial sectional view of the light emitting element of Example 7 on two longitudinal modes consisting of a longitudinal mode A and a longitudinal mode B.

In the case where a plurality of longitudinal modes is generated in the gain spectrum determined by the active layer 23, this is schematically represented as depicted in FIG. 26. Note that in FIG. 26, two longitudinal modes consisting of a longitudinal mode A and a longitudinal mode B are illustrated. In this case, it is assumed that the light-absorbing material layers 71 are located at a minimum amplitude portion of the longitudinal mode A, and are not located at a minimum amplitude portion of the longitudinal mode B. Then, mode loss of the longitudinal mode A is minimized, but mode loss of the longitudinal mode B is large. In FIG. 26, the mode loss amount of the longitudinal mode B is schematically indicated by solid line. Therefore, oscillation is realized more easily in the longitudinal mode A than in the longitudinal mode B. Therefore, by using such a structure, or by controlling the position or the period of the light-absorbing material layers 71, a specific longitudinal mode can be stabilized, and oscillation is facilitated. On the other hand, the mode loss for the undesired other longitudinal modes can be increased, and, therefore, oscillation in the undesired other longitudinal modes can be restrained.

As aforementioned, in the light emitting element of Example 7, at least two light-absorbing material layers are formed in the inside of the stacked structure, and, therefore, oscillation of laser light in an undesired longitudinal mode, among the laser light in a plurality of kinds of longitudinal modes for emission from the surface emitting laser element, can be restrained. As a result, the oscillation wavelength of the laser light emitted can be accurately controlled. Moreover, since the light emitting element of Example 7 has the concave mirror section 43, generation of diffraction loss can be securely restrained.

Example 8

Example 8 is a modification of Example 7. In Example 7, the light-absorbing material layers 71 have included a compound semiconductor material which is narrower in bandgap than the compound semiconductor constituting the stacked structure 20. On the other hand, in Example 8, ten light-absorbing material layers 71 include an impurity-doped compound semiconductor material, specifically a compound semiconductor material having an impurity concentration (impurity: Si) of $1 \times 10^{19}/cm^3$ (specifically, n-GaN:Si). In addition, in Example 8, the oscillation wavelength $\lambda_0$ is set to 515 nm. Note that the composition of the active layer 23 is $In_{0.3}Ga_{0.7}N$. In Example 8, m=1, the value of $L_{Abs}$ is 107 nm, the distance between the thickness-directional center of the active layer 23 and the thickness-directional center of the light-absorbing material layer 71 adjacent to the active layer 23 is 53.5 nm, and the thickness of the light-absorbing material layer 71 is 3 nm. Except for the above-mentioned points, the configuration and structure of the light emitting element of Example 8 can be similar to the configuration and structure of the light emitting element of Example 7, and, therefore, detailed description of them is omitted. Note that in some light-absorbing material layers 71, of the ten light-absorbing material layers 71, m may be two or more arbitrary integers.

Example 9

Example 9 also is a modification of Example 7. In Example 9, five light-absorbing material layers (referred to as "first light-absorbing material layers" for convenience' sake) are configured similarly to the light-absorbing material layers 71 of Example 7, namely, include $n-In_{0.3}Ga_{0.7}N$. Further, in Example 9, one light-absorbing material layer (referred to as "second light-absorbing material layer" for convenience' sake) includes a transparent conductive material. Specifically, the second light-absorbing material layer serves also as a second electrode 32 which includes ITO. In Example 9, the oscillation wavelength $\lambda_0$ is set to 450 nm. In addition, m=1 and 2. In the case where m=1, the value of $L_{Abs}$ is 93.0 nm, the distance between the thickness-directional center of the active layer 23 and the thickness-directional center of the first light-absorbing material layer adjacent to the active layer 23 is 46.5 nm, and the thickness of the five first light-absorbing material layers is 3 nm. In other words, in the five first light-absorbing material layers, $$0.9 \times \{\lambda_0/(2 \cdot n_{eq})\} \leq L_{Abs} \leq 1.1 \times \{\lambda_0/(2 \cdot n_{eq})\}$$

is satisfied. In addition, for the first light-absorbing material layer adjacent to the active layer 23 and the second light-absorbing material layer, m=2. In other words, in this instance, $$0.9 \times \{(2 \cdot \lambda_0)/(2 \cdot n_{eq})\} \leq L_{Abs} \leq 1.1 \times \{(2 \cdot \lambda_0)/(2 \cdot n_{eq})\}$$

is satisfied. The light absorption coefficient of the one second light-absorbing material layer serving also as the second electrode 32 is 2,000 $cm^{-1}$, its thickness is 30 nm, and the distance from the active layer 23 to the second light-absorbing material layer is 139.5 nm. Except for the above-mentioned points, the configuration and structure of the light emitting element of Example 9 can be similar to the configuration and structure of the light emitting element of Example 7, and, therefore, detailed description of them is omitted. Note that in some first light-absorbing material layers, of the five first light-absorbing material layers, m may be two or more arbitrary integers. Note that unlike in Example 7, the number of the light-absorbing material layers 71 may be one. In this case, also, the positional relation between the second light-absorbing material layer serving also as the second electrode 32 and the light-absorbing material layer 71 should satisfy the following expression:

$$0.9 \times \{(m \cdot \lambda_0)/(2 \cdot n_{eq})\} \leq L_{Abs} \leq 1.1 \times \{(m \cdot \lambda_0)/(2 \cdot n_{eq})\}.$$

Example 10

Example 10 is a modification of Examples 7 to 9. More specifically, a light emitting element of Example 10 includes a surface emitting laser element (vertical resonator laser, VCSEL) that emits laser light from a top surface of a first compound semiconductor layer 21 through a first light reflection layer 41.

Figure 27:
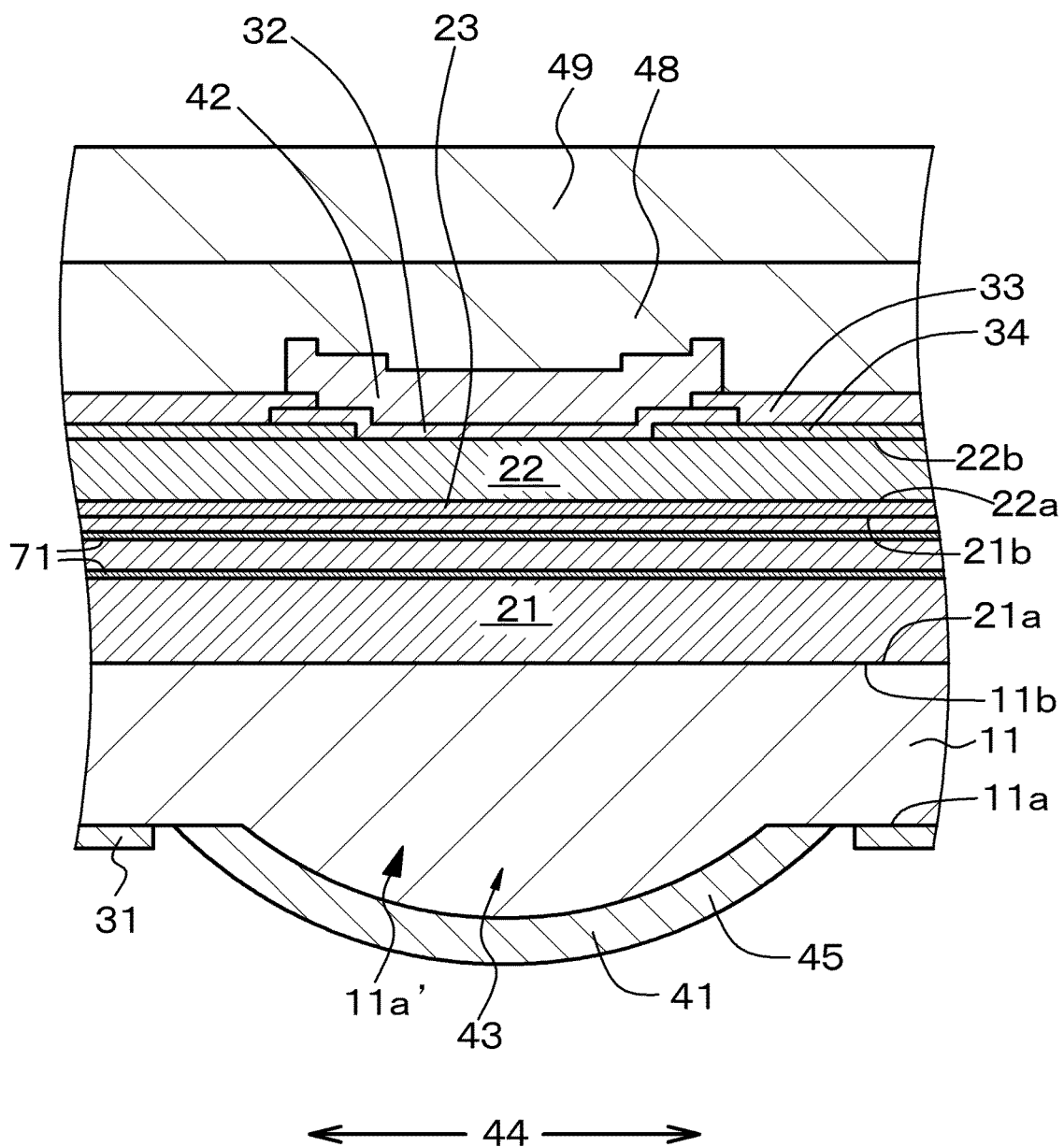
FIG. 27 is a schematic partial sectional view of a light emitting element of Example 10.

In the light emitting element of Example 10, as a schematic partial sectional view is depicted in FIG. 27, a second light reflection layer 42 is fixed, based on a solder bonding method, to a support substrate 49, which includes a silicon semiconductor substrate, through a bonding layer 48 which includes a gold (Au) layer or a solder layer containing tin (Sn).

The light emitting element of Example 10 can be manufactured based on a method similar to that for the light emitting element of Example 1, except that twenty light-absorbing material layers 71 are formed in the inside of the first compound semiconductor layer 21 and that the support substrate 49 is not removed.

While the present disclosure has been described above based on preferred Examples, the present disclosure is not limited to these Examples. The configurations and structures of the light emitting elements described in Examples are illustrative, and can be modified as required, and the methods of manufacturing the light emitting elements can also be modified as required. In some cases, by selecting the bonding layer and the support substrate, a surface emitting laser element that emit light from a top surface of the second compound semiconductor layer through the second light reflection layer can be realized. While the photosensitive material layer is exposed to light from the concave mirror section side through the stacked structure, the exposure of the photosensitive material layer need only be conducted after formation of the concave mirror section; in some cases, after the first light reflection layer is formed over the concave mirror section, the photosensitive material layer may be exposed to light through the first light reflection layer, the concave mirror section, and the stacked structure.

Note that the present disclosure may take the following configurations.

[A01] «Method of Manufacturing Light Emitting Element»

A method of manufacturing a light emitting element, the method including at least:

forming a stacked structure which includes a GaN-based compound semiconductor and in which a first compound semiconductor layer having a first surface and a second surface opposed to the first surface, an active layer facing the second surface of the first compound semiconductor layer, and a second compound semiconductor layer having a first surface facing the active layer and a second surface opposed to the first surface, are stacked, and forming a concave mirror section on the first surface side of the first compound semiconductor layer;

then forming a photosensitive material layer over the second compound semiconductor layer;

thereafter exposing the photosensitive material layer to light from the concave mirror section side through the stacked structure, to obtain a treatment mask layer including the photosensitive material layer; and thereafter processing the second compound semiconductor layer by use of the treatment mask layer.

[A02] The method of manufacturing the light emitting element as described in the above paragraph [A01], in which in processing the second compound semiconductor layer by use of the treatment mask layer, the second compound semiconductor layer is formed with a current constriction region.

[A03] The method of manufacturing the light emitting element as described in the above paragraph [A02], in which in processing the second compound semiconductor layer by use of the treatment mask layer, ion implantation is performed using the treatment mask layer.

[A04] The method of manufacturing the light emitting element as described in the above paragraph [A02], in which in processing the second compound semiconductor layer by use of the treatment mask layer, the second compound semiconductor layer is subjected to an ashing treatment using the treatment mask layer.

[A05] The method of manufacturing the light emitting element as described in the above paragraph [A02], in which in processing the second compound semiconductor layer by use of the treatment mask layer, the second compound semiconductor layer is subjected to a reactive etching treatment (reactive etching treatment based on a reactive etching method (a RIE method)) using the treatment mask layer.

[A06] The method of manufacturing the light emitting element as described in the above paragraph [A02], in which in processing the second compound semiconductor layer by use of the treatment mask layer, plasma irradiation is performed using the treatment mask layer.

[A07] The method of manufacturing the light emitting element as described in the above paragraph [A02], in which in processing the second compound semiconductor layer by use of the treatment mask layer, an insulating film formed over the second compound semiconductor layer is subjected to etching by use of the treatment mask layer.

[A08] The method of manufacturing the light emitting element as described in any one of the above paragraphs [A02] to [A07], further including:

forming the second compound semiconductor layer with the current constriction region, then forming a second electrode over the second compound semiconductor layer, and forming a second light reflection layer over the second electrode; and forming a first light reflection layer over the concave mirror section and forming a first electrode electrically connected to the first compound semiconductor layer.

[A09] The method of manufacturing the light emitting element as described in any one of the above paragraphs [A01] to [A08], further including:

forming a light-shielding section over part of the concave mirror section, or over an area ranging from an upper side of part of the concave mirror section to an outside region thereof, or over part of the first light reflection layer, or over an area ranging from an upper side of part of the first light reflection layer to an outside region thereof.

[A10] The method of manufacturing the light emitting element as described in any one of the above paragraphs [A01] to [A09], in which the first surface of the first compound semiconductor layer is in contact with a second surface of a substrate, the concave mirror section is formed over a first surface of the substrate opposed to the second surface of the substrate, and formation of the concave mirror section includes subjecting the first surface of the substrate to etching.

[A11] The method of manufacturing the light emitting element as described in any one of the above paragraphs [A01] to [A09], in which the first surface of the first compound semiconductor layer is in contact with a second surface of a substrate, the concave mirror section is formed over a first surface of the substrate opposed to the second surface of the substrate, and formation of the concave mirror section includes forming a concave mirror section forming layer over the first surface of the substrate and then forming the concave mirror section forming layer with the concave mirror section.

[A12] The method of manufacturing the light emitting element as described in the above paragraph [A11], in which an antireflection film is formed over part of the first surface of the substrate, and thereafter the concave mirror section forming layer is formed.

[A13] The method of manufacturing the light emitting element as described in any one of the above paragraphs [A01] to [A09], in which the first surface of the first compound semiconductor layer is formed with the concave mirror section.

[A14] The method of manufacturing the light emitting element as described in any one of the above paragraphs [A01] to [A07], further including:

forming the concave mirror section with the first light reflection layer after the first surface of the substrate is formed with the concave mirror section and before the photosensitive material layer is formed over the second compound semiconductor layer.

[A15] The method of manufacturing the light emitting element as described in any one of the above paragraphs [A01] to [A14], in which a mask member having an opening is disposed on an upper side of the first compound semiconductor layer side, and the photosensitive material layer is exposed to light from the concave mirror section side through the stacked structure.

[A16] The method of manufacturing the light emitting element as described in any one of the above paragraphs [A01] to [A15], in which the photosensitive material layer includes a resist material or a photosensitive resin.

[A17] The method of manufacturing the light emitting element as described in any one of the above paragraphs [A01] to [A16], in which an antireflection film is formed at a part on which exposure light for exposure of the photosensitive material layer is incident.

[B01] «Light Emitting Element: First Mode»

A light emitting element including:

a stacked structure which includes a GaN-based compound semiconductor and in which a first compound semiconductor layer having a first surface and a second surface opposed to the first surface, an active layer facing the second surface of the first compound semiconductor layer, and a second compound semiconductor layer having a first surface facing the active layer and a second surface opposed to the first surface, are stacked;

a first light reflection layer disposed on the first surface side of the first compound semiconductor layer; and a second light reflection layer disposed on the second surface side of the second compound semiconductor layer, in which the first light reflection layer is formed over a concave mirror section, the second compound semiconductor layer is provided with a current injection region and a current non-injection region surrounding the current injection region, and a center point of a light field in the active layer and an area center-of-gravity point of the current injection region coincide with each other.

[B02] The light emitting element as described in the above paragraph [B01], in which the first light reflection layer is provided with a light-transmitting section and a light-shielding section surrounding the light-transmitting section.

[B03] «Light Emitting Element: Second Mode»

A light emitting element including:

a stacked structure which includes a GaN-based compound semiconductor and in which a first compound semiconductor layer having a first surface and a second surface opposed to the first surface, an active layer facing the second surface of the first compound semiconductor layer, and a second compound semiconductor layer having a first surface facing the active layer and a second surface opposed to the first surface, are stacked;

a first light reflection layer disposed on the first surface side of the first compound semiconductor layer; and a second light reflection layer disposed on the second surface side of the second compound semiconductor layer, in which the first light reflection layer is formed over a concave mirror section, and the first light reflection layer is provided with a light-transmitting section and a light-shielding section surrounding the light-transmitting section.

[B04] «Light Emitting Element: Third Mode»

A light emitting element including:

a stacked structure which includes a GaN-based compound semiconductor and in which a first compound semiconductor layer having a first surface and a second surface opposed to the first surface, an active layer facing the second surface of the first compound semiconductor layer, and a second compound semiconductor layer having a first surface facing the active layer and a second surface opposed to the first surface, are stacked;

a first light reflection layer disposed on the first surface side of the first compound semiconductor layer; and a second light reflection layer disposed on the second surface side of the second compound semiconductor layer, in which the first light reflection layer is formed over a concave mirror section, and a shape of the concave mirror section includes a spherical shape or a parabolic shape with a coefficient of determination of equal to or more than 0.8, within a range of a beam waist radius $\omega_0$ from a central portion of the concave mirror section.

[B05] The light emitting element as described in any one of the above paragraphs [B01] to [B04], in which an antireflection film is formed at a part on which exposure light for exposure of a photosensitive material layer is incident.

[B06] The light emitting element as described in any one of the above paragraphs [B01] to [B05], in which let resonator length be $L_{OR}$, then $1 \times 10^{-5}$ m $\leq L_{OR}$ is satisfied.

[B07] The light emitting element as described in any one of the above paragraphs [B01] to [B06], in which a figure described by an interface where part of the concave mirror section of the first light reflection layer in a section of the first light reflection layer along a virtual plane including a stacking direction of the stacked structure faces the stacked structure is part of a circle or part of a parabola.

[C01] «Light Emitting Element of First Configuration»

The light emitting element as described in any one of the above paragraphs [B01] to [B07], in which the second compound semiconductor layer is provided with a current injection region and a current non-injection region surrounding the current injection region, and a shortest distance $D_{CI}$ from an area center-of-gravity point of the current injection region to a boundary between the current injection region and the current non-injection region satisfies the following expression:

$$D_{CI} \geq \omega_0/2,$$

where $$\omega_0^2 = (\lambda_0/\pi)\{L_{OR}(R_{DBR}-L_{OR})\}^{1/2}$$

where $\lambda_0$ is a wavelength of light mainly emitted from the light emitting element, $L_{OR}$ is resonator length, and $R_{DBR}$ is a radius of curvature of the concave mirror section of the first light reflection layer.

[C02] The light emitting element as described in the above paragraph [C01], in which a radius $r'_{DBR}$ of an effective region in the concave mirror section of the first light reflection layer satisfies $$\omega_0 \leq r'_{DBR} \leq 20 \cdot \omega_0.$$

[C03] The light emitting element as described in the above paragraph [C01] or [C02], which satisfies $D_{CI} \geq \omega_0$.

[C04] The light emitting element as described in any one of the above paragraphs [C01] to [C03], which satisfies $R_{DBR} \leq 1 \times 10^{-3}$ m.

[D01] «Light Emitting Element of Second Configuration»

The light emitting element as described in any one of the above paragraphs [B01] to [C04], in which the stacked structure including the second electrode is formed with at least two light-absorbing material layers in parallel to a virtual plane occupied by the active layer.

[D02] The light emitting element as described in the above paragraph [D01], in which at least four light-absorbing material layers are formed.

[D03] The light emitting element as described in the above paragraph [D01] or [D02], in which let oscillation wavelength be $\lambda_0$, let equivalent refractive index of whole body of the two light-absorbing material layers and part of the stacked structure located between the light-absorbing material layer and the light-absorbing material layer be $n_{eq}$, and let a distance between the light-absorbing material layer and the light-absorbing material layer be $L_{Abs}$, then $$0.9 \times \{(m \cdot \lambda_0)/(2 \cdot n_{eq})\} \leq L_{Abs} \leq 1.1 \times \{(m \cdot \lambda_0)/(2 \cdot n_{eq})\}$$

is satisfied, where m is 1 or is two or more arbitrary integers inclusive of 1.

[D04] The light emitting element as described in any one of the above paragraphs [D01] to [D03], in which a thickness of the light-absorbing material layer is equal to or less than $\lambda_0/(4 \cdot n_{eq})$.

[D05] The light emitting element as described in any one of the above paragraphs [D01] to [D04], in which the light-absorbing material layer is located at a minimum amplitude part generated in a standing wave of light formed in an inside of the stacked structure.

[D06] The light emitting element as described in any one of the above paragraphs [D01] to [D05], in which the active layer is located at a maximum amplitude part generated in a standing wave of light formed in the inside of the stacked structure.

[D07] The light emitting element as described in any one of the above paragraphs [D01] to [D06], in which the light-absorbing material layer has a light absorption coefficient of equal to or more than two times the light absorption coefficient of the compound semiconductor constituting the stacked structure.

[D08] The light emitting element as described in any one of the above paragraphs [D01] to [D07], in which the light-absorbing material layer includes at least one material selected from a group consisting of a compound semiconductor material narrower in bandgap than the compound semiconductor constituting the stacked structure material, an impurity-doped compound semiconductor material, a transparent conductive material, and a light reflection layer constituting material having a light absorbing characteristic.

[E01] The light emitting element as described in any one of the above paragraphs [B01] to [D08], in which a compound semiconductor substrate is disposed between the first surface of the first compound semiconductor layer and the first light reflection layer.

[E02] The light emitting element as described in the above paragraph [E01], in which the compound semiconductor substrate includes a GaN substrate.

[E03] The light emitting element as described in the above paragraph [E01] or [E02], in which the first light reflection layer includes a multilayer light reflection film formed at a surface of at least part of the concave mirror section including a projecting portion of the compound semiconductor substrate.

[E04] The light emitting element as described in the above paragraph [E01] or [E02], in which the first light reflection layer includes a multilayer light reflection film formed at a surface of at least part of the concave mirror section formed over the compound semiconductor substrate.

[E05] The light emitting element as described in any one of the above paragraphs [B01] to [D08], in which the first surface of the first compound semiconductor layer is formed with the first light reflection layer.

[E06] The light emitting element as described in any one of the above paragraphs [B01] to [E05], in which a value of thermal conductivity of the stacked structure is higher than a value of thermal conductivity of the first light reflection layer.

[E07] The light emitting element as described in any one of the above paragraphs [B0] to [E06], in which let a radius of curvature of the concave mirror section of the light emitting element be $R_{DBR}$, then $R_{DBR} \leq 1 \times 10^{-3}$ m is satisfied.

[E08] The light emitting element as described in any one of the above paragraphs [B01] to [E07], in which a projection-shaped portion is formed in a periphery of the first light reflection layer, and the first light reflection layer is not projecting from the projection-shaped portion.

REFERENCE SIGNS LIST

11 . . . Compound semiconductor substrate (Light emitting element manufacturing substrate), 11a . . . First surface of compound semiconductor substrate, 11b . . . Second surface of compound semiconductor substrate, 11a' . . . Projecting portion of first surface of compound semiconductor substrate, 11a'' . . . Recess formed in region of first surface of compound semiconductor substrate, 11A, 11A' . . . Projection-shaped portion, 20 . . . Stacked structure, 21 . . . First compound semiconductor layer, 21a . . . First surface of first compound semiconductor layer, 21b . . . Second surface of first compound semiconductor layer, 21c . . . Projecting portion formed at first surface of first compound semiconductor layer, 22 . . . Second compound semiconductor layer, 22a . . . First surface of second compound semiconductor layer, 22b . . . Second surface of second compound semiconductor layer, 23 . . . Active layer (Light emitting layer), 31 . . . First electrode, 32 . . . Second electrode, 33 . . . Pad electrode, 34 . . . Insulating film (Current constriction region), 34a . . . Insulating film, 34A . . . Opening provided in insulating film (Current constriction region), 35 . . . Photosensitive material layer, 35A . . . Opening provided in photosensitive material layer, 35' . . . Exposed part of photosensitive material layer, 36 . . . Treatment mask layer, 37 . . . Mask member (Exposure mask), 37A . . . Opening provided in mask member, 41 . . . First light reflection layer, 41A-Light-transmitting section, 41B . . . Light-shielding section, 42 ... Second light reflection layer, 43 ... Concave mirror section, 43a ... Interface where effective region in concave mirror section of first light reflection layer faces stacked structure, 43' ... Projecting portion formed at compound semiconductor substrate, 44 ... Effective region in concave mirror section of first light reflection layer, 45 ... Multilayer light reflection film, 46 ... Planarization film, 48 ... Bonding layer, 49 ... Support substrate, 61A ... Current injection region, 61B ... Current non-injection region (Current constriction region), 71 ... Light-absorbing material layer

The invention claimed is:

1. A method of manufacturing a light emitting element, the method comprising at least:
   forming a stacked structure which includes a GaN-based compound semiconductor and in which
   a first compound semiconductor layer having a first surface and a second surface opposed to the first surface,
   an active layer facing the second surface of the first compound semiconductor layer, and
   a second compound semiconductor layer having a first surface facing the active layer and a second surface opposed to the first surface, are stacked, and forming a concave mirror section on the first surface side of the first compound semiconductor layer;
   then forming a photosensitive material layer over the second compound semiconductor layer;
   thereafter exposing the photosensitive material layer to light from the concave mirror section side through the stacked structure, to obtain a treatment mask layer including the photosensitive material layer; and
   thereafter processing the second compound semiconductor layer by use of the treatment mask layer.

2. The method of manufacturing the light emitting element according to claim 1, wherein in processing the second compound semiconductor layer by use of the treatment mask layer, the second compound semiconductor layer is formed with a current constriction region.

3. The method of manufacturing the light emitting element according to claim 2, wherein in processing the second compound semiconductor layer by use of the treatment mask layer, ion implantation is performed using the treatment mask layer.

4. The method of manufacturing the light emitting element according to claim 2, wherein in processing the second compound semiconductor layer by use of the treatment mask layer, the second compound semiconductor layer is subjected to an ashing treatment using the treatment mask layer.

5. The method of manufacturing the light emitting element according to claim 2, wherein in processing the second compound semiconductor layer by use of the treatment mask layer, the second compound semiconductor layer is subjected to a reactive etching treatment using the treatment mask layer.

6. The method of manufacturing the light emitting element according to claim 2, wherein in processing the second compound semiconductor layer by use of the treatment mask layer, plasma irradiation is performed using the treatment mask layer.

7. The method of manufacturing the light emitting element according to claim 2, wherein in processing the second compound semiconductor layer by use of the treatment mask layer, an insulating film formed over the second compound semiconductor layer is subjected to etching by use of the treatment mask layer.

8. The method of manufacturing the light emitting element according to claim 2, further comprising:
   forming the second compound semiconductor layer with the current constriction region, then forming a second electrode over the second compound semiconductor layer, and forming a second light reflection layer over the second electrode; and
   forming a first light reflection layer over the concave mirror section and forming a first electrode electrically connected to the first compound semiconductor layer.

9. The method of manufacturing the light emitting element according to claim 1, further comprising:
   forming a light-shielding section over part of the concave mirror section, or over an area ranging from an upper side of part of the concave mirror section to an outside region thereof, or over part of the first light reflection layer, or over an area ranging from an upper side of part of the first light reflection layer to an outside region thereof.

10. The method of manufacturing the light emitting element according to claim 1,
    wherein the first surface of the first compound semiconductor layer is in contact with a second surface of a substrate,
    the concave mirror section is formed over a first surface of the substrate opposed to the second surface of the substrate, and
    formation of the concave mirror section includes subjecting the first surface of the substrate to etching.

11. The method of manufacturing the light emitting element according to claim 1,
    wherein the first surface of the first compound semiconductor layer is in contact with a second surface of a substrate,
    the concave mirror section is formed over a first surface of the substrate opposed to the second surface of the substrate, and
    formation of the concave mirror section includes forming a concave mirror section forming layer over the first surface of the substrate and then forming the concave mirror section forming layer with the concave mirror section.

12. The method of manufacturing the light emitting element according to claim 1, wherein the first surface of the first compound semiconductor layer is formed with the concave mirror section.

13. The method of manufacturing the light emitting element according to claim 1, wherein a mask member having an opening is disposed on an upper side of the first compound semiconductor layer side, and the photosensitive material layer is exposed to light from the concave mirror section side through the stacked structure.

14. The method of manufacturing the light emitting element according to claim 1, wherein the photosensitive material layer includes a resist material or a photosensitive resin.

15. A light emitting element comprising:
    a stacked structure which includes a GaN-based compound semiconductor and in which
    a first compound semiconductor layer having a first surface and a second surface opposed to the first surface,
    an active layer facing the second surface of the first compound semiconductor layer, and
    a second compound semiconductor layer having a first surface facing the active layer and a second surface opposed to the first surface, are stacked;

a first light reflection layer disposed on the first surface side of the first compound semiconductor layer; and a second light reflection layer disposed on the second surface side of the second compound semiconductor layer, wherein the first light reflection layer is formed over a concave mirror section, and a shape of the concave mirror section includes a spherical shape or a parabolic shape with a coefficient of determination of equal to or more than 0.8, within a range of a beam waist radius $\omega_0$ from a central portion of the concave mirror section.

* * * * *